United States Patent
Lim et al.

(10) Patent No.: US 11,276,706 B2
(45) Date of Patent: Mar. 15, 2022

(54) VERTICAL MEMORY DEVICES AND METHODS OF MANUFACTURING THE SAME

(71) Applicant: SAMSUNG ELECTRONICS CO., LTD., Suwon-si (KR)

(72) Inventors: Geunwon Lim, Yongin-si (KR); Yoonhwan Son, Seoul (KR); Junyoung Choi, Seoul (KR)

(73) Assignee: SAMSUNG ELECTRONICS CO., LTD.

(*) Notice: Subject to any disclaimer, the term of this patent is extended or adjusted under 35 U.S.C. 154(b) by 0 days.

(21) Appl. No.: 15/930,867

(22) Filed: May 13, 2020

(65) Prior Publication Data

US 2021/0028186 A1  Jan. 28, 2021

(30) Foreign Application Priority Data

Jul. 24, 2019 (KR) ........................ 10-2019-0089420

(51) Int. Cl.
| | |
|---|---|
| *H01L 27/11582* | (2017.01) |
| *H01L 29/51* | (2006.01) |
| *H01L 21/28* | (2006.01) |
| *H01L 27/11565* | (2017.01) |

(52) U.S. Cl.
CPC .. *H01L 27/11582* (2013.01); *H01L 27/11565* (2013.01); *H01L 29/40117* (2019.08); *H01L 29/513* (2013.01); *H01L 29/518* (2013.01)

(58) Field of Classification Search
CPC .............................................. H01L 27/11582
See application file for complete search history.

(56) References Cited

U.S. PATENT DOCUMENTS

| | | | |
|---|---|---|---|
| 8,592,890 | B2 | 11/2013 | Watanabe et al. |
| 9,812,461 | B2 | 11/2017 | Doda et al. |
| 9,812,462 | B1 | 11/2017 | Pang et al. |
| 9,893,078 | B2 | 2/2018 | Minami et al. |
| 9,905,572 | B2 | 2/2018 | Lee |

(Continued)

FOREIGN PATENT DOCUMENTS

| | | |
|---|---|---|
| JP | 2012-59966 A | 3/2012 |
| KR | 10-2014-0112827 A | 9/2014 |
| KR | 10-2017-0087809 A | 7/2017 |

*Primary Examiner* — Fernando L Toledo
*Assistant Examiner* — Valerie N Newton
(74) *Attorney, Agent, or Firm* — Myers Bigel, P.A.

(57) ABSTRACT

Vertical memory devices and method of manufacturing the same are disclosed. The vertical memory device includes a substrate having a cell block area, a block separation area and a boundary area, a plurality of stack structures arranged in the cell block area and the boundary area such that insulation interlayer patterns are stacked on the substrate alternately with the electrode patterns. The stack structures are spaced apart by the block separation area in the third direction. A plurality of channel structures extend through the stack structures to the substrate in the cell block area in the first direction and are connected to the substrate. A plurality of dummy channel structures extend through upper portions of each of the stack structures in the boundary area and are connected to a dummy bottom electrode pattern spaced apart from the substrate. The bridge defect is thus substantially prevented near the substrate.

20 Claims, 44 Drawing Sheets

(56) References Cited

U.S. PATENT DOCUMENTS

| | | |
|---|---|---|
| 10,128,264 B2 | 11/2018 | Lee |
| 2014/0264549 A1 | 9/2014 | Lee |
| 2015/0001460 A1* | 1/2015 | Kim .................. H01L 27/11519 |
| | | 257/5 |
| 2015/0194435 A1 | 7/2015 | Lee |
| 2019/0043888 A1 | 2/2019 | Lee |
| 2019/0214088 A1* | 7/2019 | Kwak .................... G11C 16/26 |
| 2019/0333872 A1 | 10/2019 | Lim et al. |

* cited by examiner

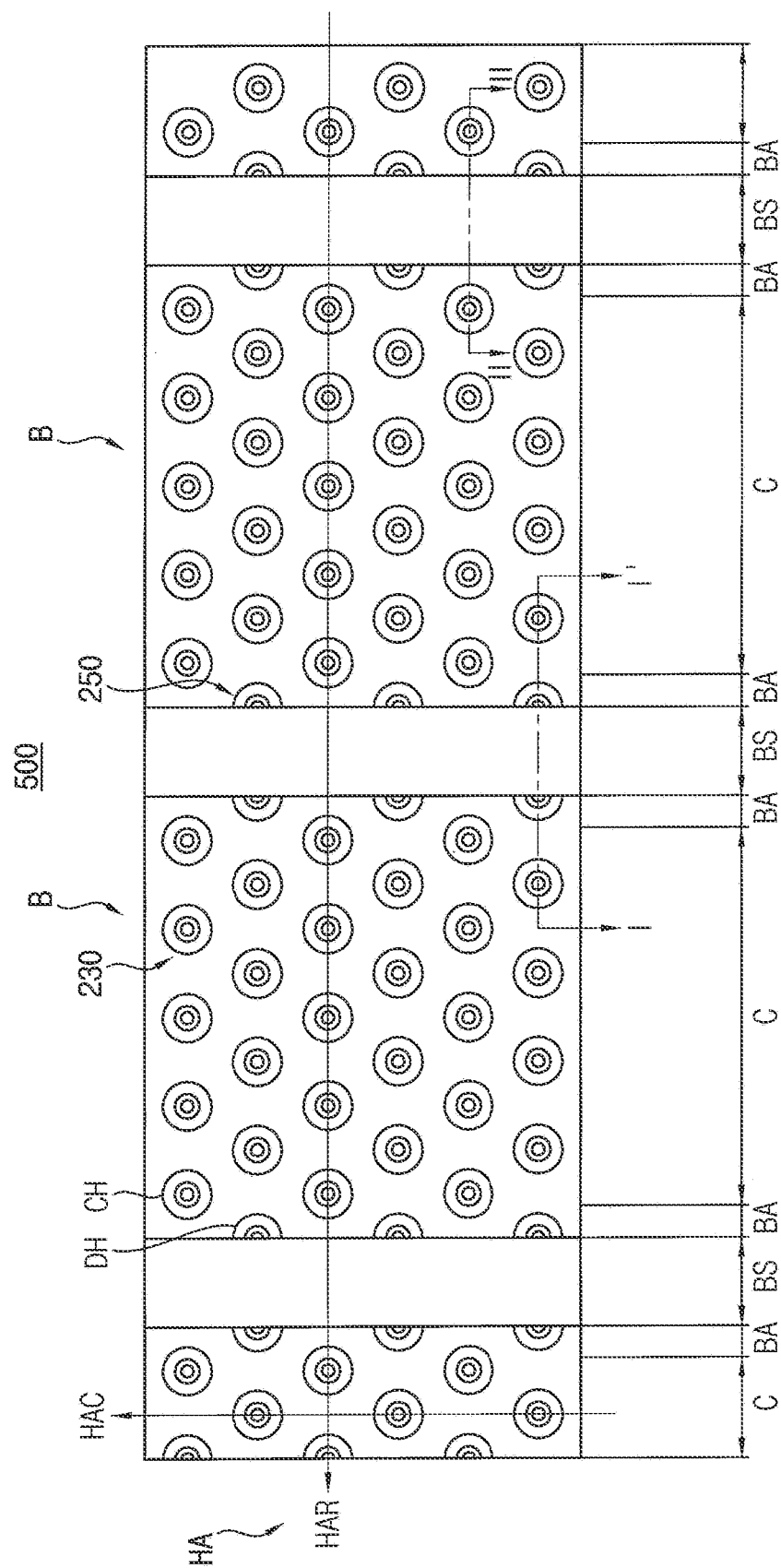

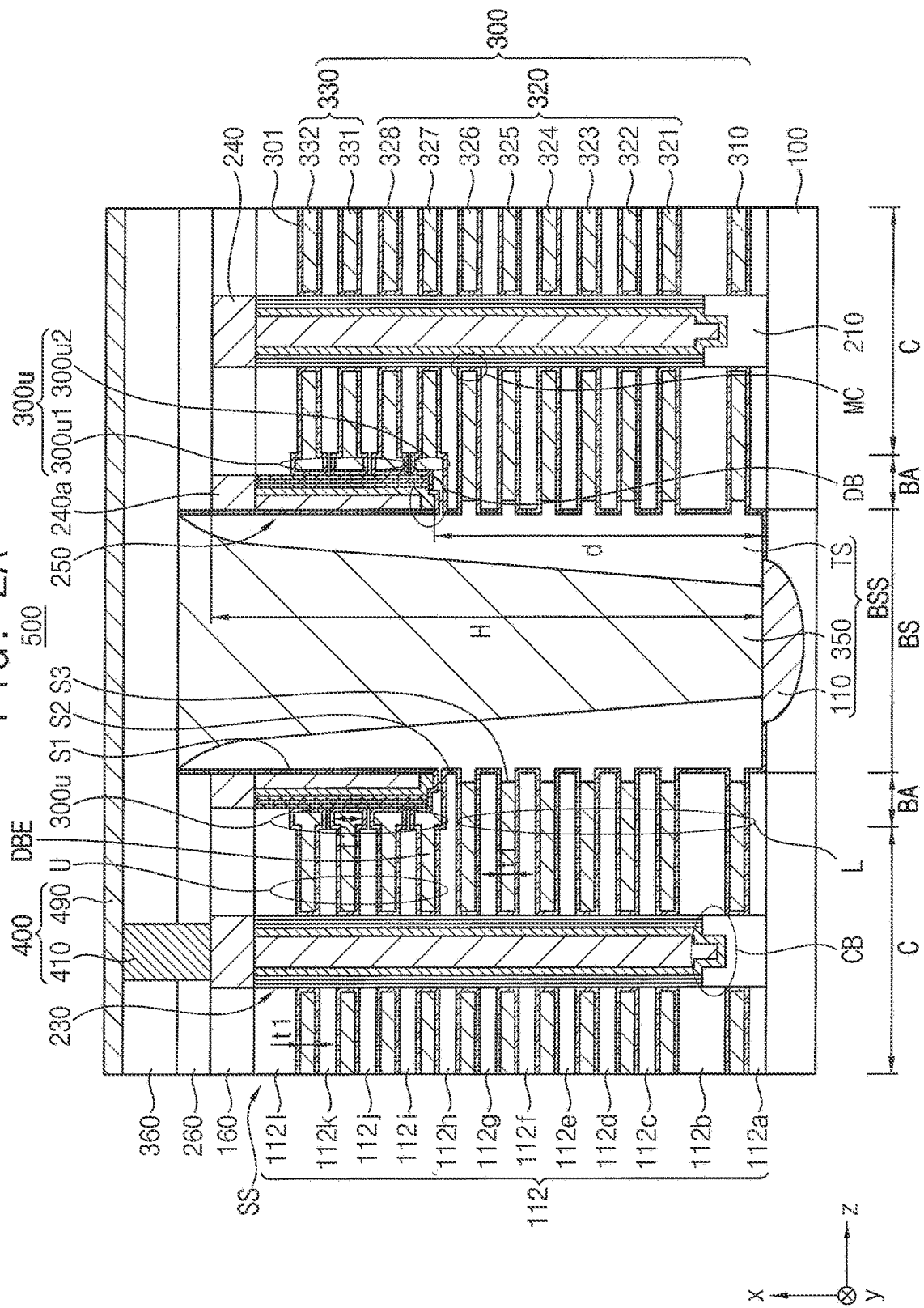

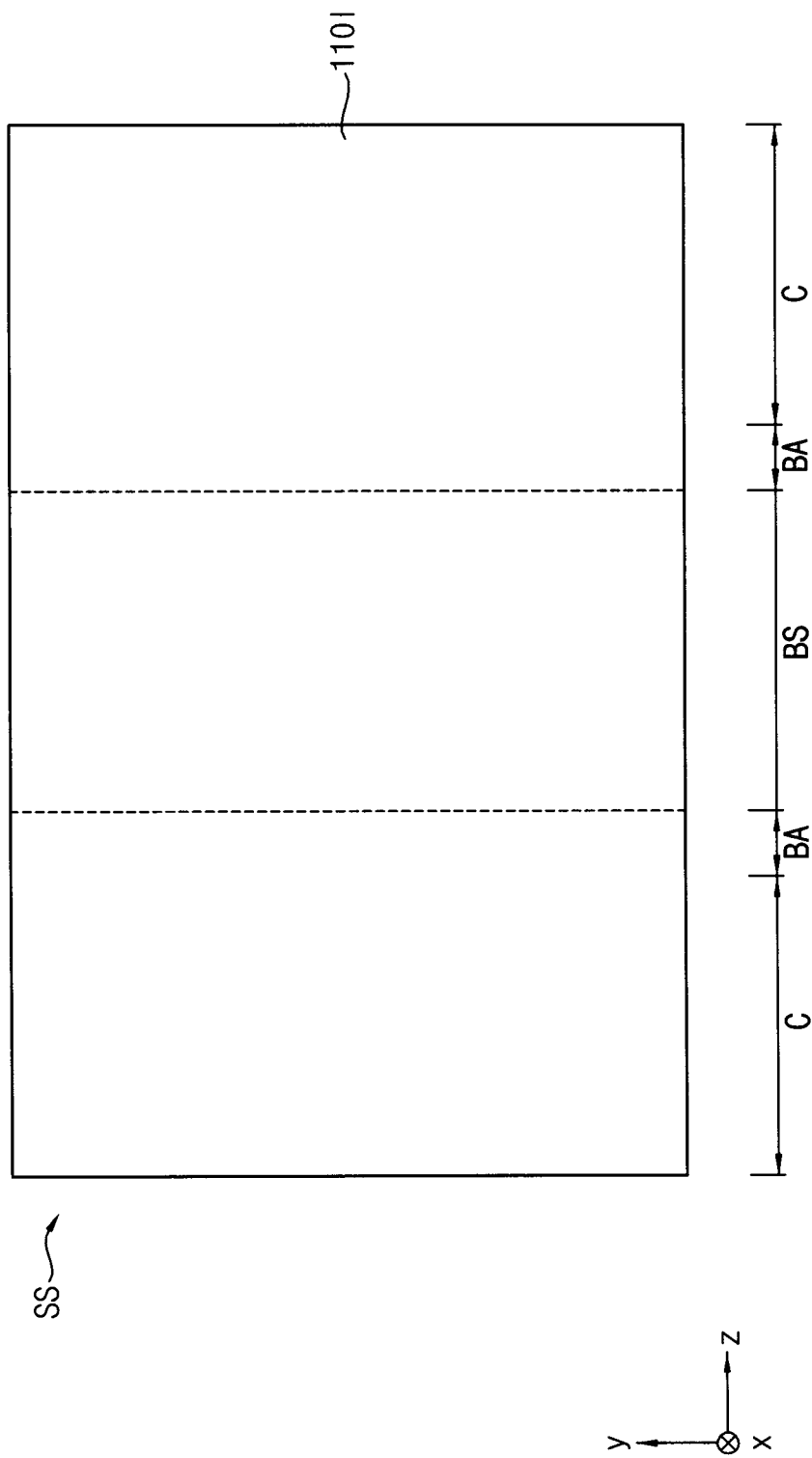

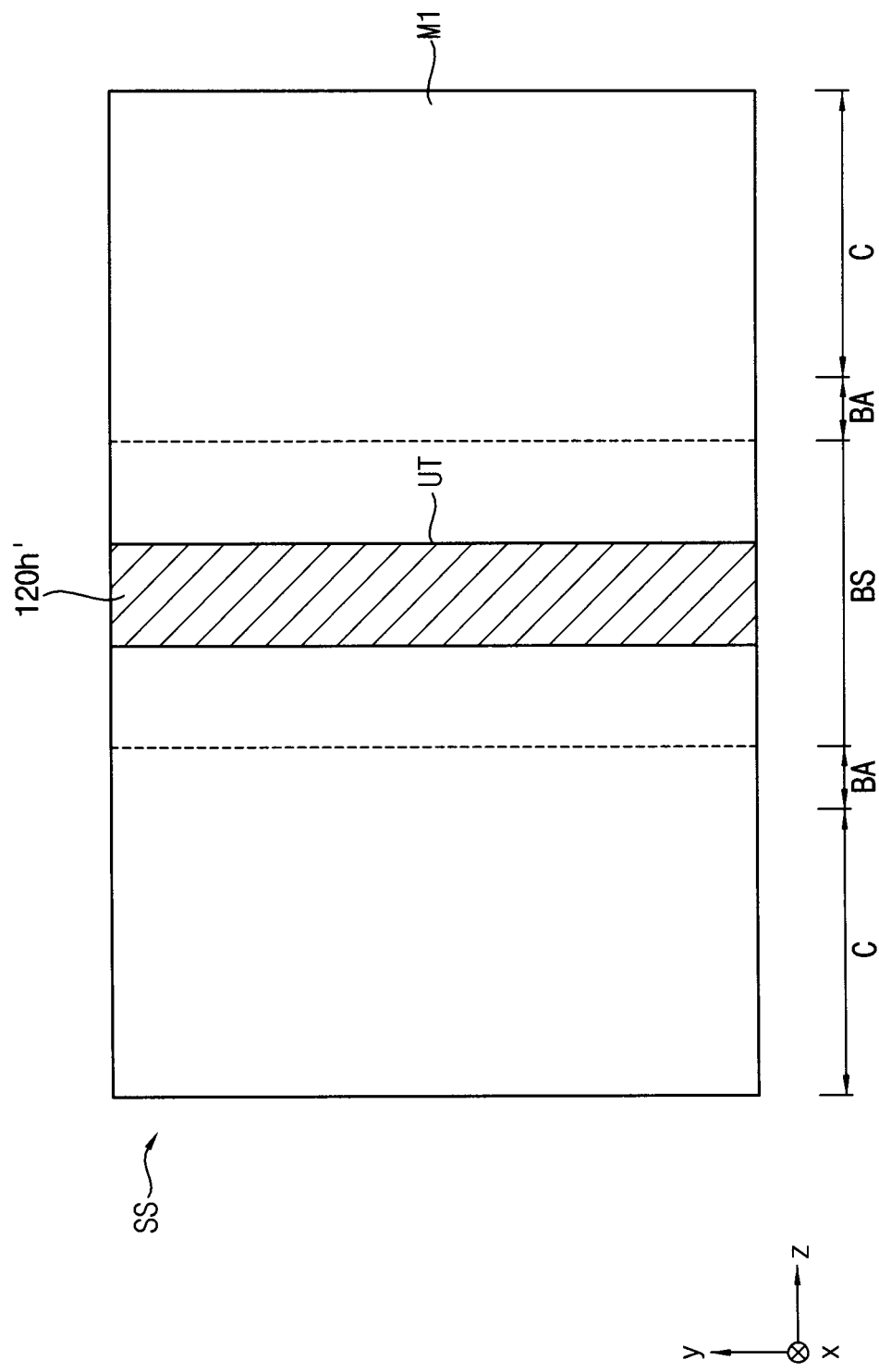

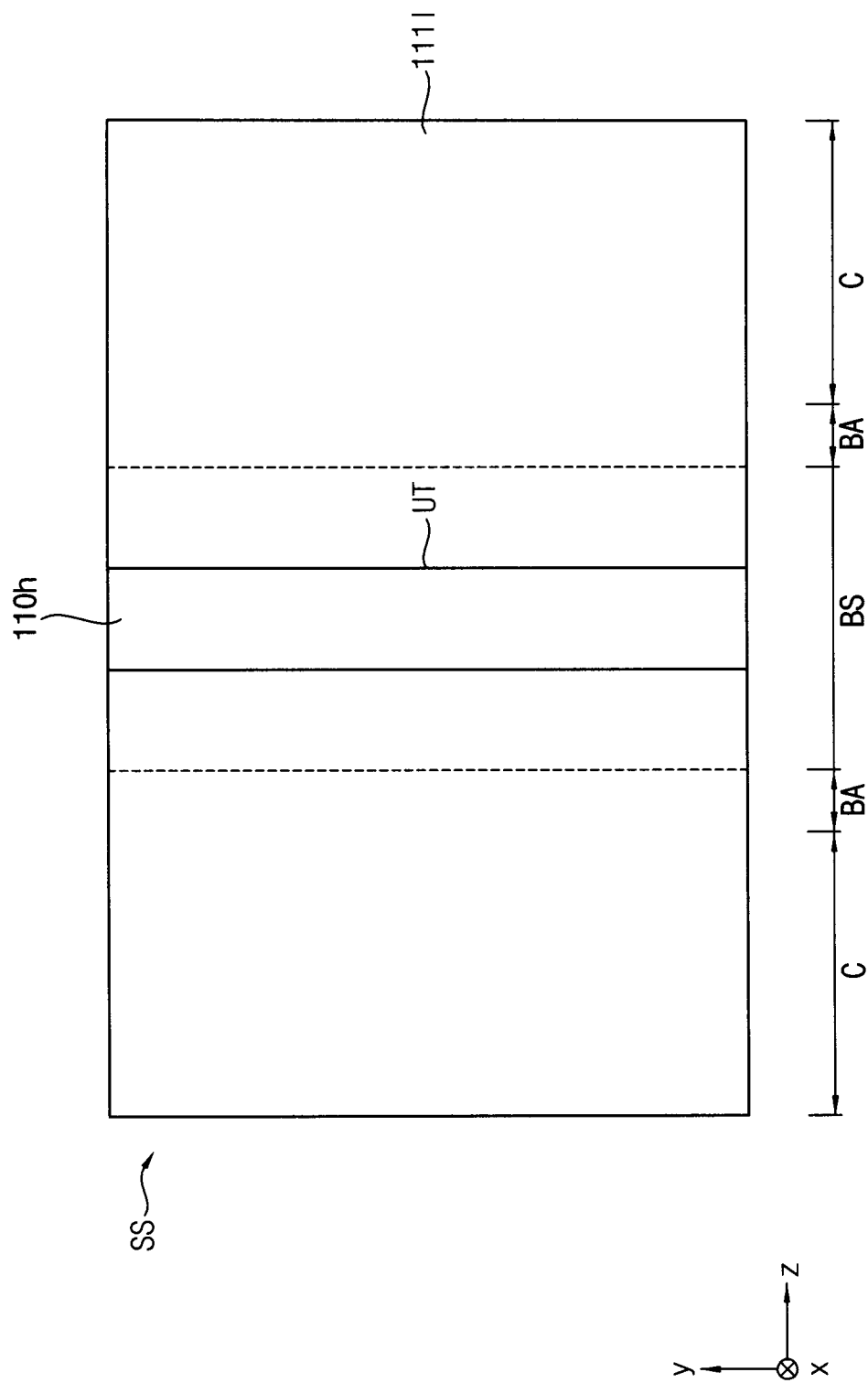

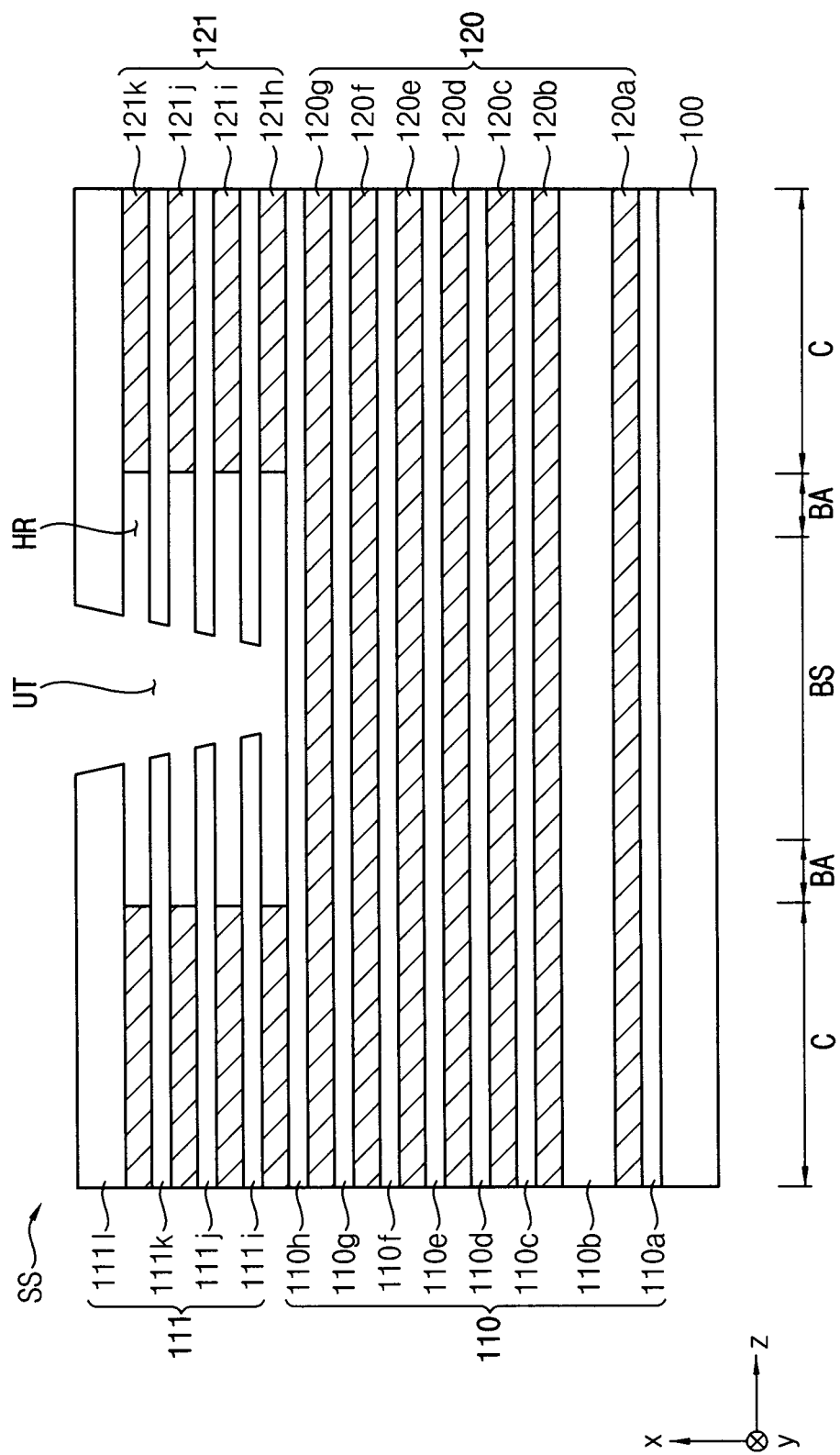

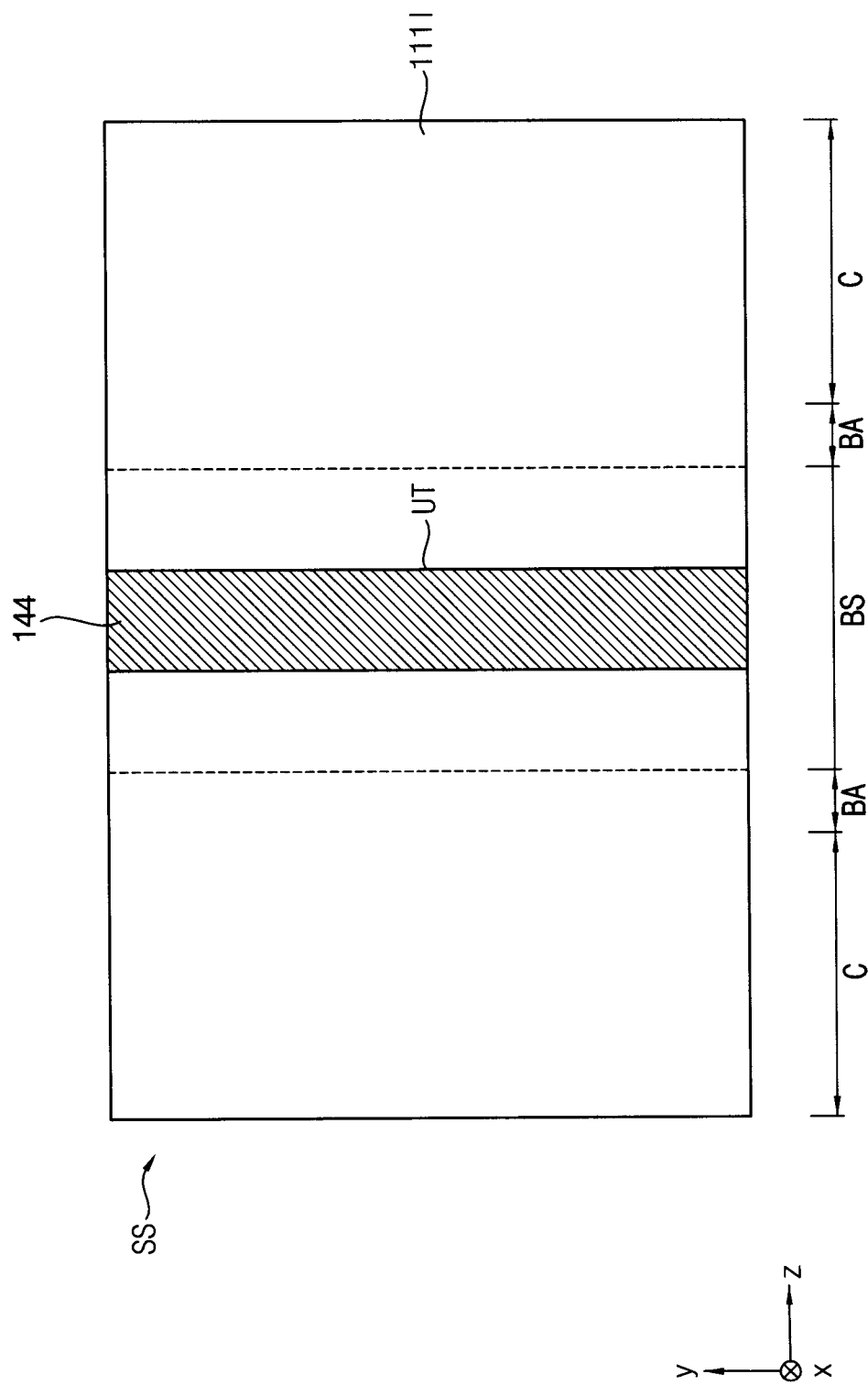

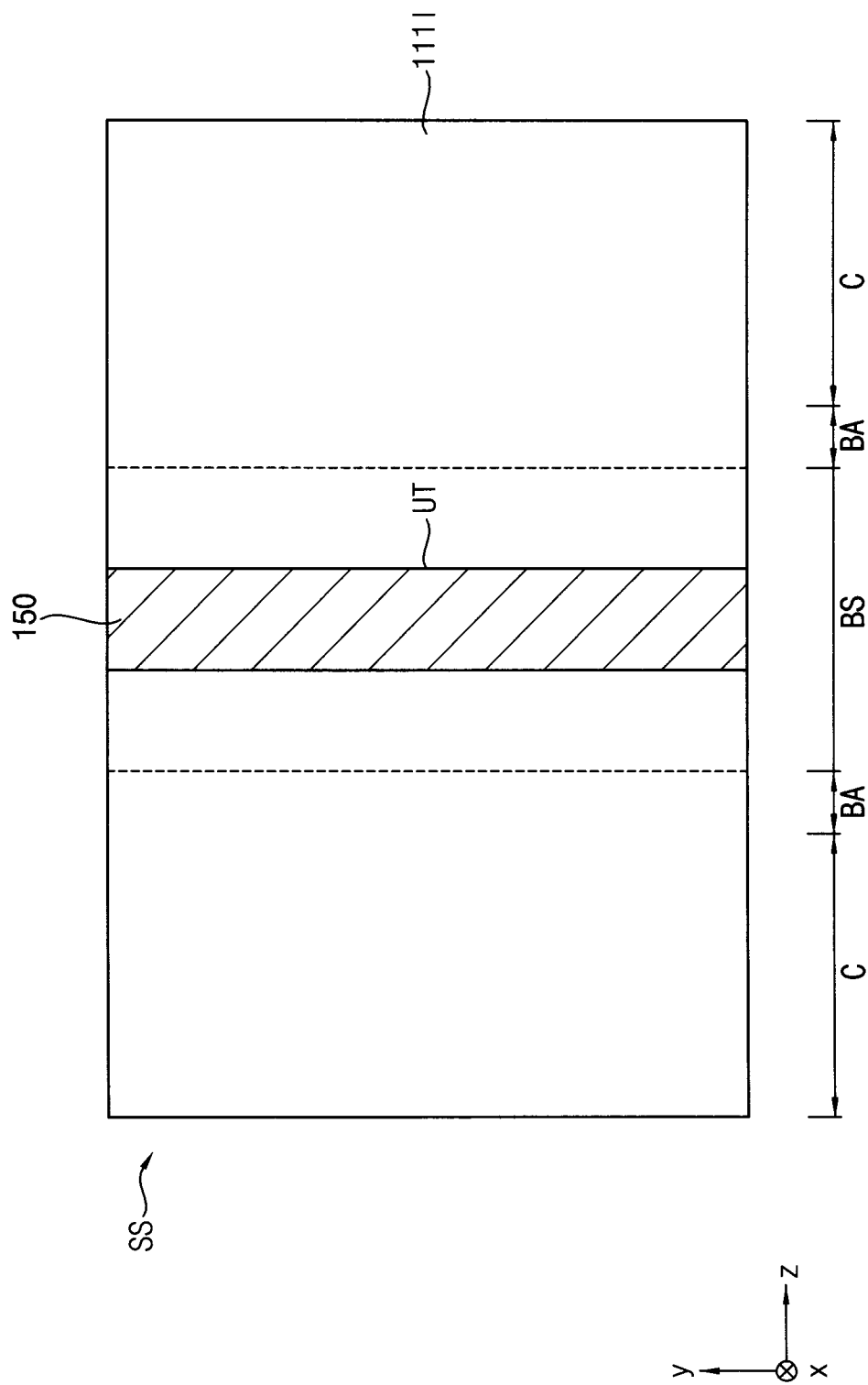

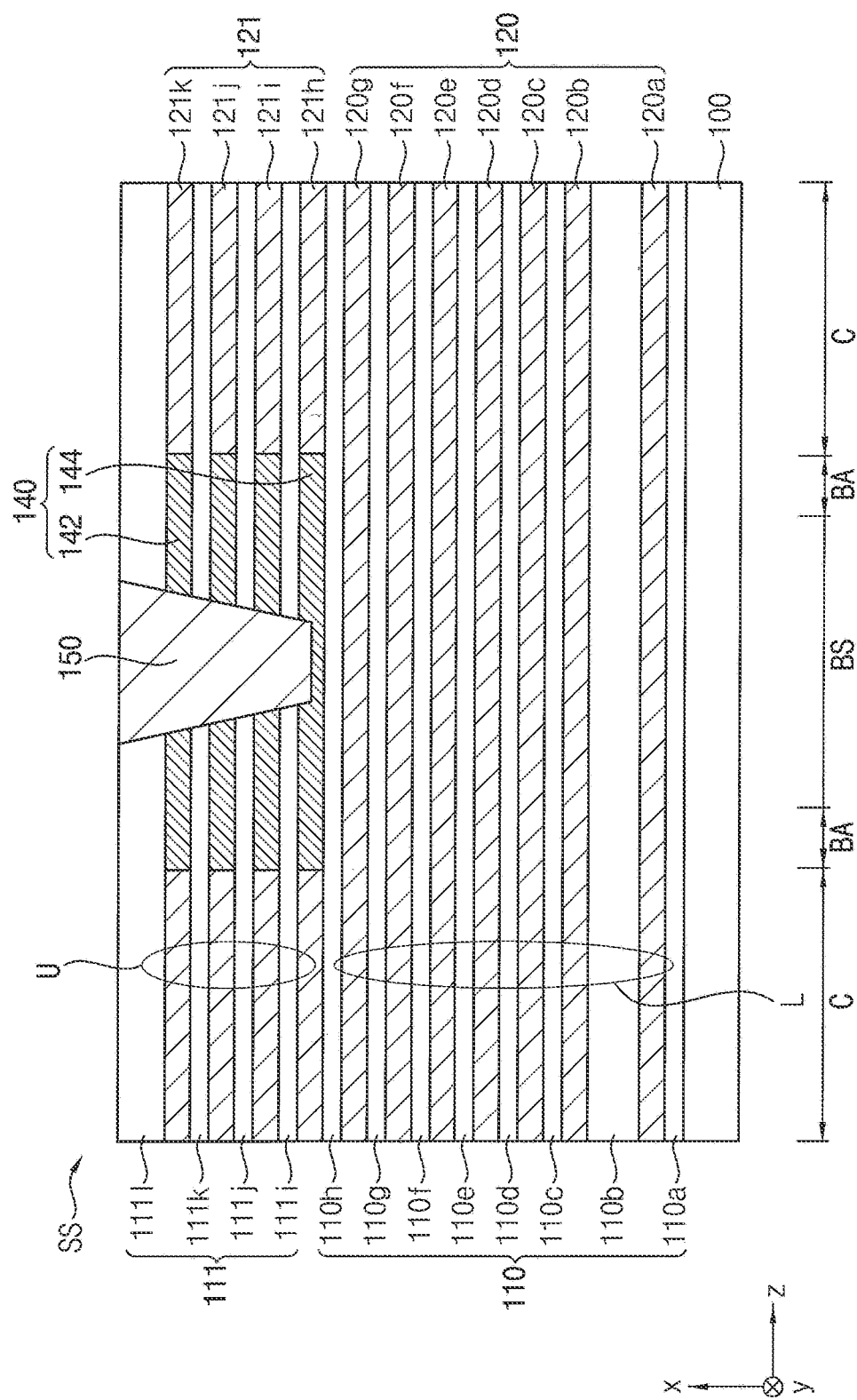

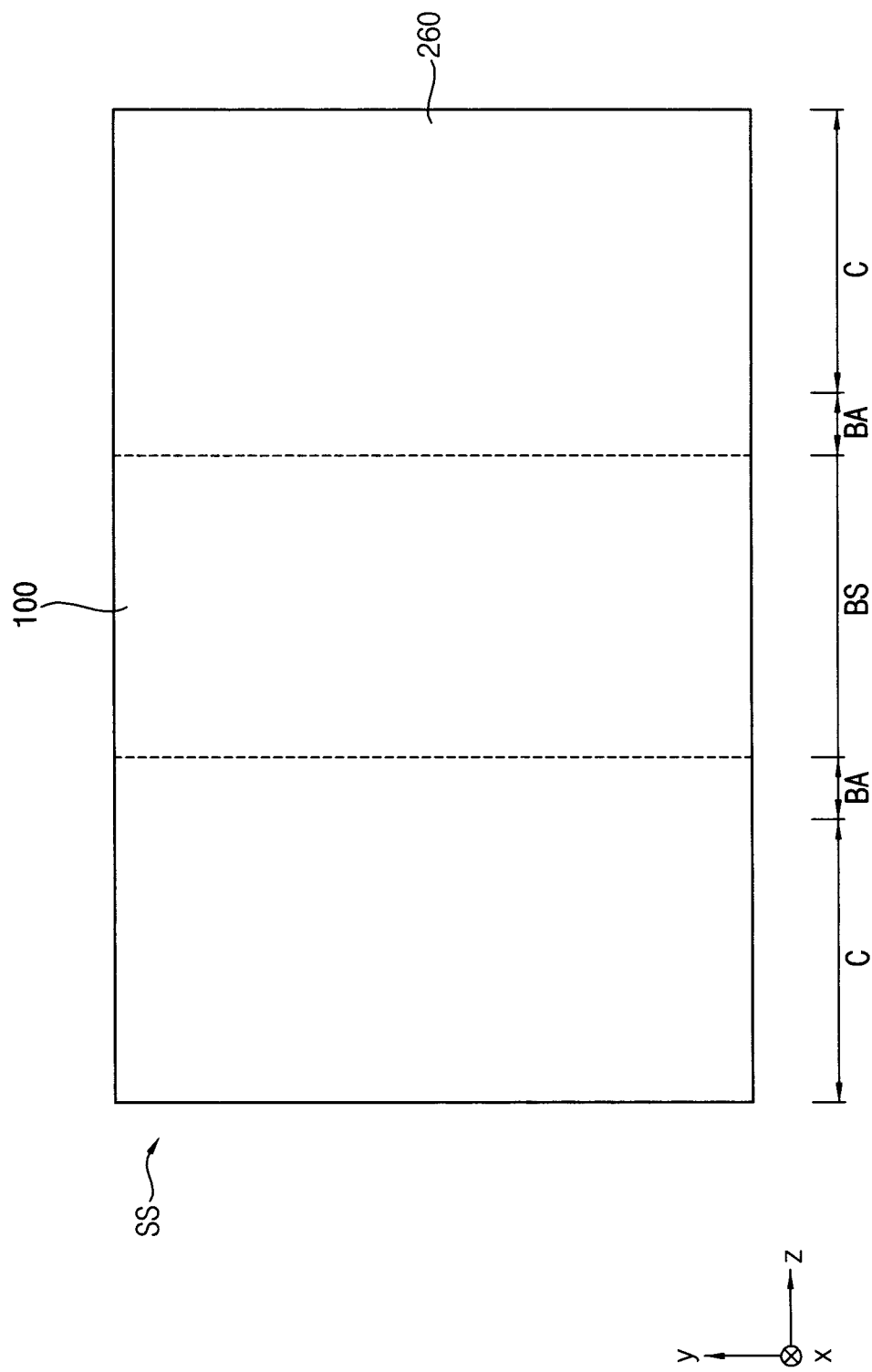

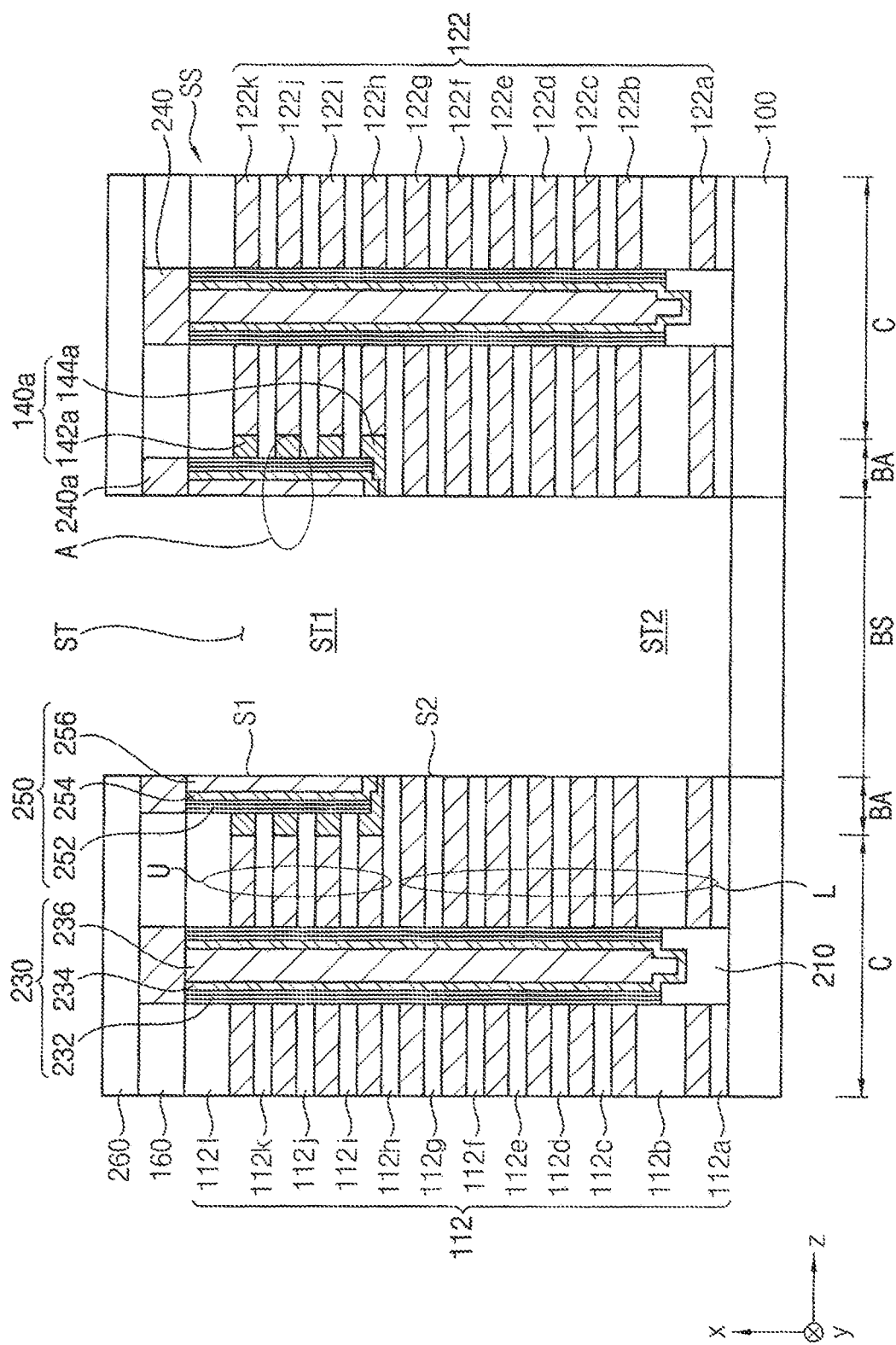

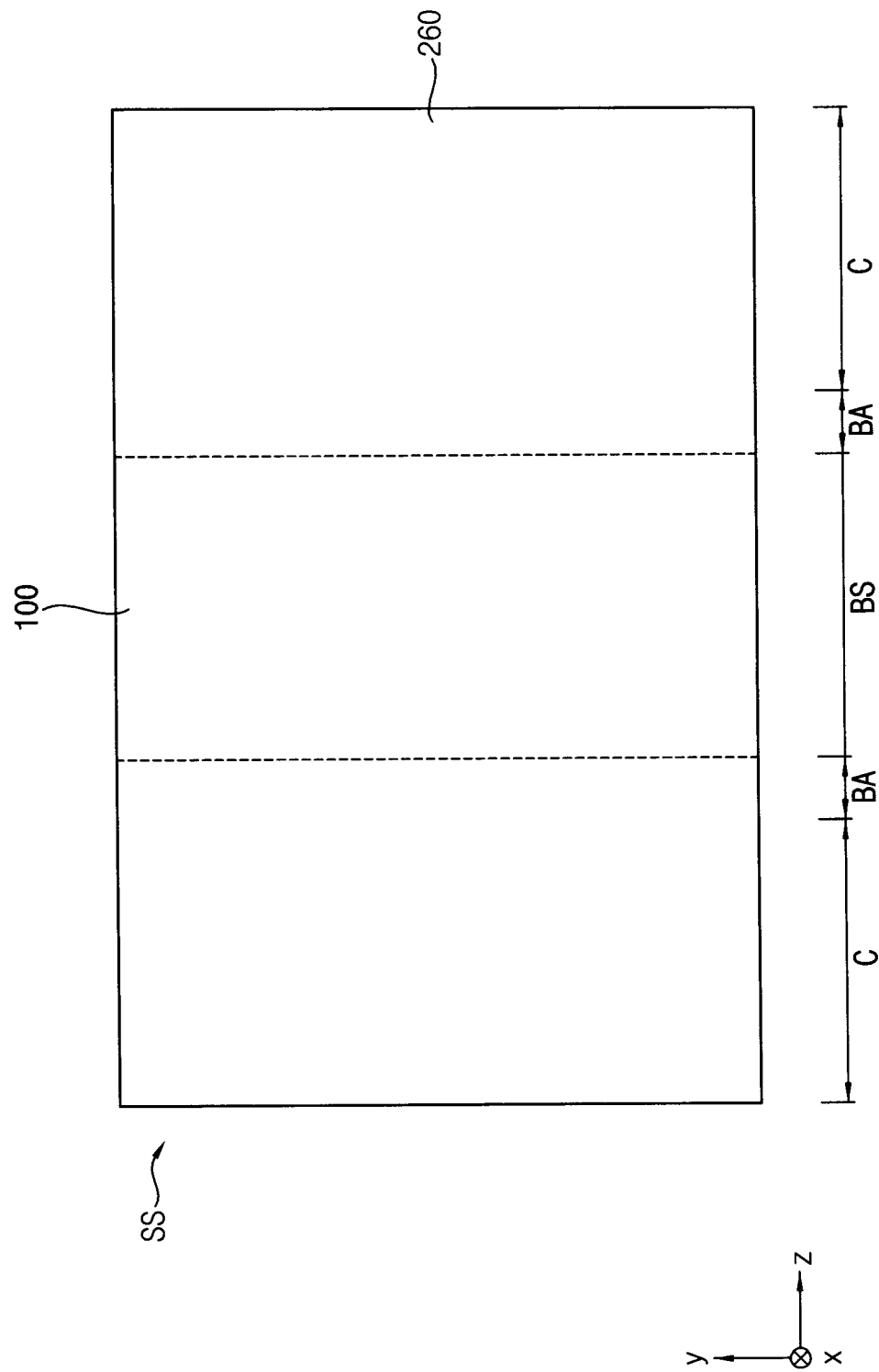

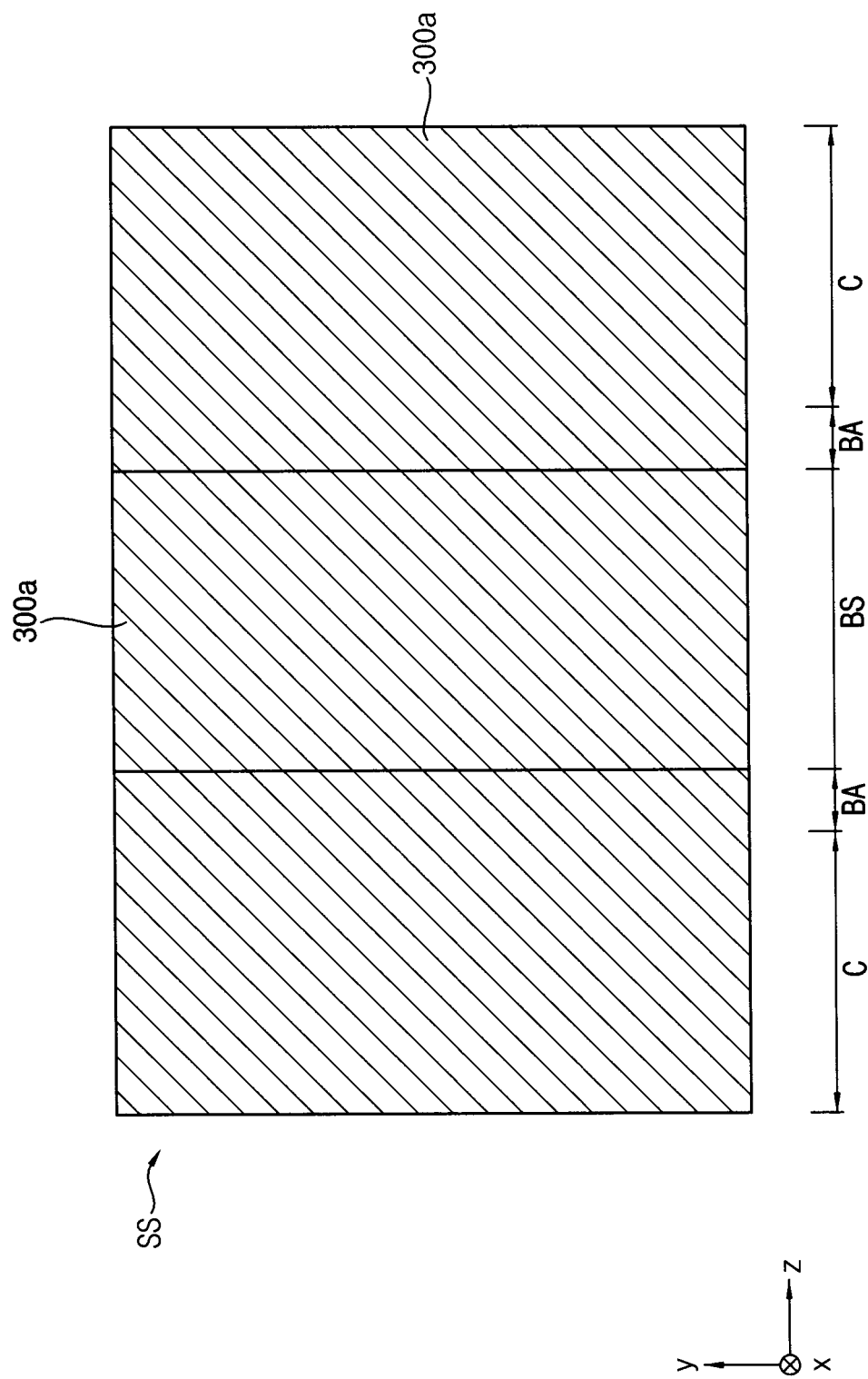

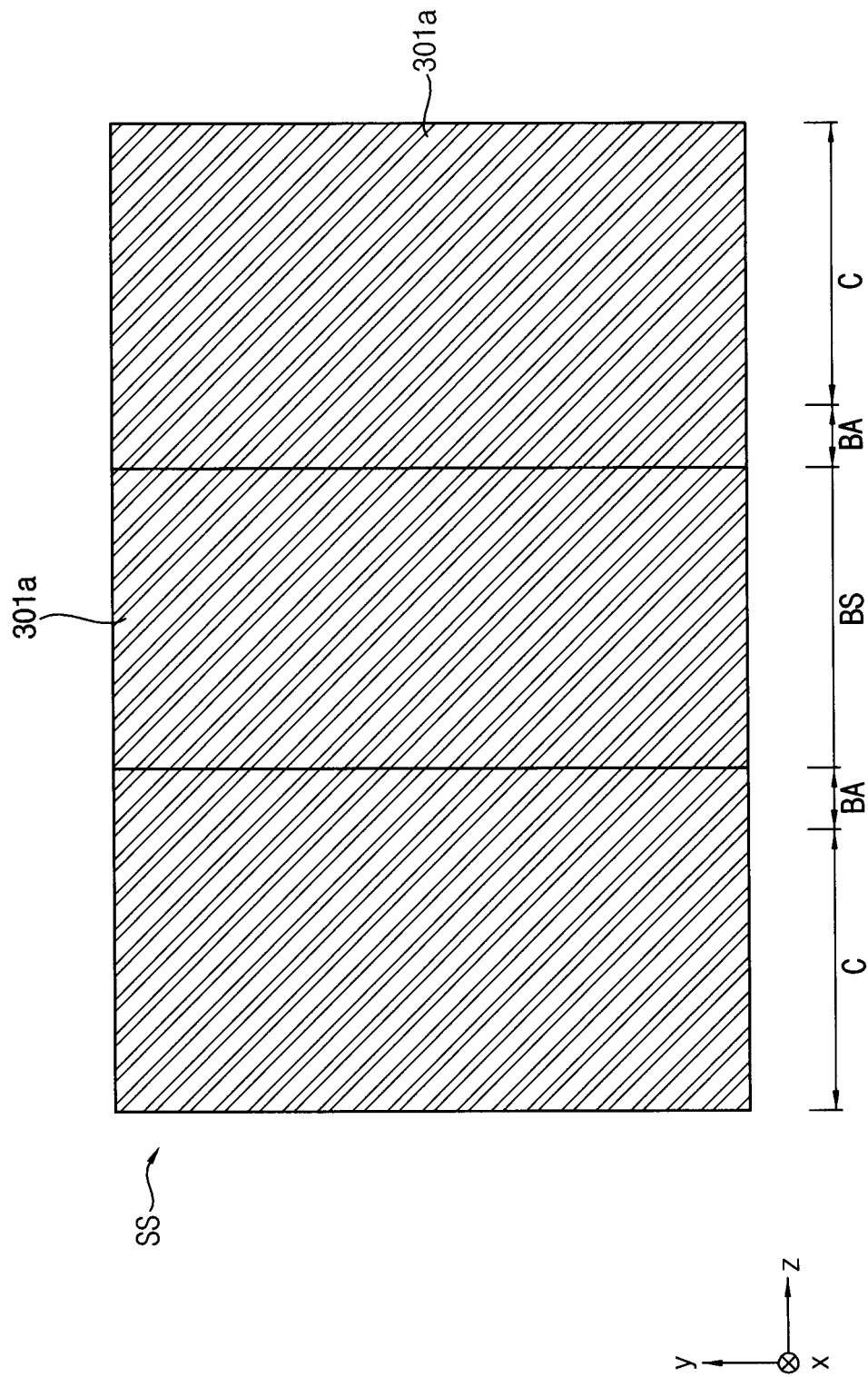

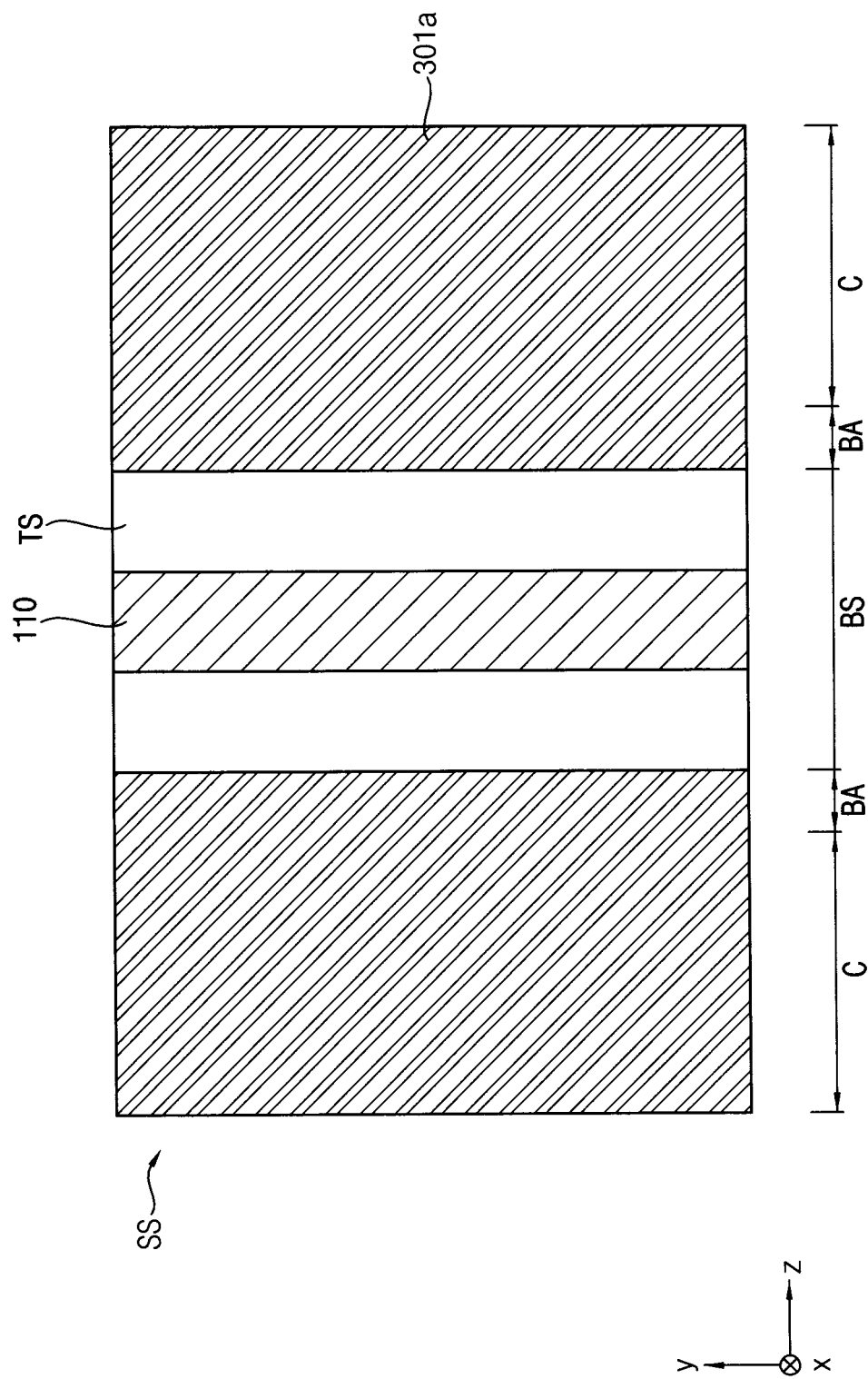

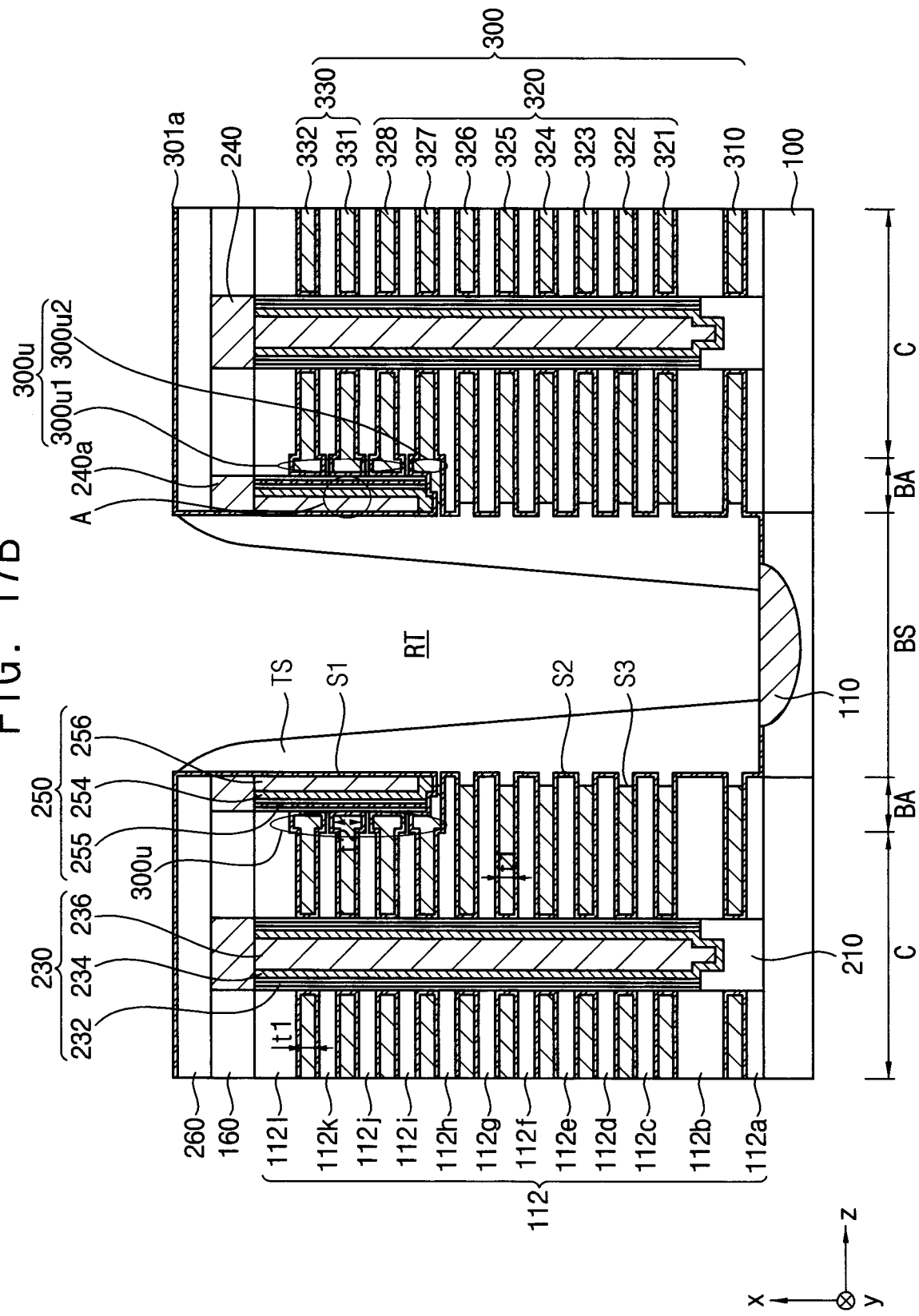

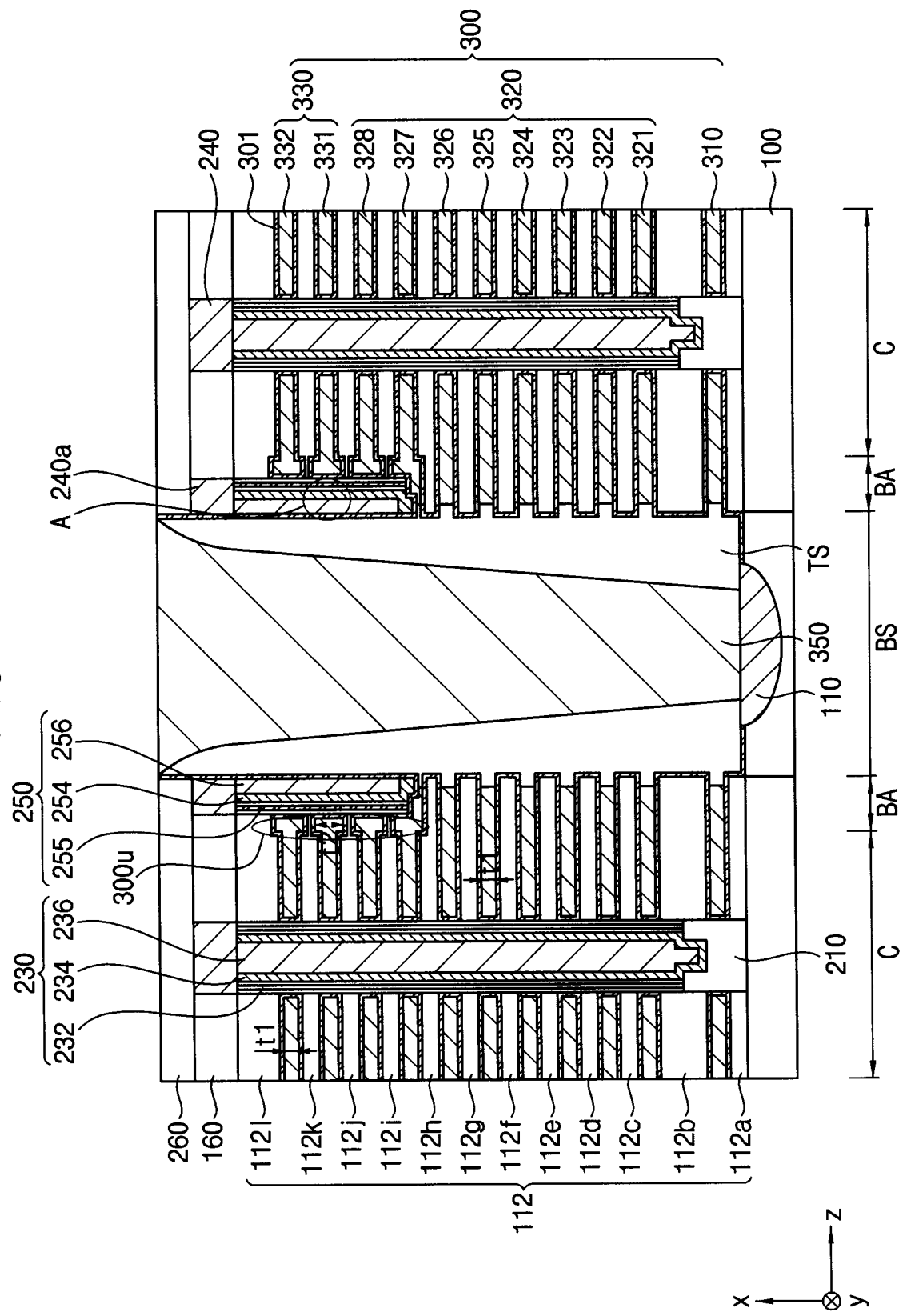

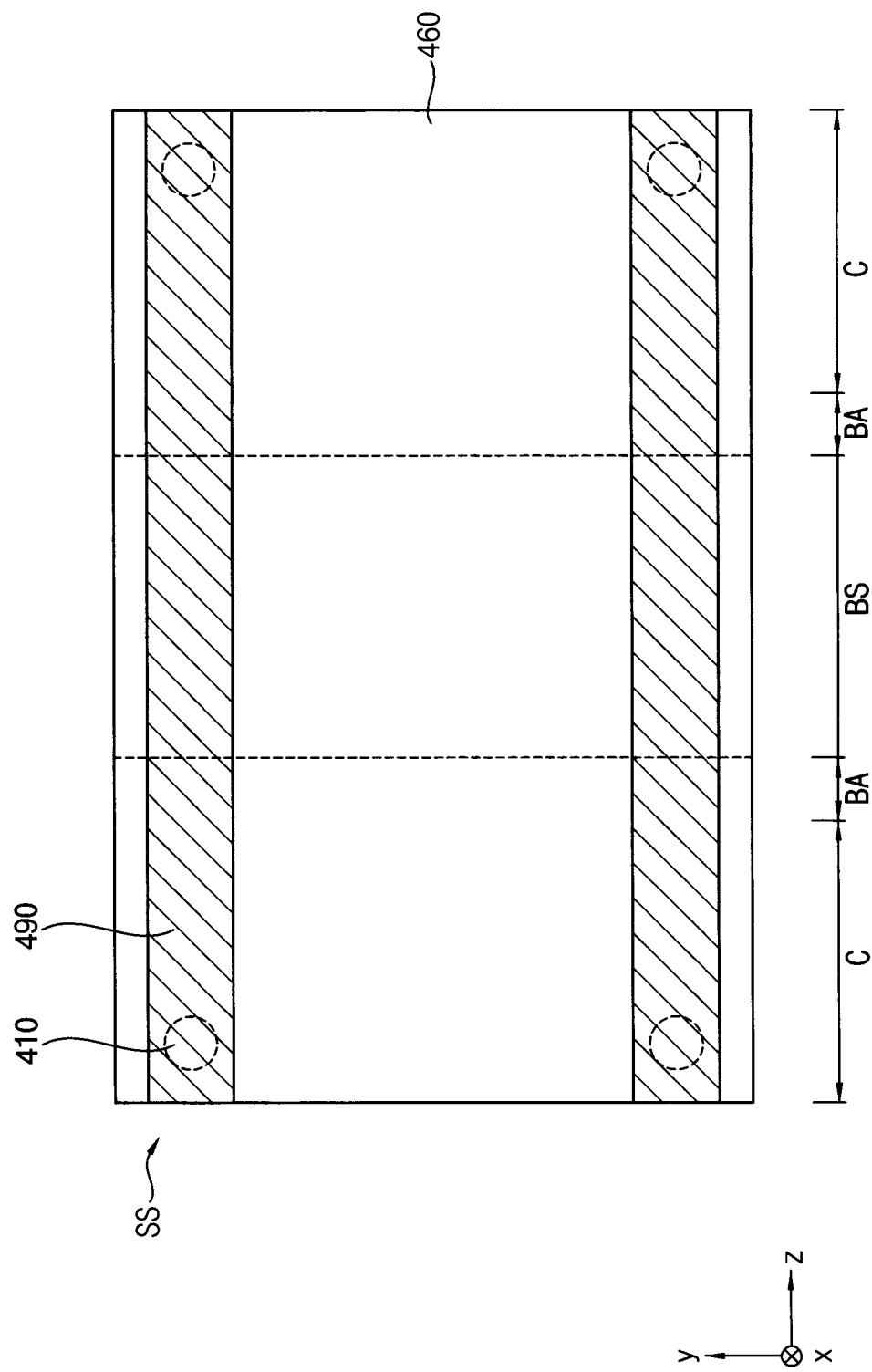

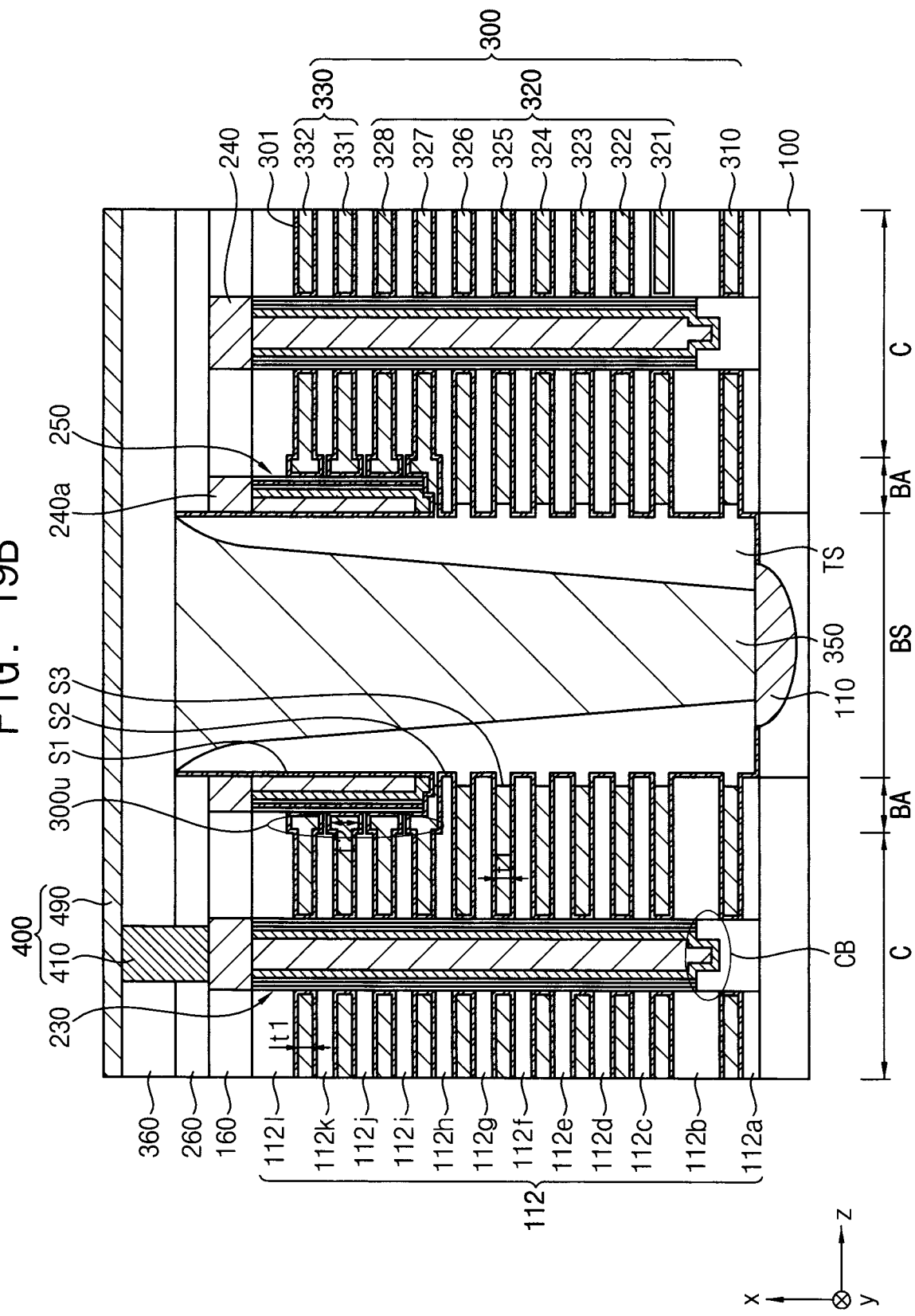

VERTICAL MEMORY DEVICES AND METHODS OF MANUFACTURING THE SAME

CROSS-REFERENCE TO RELATED APPLICATIONS

This application claims priority under 35 U.S.C § 119 to Korean Patent Application No. 10-2019-0089420 filed on Jul. 24, 2019 in the Korean Intellectual Property Office, the contents of which are incorporated by reference herein in its entirety.

BACKGROUND

1. Field

Example embodiments relate to vertical memory devices and methods of manufacturing the same, and more particularly, to vertical NAND flash memory devices and methods of manufacturing.

2. Description of the Related Art

A vertical NAND (VNAND) flash memory device includes a plurality of memory cells vertically stacked on a substrate and thus a memory capacitance of the VNAND memory device may increase. The memory cells may be stacked around a single vertical channel and a plurality of vertical channels may be provided in the VNAND memory device.

Since the memory capacitance of the VNAND memory device depends on the number of the vertical channels, various methods for increasing the number of vertical channels in a cell block in the VNAND memory device have been studied.

In general, a stack layer structure may be formed on the substrate and a mask pattern may be formed on the stack layer structure in such a way that a block separation area of the stack layer structure may be covered by the mask and a cell block area of the stack layer structure may be exposed. Then, a plurality of channel holes for the vertical channels may be formed in the cell block area through the stack layer structure.

Recently, the aspect ratio of the channel hole has been significantly increased as the stack number of the stack layer structure has increased and the number of vertical memory cells of the VNAND memory device has increased in a vertical direction. The high aspect ratio of the channel hole may give rise to an insufficient etching around each bottom portion of the channel holes, and thus a not-open defect may occur at the bottom positions of the channel holes in the block separation area. Therefore, the substrate of the block separation area may not sufficiently be exposed in the block separation area.

SUMMARY

Example embodiments of the present inventive concept provide a CDS type vertical memory device in which the dummy channel structure is arranged at an upper portion of the block separation trench and the vertical profile of the sidewalls of the block separation trench is sufficiently uniform in spite of the high aspect ratio.

Other example embodiments of the present inventive concept provide a method of manufacturing the above vertical memory device.

According to some embodiments of the inventive concept, there is provided a vertical memory device including a substrate including a cell block area, a block separation area and a boundary area between the cell block area and the block separation area, a plurality of stack structures arranged in the cell block area and the boundary area. The plurality of stack structures are stacked in a first direction substantially perpendicular to the substrate such that insulation interlayer patterns may be stacked on the substrate alternately with the electrode patterns and the stack structures may be spaced apart from each other by the block separation area in a third direction substantially perpendicular to the first direction. The vertical memory device includes a plurality of channel structures that extend through respective ones of the stack structures to the substrate in the cell block area such that the plurality of channel structures may penetrate through the electrode patterns and the insulation interlayer patterns in the first direction. The vertical memory device includes a plurality of dummy channel structures that extend through upper portions of respective ones of the stack structures in the boundary area such that respective ones of the dummy channel structures may penetrate through the electrode patterns and the insulation interlayer patterns in the first direction and may be in contact with a dummy bottom electrode pattern that includes one of the electrode patterns spaced apart from the substrate.

Some embodiments of the inventive concept are directed to a vertical memory device that includes a substrate including a cell block area, a block separation area and a boundary area between the cell block area and the block separation area, and a plurality of stack structures in the cell block area and the boundary area. The plurality of stack structures is stacked in a first direction substantially perpendicular to the substrate such that insulation interlayer patterns are stacked on the substrate alternately with electrode patterns. The stack structures are spaced apart from each other by the block separation area in a third direction substantially perpendicular to the first direction. The vertical memory device includes a plurality of channel structures that extend through respective ones of the stack structures to the substrate in the cell block area such that the plurality of channel structures penetrate through the electrode patterns and the insulation interlayer patterns in the first direction, a plurality of block separation structures on the substrate in the block separation area between neighboring ones of the plurality of stack structures to separate the stack structures by a memory block in the third direction substantially perpendicular to the first direction, and a plurality of dummy channel structures that extend through upper portions of respective ones of the stack structures in the boundary area such that each of the plurality of dummy channel structures penetrates through the electrode patterns and the insulation interlayer patterns and is connected to a dummy bottom electrode pattern that is one of the electrode patterns spaced apart from the substrate.

Some embodiments of the inventive concept are directed to a vertical memory device that includes a substrate, and a plurality of stack structures stacked in a first direction substantially perpendicular to the substrate such that insulation interlayer patterns are stacked on the substrate alternately with electrode patterns. The stack structures are spaced apart from each other by a block separation area. The vertical memory device includes a plurality of channel structures that extend through respective ones of the stack structures such that the plurality of channel structures penetrate the electrode patterns and the insulation interlayer patterns and a plurality of dummy channel structures that extend through upper portions of respective ones of the stack structures and penetrate through some of the electrode patterns and some of the insulation interlayer patterns. An electrode pattern of the electrode patterns in the upper portion of the stack structure includes an expanded portion in contact with a dummy channel structure of the plurality of dummy channel structures. The expanded portion has a first thickness that is greater than a second thickness of a remaining portion of the of the electrode pattern.

According to some embodiments of the inventive concept, there is provided a method of manufacturing the above vertical memory device. A stack structure may be formed on the substrate by alternately stacking insulation interlayers and the sacrificial layers in a first direction. The substrate includes a cell block area, a boundary area and a block separation area and the stack structure may be formed on the whole substrate regardless of the cell block area, the boundary area and the block separation area. Then, a dummy channel stopper may be formed at an upper portion of the stack structure in such a way that the dummy channel stopper may extend from the block separation area to the cell block area around the boundary area and make horizontal contact with the sacrificial layer. The dummy channel stopper may have etch-resistance smaller than the insulation interlayer. Then, a plurality of channel holes and a plurality of dummy holes may be simultaneously formed in the cell block area and across the boundary area and the block separation area in such a way that the channel hole may penetrate through the stack structure to the substrate and the dummy channel may penetrate through the upper portion of the stack structure to a bottom of the dummy channel stopper. Then, a channel structure and a preliminary dummy channel structure may be simultaneously formed the channel hole and the dummy hole, respectively. The channel structure may be connected to the substrate and may selectively trap charges in response to signals and the preliminary dummy channel structure may not trap the charges. Then, the preliminary dummy channel structure, the dummy channel stopper, the insulation interlayers and the sacrificial layers may be removed from the block separation area of the substrate, thereby forming the stack structure into separated stack patterns, a dummy channel structure and a residual stopper remaining at the upper portion of each stack pattern in the boundary area a block separation trench separating the stack patterns in the third direction and exposing the substrate in the block separation area.

According to some embodiments of the inventive concept, no residual channels may remain on the substrate at the lower portion of the block separation trench and thus the bridge defect may be sufficiently prevented although the dummy hole may be formed continuously with the channel hole in the same hole etching process.

The block separation trench may be formed by sequential etching steps of the first trench etching process to the upper portion and the second etching process to the lower portion of the stack structure. Thus, the separation trench may be formed under the sufficiently small aspect ratios and the sidewall of the separation trench may be sufficiently uniform in the first direction, thereby obtaining a uniform vertical profile of the block separation trench in the first direction in spite of high stack number of the electrode patterns.

In addition, the dummy channel structure may be formed only at the upper portion of the stack structure by the dummy gap distance from the substrate, and thus no residual channels may remain on the substrate at the lower portion of the block separation trench. Accordingly, the bridge defect between neighboring gate lines at the lower portion of the block separation trench may be sufficiently prevented due to the uniform vertical profile of the block separation trench and the dummy channel structure spaced apart from the substrate.

BRIEF DESCRIPTION OF THE DRAWINGS

These and other features of the inventive concept will become more apparent by describing in detail some embodiments thereof with reference to the accompanying drawings of which:

FIG. 1 is a plan view illustrating a vertical memory device in accordance with an example embodiment of the present inventive concept;

FIG. 2A is a cross sectional view cut along a line I-I' of the vertical memory device in FIG. 1;

FIGS. 4A to 19B are cross-sectional views illustrating processing steps for a method of manufacturing the vertical memory devices shown in FIGS. 1 to 3B in accordance with an example embodiment of the present inventive concept.

DETAILED DESCRIPTION

Figure 2B:
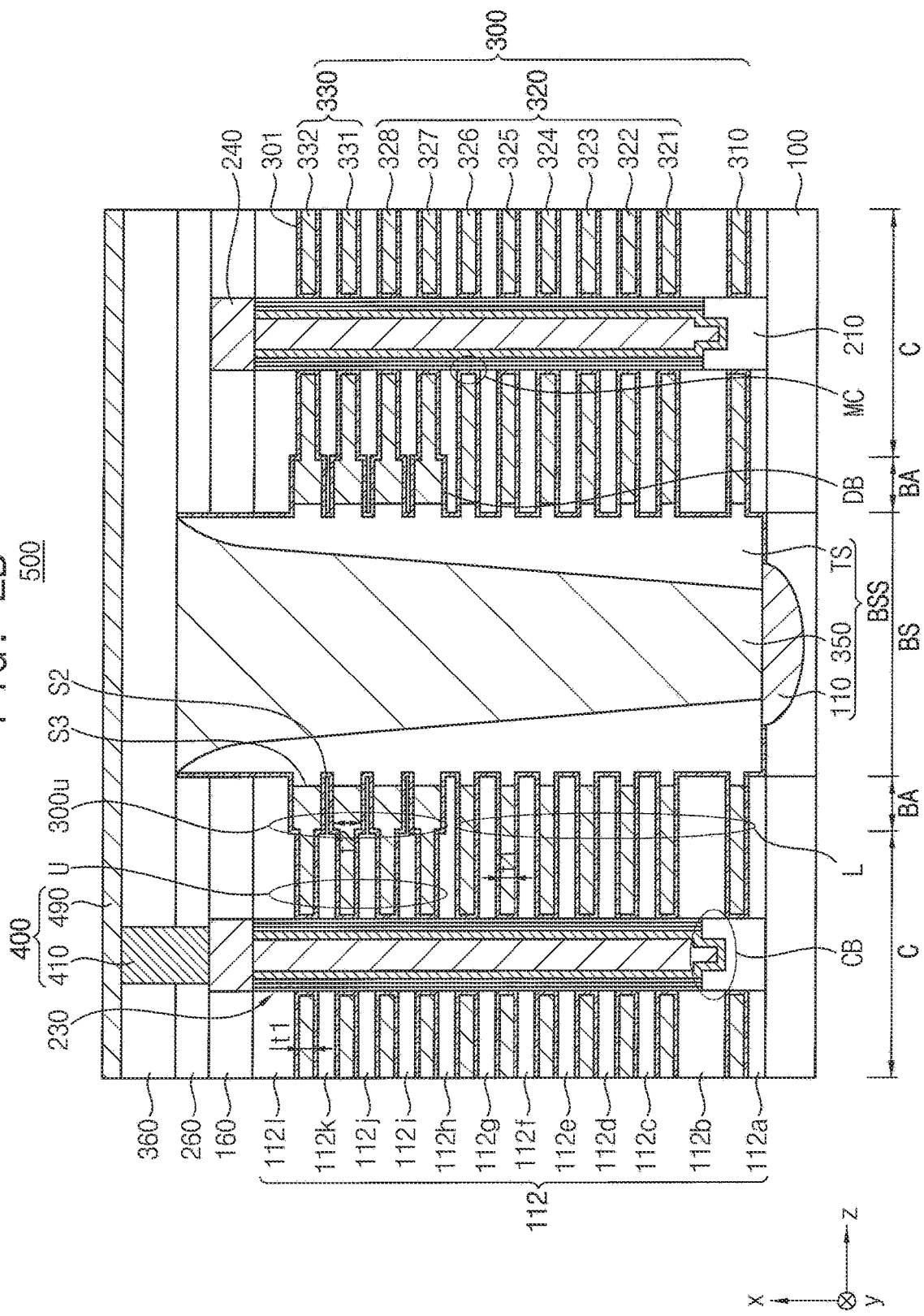
FIG. 2B is a cross sectional view cut along a line II-II' of the vertical memory device in FIG. 1.

A continuous dummy channel (CDH) process has been introduced so as to avoid the not-open defect in the block separation area. In the CDH process, a single hole process for forming the channel hole is continuously conducted along a whole surface of the stack layer structure across the cell block area and the block separation area. Thus, a plurality of holes is continuously arranged on the whole stack layer structure under a single arrangement rule. The holes in the cell block area are provided as the channel holes and the holes in the block separation area are provided as the dummy holes. Therefore, the channel holes and the dummy holes are continuously arranged on the stack layer structure under the single arrangement rule.

When the hole process is completed, a block separation process is conducted to the stack layer structure of the block separation area, to thereby form a block separation trench, until the stack layer structure is removed from the substrate and the substrate is exposed through the block separate trench. Thus, the stack layer structure is divided into a plurality of cell blocks in each of which a plurality of the channel holes is arranged and the neighboring cell blocks are spaced apart by the block separation trench. Therefore, a group of the vertical channel structures are arranged on the substrate by a unit of the cell block and a group of dummy channel structures are arranged on the substrate by a unit of a separation block.

The dummy channel structures are removed from the substrate in the block separation trench process together with the stack layer structure. However, the dummy channel structures are not sufficiently removed from the substrate in the block separation trench and dummy residuals of the dummy channel structures remain at a boundary area of a lower portion of the block separation trench. Since the dummy residuals include the same conductive structures as the channel structures, some of the neighboring vertical channel structures may be electrically connected with each other by the dummy residuals at the boundary area of a lower portion of the block separation trench. That is, the neighboring vertical cells are not separated in the lower portion of the block separation trench (i.e., a cell separation defect).

Reference will now be made to example embodiments, which are illustrated in the accompanying drawings, wherein like reference numerals may refer to like components throughout.

FIG. 1 is a plan view illustrating a vertical memory device in accordance with an example embodiment of the present inventive concept. FIG. 2A is a cross sectional view cut along a line I-I' of the vertical memory device in FIG. 1, and FIG. 2B is a cross sectional view cut along a line II-II' of the vertical memory device in FIG. 1. In FIG. 1, a plurality of channel structures and a plurality of dummy channel structures are illustrated.

Hereinafter, a vertical direction penetrating through an upper surface of a substrate is defined as a first direction x and a pair of parallel directions in parallel with the upper surface of the substrate and perpendicular to each other are defined as a second direction y and a third direction z, respectively. The first direction x, the second direction y, and the third direction z may be perpendicular to one another.

Referring to FIGS. 1, 2A and 2B, a vertical memory device 500 in accordance with some embodiments of the present inventive concept may include a substrate 100 divided into a cell block area C, a block separation area BS and a boundary area BA between the cell block area C and the block separation area BA, a plurality of stack structures SS arranged in the cell block area C and the boundary area BA and stacked in the first direction x such that insulation interlayer patterns 112 may be stacked on the substrate 100 alternately with the electrode patterns 300 and the stack structures SS are spaced apart by the block separation area BA in the third direction z, a plurality of channel structures 230 extending through each of the stack structures SS to the substrate 100 in the cell block area C such that the channel structure 230 may penetrate through the electrode patterns 300 and the insulation interlayer patterns 112 in the first direction x and may be connected to the substrate 100, and a plurality of dummy channel structures 250 extending through upper portions U of each of the stack structures SS in the boundary area BA such that the dummy channel structure may penetrate through the electrode patterns 300 and the insulation interlayer patterns 112 in the first direction x and may be connected to a dummy bottom electrode pattern DBE that may be one of the electrode patterns 300 spaced apart from the substrate 100. The vertical memory device 500 may also include a plurality of block separation structures BSS arranged on the substrate 100 in the block separation area BS between the neighboring stack structures to thereby separate the stack structures SS by a memory block in the third direction z.

The substrate 100 may include a silicon substrate, a germanium (Ge) substrate, a silicon-on-insulator (SOI) substrate and/or a germanium-on-insulator (GOI) substrate. In some embodiments, the substrate 100 may include a composite substrate comprising a composition of Group III and Group V.

A plurality of memory cells MC is vertically provided in the stack structure SS on the cell block area C of the substrate 100 in the first direction x and a plurality of dummy cells is vertically provided in an upper portion U of the stack structure SS on the boundary area of the substrate 100. A plurality of stack structures SS may be separated from one another by the block separation structure BSS that may be arranged in the block separation area of the substrate 100.

For example, the memory cells MC in the same stack structure SS, which may be defined by the block separation structure BSS, may be provided as a memory block B of the vertical memory device 500. The data erasing and the data programming may be conducted by a unit of the memory block B in the vertical memory device 500.

The stack structure SS may include insulation interlayer patterns 112 and the electrode patterns 300 that may be repeatedly stacked on the cell block area C and the boundary area BA of the substrate 100 alternately with each other in the first direction x. The block separation structure BSS may be interposed between the neighboring stack structures SS on the block separation area BS of the substrate 100 and no stack structure SS may be provided in the block separation area of the substrate 100. Thus, the neighboring stack structures SS may be separated from each other in the third direction z by the block separation structure BSS.

For example, the insulation interlayer patterns 112 may be shaped into a plate defined by the second direction y and the third direction z across the cell block area C and the boundary area BA of the substrate 100.

In some embodiments, the insulation interlayer patterns 112 may include a first insulation interlayer pattern 112a on the substrate 100 and second to twelve insulation interlayer patterns 112b to 112l that may be sequentially stacked on the first insulation interlayer pattern 112a alternately with the electrode patterns 300. That is, a plurality of insulation plates may be stacked on the substrate 100 in the first direction x by the same or similar gap distance. The thickness of each insulation interlayer pattern 112a to 112l may be the same or different from one another in accordance with the structures and requirements of the vertical memory device 500.

The number of the insulation interlayer patterns 112 may be varied in accordance with the storage capacity of the vertical memory device 500. Hereinafter, overall insulation interlayer patterns may be denoted as reference number 112 and an individual insulation interlayer pattern may be denoted as one of reference numbers 112a to 112l.

Since individual electrode patterns may be alternately stacked with individual insulation interlayer patterns 112a to 112l, the electrode pattern may be interposed between the neighboring insulation interlayer patterns 112a to 112l. Particularly, each insulation interlayer patterns 112a to 112l may be covered with or overlapped by, in the third direction z parallel to the substrate 100, a second blocking pattern 301, and thus an upper surface and a lower surface of each electrode pattern may also be covered with or overlapped by the second blocking pattern 301.

For example, the insulation interlayer patterns 112 may include insulation materials such as silicon oxide, so each electrode pattern 300 interposed between the insulation interlayer patterns 112 may be electrically insulated from each other. Thus, each electrode pattern may individually function as a gate electrode of the memory cell MC.

The electrode patterns 300 may be arranged alternately with the insulation interlayer patterns 112 in the first direction x. Like the insulation interlayer patterns 112, the electrode patterns 300 may also be shaped into an electrode plate and may have the same size or similar size as the insulation interlayer patterns 112.

In some embodiments, the electrode patterns 300 may include eleven electrodes from a lowermost electrode covering the first insulation interlayer patterns 112a to an uppermost electrode covering the eleventh insulation interlayer patterns 112l. The number of the electrode patterns 300 and the insulation interlayer patterns 112 may be varied according to the storage capacity of the vertical memory device 500. Hereinafter, overall electrode patterns may be denoted as reference number 300 and may be grouped by first, second and third gate lines 310, 320 and 330. The second gate line 320 may include $1^{st}$ to $8^{th}$ word lines 321 to 328 and the third gate line 330 may include an upper string selection line 331 and a lower string selection line 332. The first gate line 310 may be provided as a ground selection line GSL.

The electrode patterns 300 may include low-resistive conductive materials such as tungsten (W), tantalum (Ta) and platinum (Pt). Although not shown in the figures, each of the electrode patterns 300 may further include a barrier metal pattern interposed between the neighboring insulation interlayer patterns 112.

Accordingly, the insulation interlayer patterns 112 and the electrode patterns 300 may be stacked on the substrate 100 alternately with each other and the stack structure SS of the insulation interlayer patterns 112 and the electrode patterns 300 may be separated from each other by the block separation structure BSS in the third direction z.

A lower portion L of the stack structure SS may be lower than the dummy channel structure 250 and may be relatively close to the substrate 100. An upper portion U of the stack structure SS may be higher than the dummy channel structure 250 and may be relatively far from the substrate 100 compared to the lower portion L.

Particularly, a side surface of the plate-shaped electrode patterns 300, referred to as third surface S3, may be contact with the block separation structure BSS and a side surface of the plate-shaped electrode patterns 300 may be contact with the second blocking pattern 301.

In some embodiments, the electrode patterns 300 may include a first gate line 310, a second gate line 320 and a third gate line 330. The first gate line 310 may be provided as a ground selection line GSL, and the second gate line 320 may be provided as a word line WL. The third gate line 330 may be provided as a string selection line SSL.

Particularly, some of the electrode patterns 300 in the upper portion U of the stack structure SS may include expanded portions 300u enclosing the dummy channel structure 250 on the boundary area BA of the substrate 100. Each of the expanded portions 300u may have a greater thickness than the rest of the corresponding upper electrode pattern 300. That is, while most of the electrode patterns 300 may have a first thickness t1 in the vertical memory device 500, the expanded portions 300u of the upper electrode pattern 300 may be partially expanded in the first direction x and may have a second thickness t2 greater than the first thickness t1 in the boundary area BA of the substrate 100.

For example, the expanded portions 300u may include a plurality of side expanded portions 300u1 spaced apart alternately with the insulation interlayer patterns 112 in the first direction x and a bottom expanded portion 300u2 making contact with a bottom of the dummy channel structure 250. Particularly, the side expanded portions 300u1 may make contact with the dummy channel structure 250 and the bottom expanded portions 300u2 may have a recess for holding the bottom of the dummy channel structure 250 or the dummy bottom electrode pattern DBE.

A plurality of the channel structures 230 may be arranged in the cell block area C of the substrate 100 and a plurality of the dummy channel structures 250 may be arranged in the boundary area BA of the substrate 100. The channel structure 230 may penetrate through the electrode pattern 300 and the insulation interlayer patterns 112 in the upper area U and the lower area L, and the dummy channel structure 250 may penetrate through the electrode pattern 300 and the insulation interlayer patterns 112 in the upper area U. Thus, the channel structure 230 may extend around or through the substrate 100 and the dummy channel structure 250 may extend to the dummy bottom electrode pattern DBE. A plurality of the memory cells MC may be arranged along the channel structure 230 in the first direction x.

A channel hole CH may be arranged or pass through the electrode pattern 300 and the insulation interlayer patterns 112 in the cell block area C in such a configuration that the substrate 100 may be exposed through the channel hole CH. A dummy hole DH may be arranged or pass through the electrode pattern 300 and the insulation interlayer patterns 112 in the upper area U of the stack structure SS in the boundary area BA in such a configuration that one of the electrode patterns 300 which may be spaced apart from the substrate 100 may be exposed through the dummy hole DH. The channel hole CH may be filled with the channel structure 230 and the dummy hole DH may be filled with the dummy channel structure 250.

The channel hole CH may have a first height h1 penetrating through the stack structure S and the dummy hole DH may have a second height h2 penetrating through the upper portion U of the stack structure SS. The second height h2 may be less than the first height h1.

Particularly, a plurality of the channel holes CH and a plurality of the dummy holes DH may be arranged on the stack structure SS under a single hole arrangement rule and may be provided as a single hole array on the stack structure SS.

As will be described in detail, a hole etching process may be conducted to a whole stack structure SS regardless of the cell block area C, the boundary area BA and the block separation area BS, so the dummy hole DH may be continuously formed sequentially to the channel hole CH as a continuous dummy hole CDH in the same hole etching process.

A number of the channel holes CH and a number of the dummy holes DH may be arranged on the stack structure SS and spaced apart from each other by a hole pitch in the third direction z as a hole array row HAR in such a configuration that the hole array rows HAR may be alternately shifted in the second direction y by a half hole pitch. Accordingly, a number of the channel holes CH and a number of the dummy holes DH may be arranged on the stack structure SS by a double hole pitch in the second direction y as a hole array column HAC.

Thus, the hole array HA may be arranged on the stack structure SS in a zigzag matrix in which a plurality of the hole array rows HAR having the hole pitch may be arranged in the second direction y and the hole array rows HAR may be alternately shifted as long as the half hole pitch in the third direction z. Accordingly, the neighboring channel holes CH may be spaced apart by the double hole pitch in the second direction y and thus the hole array column HAC may have the double hole pitch.

The channel structure 230 may extend through the stack structure SS in the first direction x and may contact the substrate 100 at a channel bottom CB and a plurality of ten memory cells MC may be arranged at contact areas between the channel structure 230 and a plurality of the electrode patterns 300 in the first direction x. Thus, a plurality of the memory cells MC may be vertically arranged along the channel structure 230.

Figure 3A:
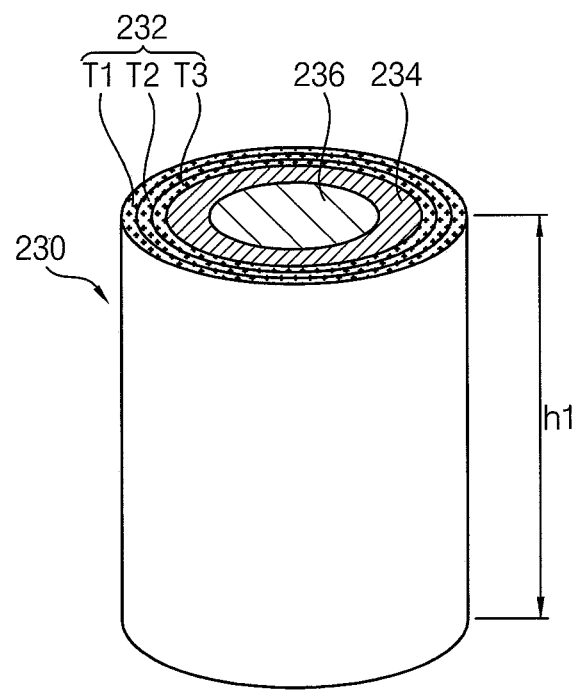
FIG. 3A is a perspective view illustrating the channel structure of the vertical memory device shown in FIGS. 2A and 2B.

FIG. 3A is a perspective view illustrating the channel structure of the vertical memory device shown in FIGS. 2A and 2B.

Referring to FIG. 3A, the channel structure 230 may include a charge trap pattern 232 that is at least partially covering or on an inner surface of a channel hole CH extending through the stack structure SS in the first direction x to expose the substrate 100 in the cell block area C in such a configuration that the charge trap pattern 232 may be alternately enclosed by the electrode patterns 300 and the insulation interlayer patterns 112, a channel 234 shaped into a cylinder extending in the first direction x on a side surface S1 of the charge trap pattern 232 and the channel bottom CB, and a first filling column 236 filling the channel hole CH defined by the channel 234.

The charge trap pattern 232 may include a triple pattern structure in which the tunnel insulation pattern, a charge storage pattern comprising a nitride and the first blocking pattern may be stacked in the third direction z. The channel 234 may comprise one or more semiconductor materials such as polysilicon and/or doped polysilicon. The first filling column 236 may comprise insulation materials such as an oxide.

Some electrons may be selectively trapped in the charge trap pattern 232 in response to a signal that may be applied from the electrode patterns 300. Accordingly, the electrode pattern 300, the charge trap pattern 232 and the channel 234 may be provided as a unit memory cell MC of the flash memory device. A plurality of the memory cells may be arranged at the channel structure 230 along the first direction x.

While an example embodiment discloses that the channel structure 230 may be shaped into a circular cylinder, the shape and configurations of channel structure 230 may be varied according to the channel hole CH along the first direction x. For example, the channel structure 230 may be shaped into a polygonal cylinder such as a rectangular cylinder and/or a pentagonal cylinder.

Since the channel structure 230 may be make contact with the substrate 100 in the channel hole CH, the channel bottom CB may include the substrate 100 or an additional channel pattern 210 making contact with the substrate 100.

For example, the additional channel pattern 210 may include a semiconductor pattern that may be arranged between the channel hole CH and the substrate 100. In such a case, the channel bottom CB may extend to the bottom of the additional channel pattern 210. For example, the additional channel pattern 210 may include a polysilicon pattern interposed between the second insulation interlayer pattern 112b and the first electrode pattern 310a.

While the present example embodiment discloses that the additional channel pattern 210 may extend upwards in the channel hole CH, the additional channel pattern 210 may be arranged at other positions according to the structures of the vertical memory device 500. For example, the additional channel pattern 210 may be positioned at an exterior of the channel hole CH.

For example, when the substrate 100 may include a silicon-on-insulator (SOI) substrate, a semiconductor layer of the SOI substrate may also be formed into the additional channel pattern 210. In such a case, the channel bottom CB may be provided in the channel hole CH.

The dummy channel structure 250 may penetrate through the upper portion U of the stack structure SS in the boundary area BA of the substrate 100 and may contact with the dummy bottom electrode pattern DBE that may be spaced apart from the substrate 100. The dummy channel structure 250 may have a first sectional surface S1 making contact with the block separation structure BSS in the upper portion U of the stack structure SS.

Figure 3B:
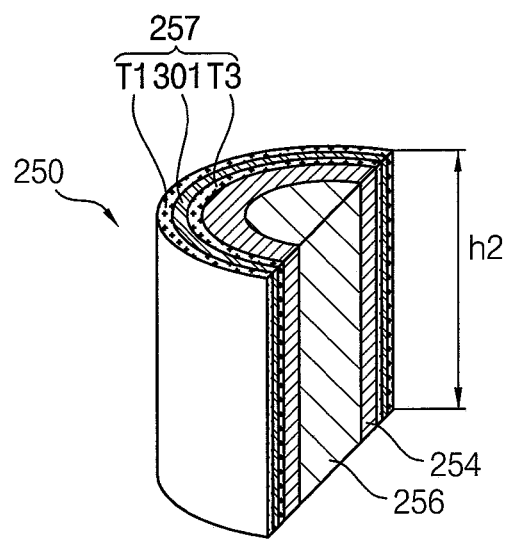
FIG. 3B is a perspective structure illustrating the dummy channel structure of the vertical memory device shown in FIGS. 2A and 2B.

FIG. 3B is a perspective structure illustrating the dummy channel structure of the vertical memory device shown in FIGS. 2A and 2B.

Referring to FIG. 3B, the dummy channel structure 250 may include a dummy trap pattern 257 at least covering a portion of an inner surface or on an inner surface of the dummy hole DH extending through the stack structure SS in the first direction x to expose the dummy bottom electrode pattern DBE in the boundary area BA. The dummy trap pattern 257 may be alternately enclosed by the electrode patterns 300 and the insulation interlayer patterns 112 and may include a first blocking pattern 301, a dummy channel 254 covering or on a side surface of the blocking trap pattern 257 and the dummy bottom electrode pattern DBE and a second filling column 256 filling the dummy hole DH defined by the dummy channel 254.

In some embodiments, the dummy channel structure 250 may have substantially the same structure as the channel structure 230, except that the dummy trap pattern 257 may include a triple pattern structure in which the tunnel insulation pattern T1, the first blocking pattern 301 and the first blocking pattern T3 may be stacked in the third direction z and may comprises an oxide, respectively. That is, the charge storage pattern T2 comprising a nitride of the charge trap pattern 232 in the cell block area C may be replaced with the first blocking pattern 301 comprising an oxide of the dummy trap pattern 257 in the boundary area BA.

Particularly, the dummy channel structure 250 may be positioned only at the upper portion of the stack structure SS and thus may make contact with the block separation structure BSS only at the upper portion of the stack structure SS. That is, the dummy channel structure 250 may not be in contact with the block separation structure BSS at the lower portion L of the stack structure SS.

According to conventional CDH type vertical memory devices, the dummy channel structure extends to the substrate in such a configuration that the cross sectional surface extends to the substrate through a whole stack structure at the boundary area. However, the dummy channel structure of the conventional vertical memory devices is not sufficiently removed from the substrate at the lower portion of the stack structure in a block separation trench process, and thus residuals of the dummy channel structure may remain on the substrate at the boundary area as a residual channel. Thus, the neighboring vertical memory cells are usually connected to each other by the residual channel at a lower portion of the block separation structure at the boundary area. That is, the neighboring vertical gate electrodes of the conventional vertical memory devices may not be sufficiently separated due to the residual channel, to thereby generate a bridge defect around the boundary area of the substrate in a lower portion of the block separation structure BSS.

However, the dummy channel structure 250 may be positioned at the upper portion U of the stack structure SS and spaced apart from the substrate 100, and thus no residual channel may remain on the substrate 100 in the lower portion of the block separation structure BSS at the boundary area BA of the substrate 100. Therefore, the block separation structure BSS may be sufficiently in contact with the electrode patterns 300 and the insulation interlayer patterns 112 in the first direction x at the lower portion of the block separation structure BSS, to thereby substantially prevent or reduce the bridge defect around the substrate at the lower portion of the block separation structure BSS.

The second height h2 may be varied according to a dummy channel stopper 140 in FIG. 8B. The dummy channel stopper 140 may have a relatively large etch-resistance as compared with a sacrificial layer 120 in FIG. 4B. Thus, when some of the sacrificial layers 120 may be replaced with the dummy channel stoppers 140 in the upper portion U of the stack structure SS, the dummy hole DH penetrating through the dummy channel stopper 140 may have the second height h2 smaller than the first height h1 of the channel hole CH due to the etch selectivity of the dummy channel stopper 140 in the hole etching process.

Thus, the dummy channel structure 250 may be positioned on the dummy hole DH with the second height h2 and may be in contact with the dummy bottom electrode pattern DBM that may be spaced apart from the substrate 100 by a dummy gap distance d in the first direction x.

Particularly, the dummy gap distance d may indicate a distance such as a substantially maximal distance by which the electrode patterns 300 and the insulation interlayer patterns 112 may not be etched off at the boundary area BA in the hole etching process for forming the channel hole CH penetrating through the stack structure SS in the cell block area C.

In some embodiments, the dummy gap distance d between the substrate 100 and the dummy bottom DB or the dummy bottom electrode pattern DBE may be determined by following equation (1).

$$d = (0.5 \sim 0.7) * H \quad (1)$$

(where d denotes the dummy gap distance from the substrate 100 and H denotes a height of the stack structure SS on the substrate 100). The range 0.5 to 0.7 may be described as a variable k and may be used to scale the height H of the stack structure SS.

When the dummy gap distance d may be greater than about 0.5 times the height H of the stack structure SS, the dummy channel structure 250 may extend to the lower portion L of the stack structure SS, and thus the dummy channel structure 250 tends to remain on the substrate 100 at the boundary area BA in the hole etching process and the bridge defect may occur at the lower portion of the block separation structure BSS. In contrast, when the dummy gap distance d may be smaller than about 0.3 times the height H of the stack structure SS, it is difficult to obtain such a proper etching selectivity of the dummy channel stopper 140 with respect to the sacrificial layer 120 that the dummy hole DH may have the second height h2 while the channel hole CH may have the first height h1.

Accordingly, the dummy gap distance d between the substrate 100 and the dummy channel structure 250 may be in a range of about 50% to about 70% of the height H of the stack structure SS, according to some embodiments.

Since no residual channel may remain on the substrate 100, the dummy channel structure 250, the electrode patterns 300 and the insulation interlayer patterns 112 may be uniformly contact with the block separation structure BSS in the first direction x. That is, the first sectional surface S1 of the dummy channel structure 250, a second sectional surface S2 of the insulation interlayer patterns 112 and a third sectional surface S3 of the electrode patterns 300 may be positioned at the substantially same level with respect to the third direction z and the first to third sectional surfaces S1, S2 and S3 may make substantially uniform contact with the block separation structure BSS in the third direction z.

The block separation structure BSS may include a line-shaped trench spacer TS covering or overlapping the first to third sectional surfaces S1, S2 and S3 and extending in the first direction x, an impurity layer 110 doped with impurities at surface portions of the substrate 100 that may be exposed between a pair of facing trench spacers TS and a conductive block separation line 350 filling up the block separation trench defined by the pair of facing trench spacers TS and in contact with the impurity layer 110.

The trench spacer TS may comprise a silicon nitride and the block separation line 350 may comprise one or more of a low resistive metal, a metal nitride of the low resistive metal, a metal oxide of the low resistive metal and/or a silicide of the low resistive metal.

Thus, the stack structure SS including a plurality of the memory cells MC may be separated from each other by the block separation structure BSS in the third direction z and each separated stack structure SS may function as the memory block B.

A plurality of upper insulation patterns 160, 260, 360 and 460 may be arranged on the memory blocks B and the block separation structures BSS in such a configuration that a top surface of the upper insulation interlayer pattern 460 may be planarized. A capping pattern 240 may be arranged on the channel structure 230 and a boundary pattern 240a may be arranged on the dummy channel structure 250 and a contact plug 410 may be contact with the capping pattern 240 though the upper insulation patterns 260 and 360. Then, a wiring 490 such as a bit line may be arranged on the upper insulation interlayer pattern 460 and may be contact with the contact plug 410.

According to example embodiments of the vertical memory devices 500, a plurality of the dummy channel structures 250 may be positioned through the upper portion U of the stack structure SS in the boundary area BA of the substrate 100 and a plurality of the channel structures 230 may be positioned through the whole stack structure SS in the cell block area C of the substrate 100. Particularly, in some embodiments, no residual channels may remain on the substrate 100 in the lower portion of the block separation structure BSS, so that the bridge defect due to the residual channels may be substantially prevented or reduced in the vertical memory devices 500.

Hereinafter, the processing steps for a method of manufacturing the vertical memory devices 500 shown in FIGS. 1 to 3B will be described in detail with references to FIGS. 4A to 19B.

FIGS. 4A to 19B are cross-sectional views illustrating processing steps for a method of manufacturing the vertical memory devices shown in FIGS. 1 to 3B in accordance with some example embodiments of the present inventive concept. In FIGS. 4A to 19B, the letter 'A', 'B' and 'C' in figure numbers denote a plan view illustrating the processing steps for a method of manufacturing the vertical memory devices, a cross sectional view of the plan view denoted by letter 'A' cut along a line I-I' of FIG. 1 and an enlarged plan view of a portion A in the cross sectional view denoted by letter 'B', respectively.

Figure 4B:
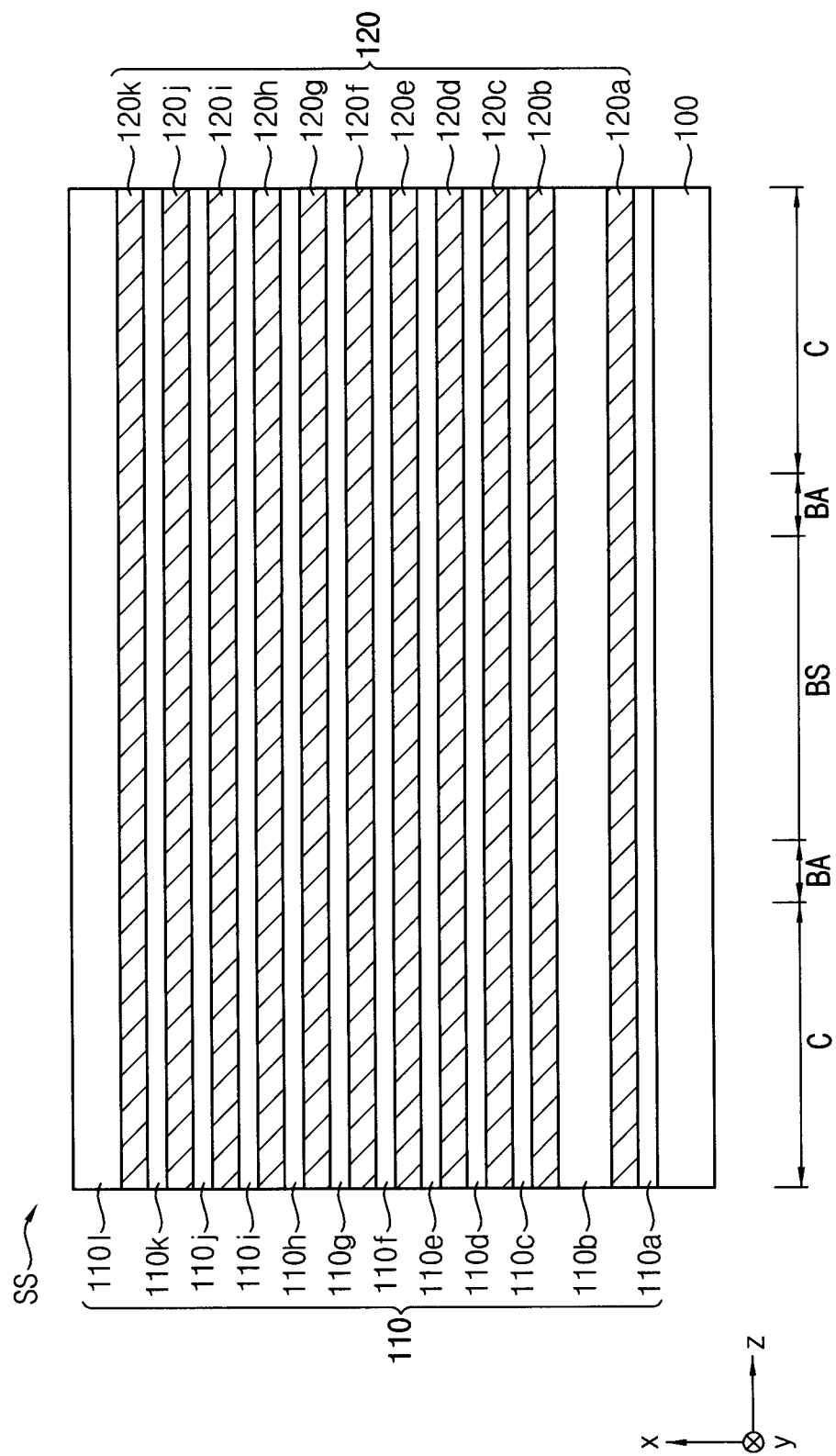

Referring to FIGS. 4A and 4B, insulation interlayers 110a to 110l and sacrificial layers 120a to 120k may be alternately stacked on the substrate 100, to thereby form the stack structure SS on the substrate 100.

For example, a first insulation interlayer 110a may be formed on the substrate 100 and then first to eleventh sacrificial layers 120a to 120k may be formed on the first insulation interlayer 110a alternately with second to twelfth insulation interlayers 110b to 110l in the first direction x.

Thus, a plurality of the sacrificial layers 120a to 120k may be individually stacked on the substrate 100 and may be insulated from each other by the corresponding insulation interlayers 110a to 110l. The uppermost sacrificial layer 120k may be covered or overlapped by the uppermost insulation interlayer 110l. The uppermost insulation interlayer 110l may be replaced by a mask layer.

The number of the sacrificial layers and the insulation interlayers may be varied according to the storage capacity of the vertical memory devices 500.

Hereinafter, just like the insulation interlayer patterns 112, overall insulation interlayer layers may be denoted as reference number 110 and an individual insulation interlayer layer may be denoted as one of reference numbers 110a to 110l. In the same way, overall sacrificial layers may be denoted as reference number 120 and an individual sacrificial layer may be denoted as one of reference numbers 120a to 120k.

The substrate 100 may include the cell block area C, the block separation area BS and the boundary area BA between the cell block area C and the block separation area BS. A plurality of the memory cells MC may be formed in the stack structure SS that may be arranged on the cell block area C of the substrate 100 and a plurality of the dummy channel structures in dummy holes DH may be arranged in the stack structure S that may be arranged on the boundary area BA of the substrate 100.

For example, the insulation interlayers 110 and the sacrificial layers 120 may be formed on the substrate 100 by a deposition process such as a chemical vapor deposition (CVD) process and/or an atomic layer deposition (ALD) process. Particularly, the first insulation interlayer 110a may be formed on the substrate 100 by a thermal oxidation process instead of the deposition process.

The insulation interlayers 110 may comprise an oxide such as a PE-TEOS and a HDP oxide and silicon oxide such as PEOX and the sacrificial layer 120 may have a material having an etch selectivity with respect to the insulation interlayers 110 such as silicon nitride.

Particularly, the respective thickness of each insulation interlayer 110 may be varied according to the requirements and process conditions of the vertical memory devices 500.

Figure 5B:
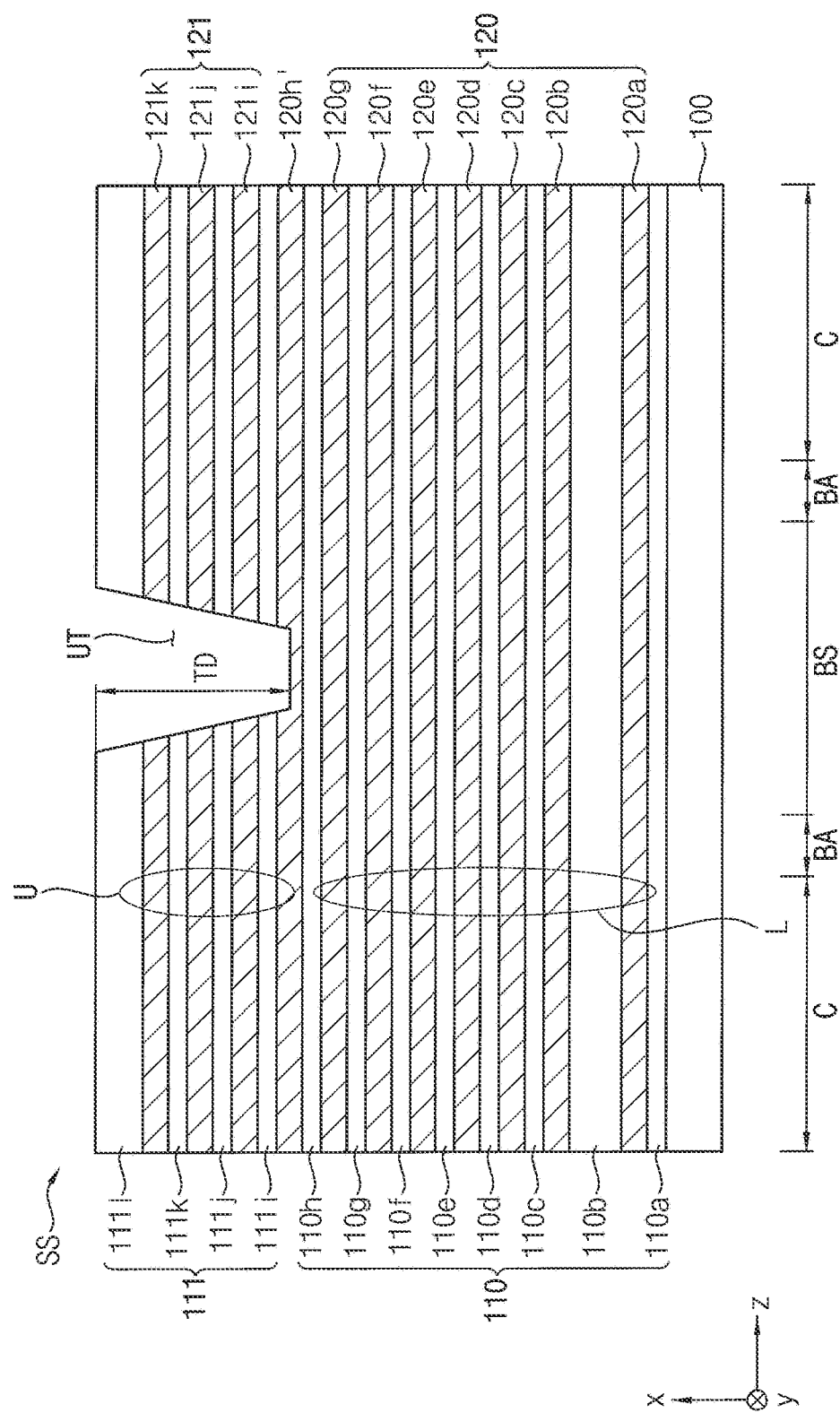

Referring to FIGS. 5A and 5B, the insulation interlayer 110 and the sacrificial layer 120 may be removed from the upper portion U of the stack structure SS at the block separation area BS of the substrate 100, to thereby form an upper trench UT through which an etch stop sacrificial layer 120h' may be exposed and extending in the second direction y.

For example, a first mask pattern M1 may be formed on the stack structure SS and a dry etching process may be applied to the stack structure SS to a trench depth TD, until the sacrificial layer 120 and the insulation interlayer 110 may be sequentially removed downwards. Thus, the upper trench UT may be formed at the upper portion U of the stack structure SS in a line shape extending in the second direction y and a central portion of the block separation area BS may be exposed in the upper trench UT. For example, the etching process may include a plasma etching process.

Particularly, the etching process may be stopped at the sacrificial layer 120 in such a way that the sacrificial layer 120 may function as an etching stopper. Thus, the specific sacrificial layer 120 may be provided as the bottom of the upper trench UT. Accordingly, the upper trench UT may have the bottom including the sacrificial layer 120 and a sidewall alternately enclosed by the insulation interlayers 110 and the sacrificial layer 120.

The trench depth TD of the upper trench UT may be determined by the position of the etch stop sacrificial layer 120h' and the trench depth TD of the upper trench UT may determine the second height h2 of the dummy hole DH. Thus, the position of the etch stop sacrificial layer 120h' may be selected in view of the second height h2 of the dummy hole DH. In some embodiments, the $8^{th}$ sacrificial layer 120h may be selected as the etch stop sacrificial layer 120h'.

Accordingly, the insulation interlayer 110 may be formed into a preliminary insulation interlayer patterns 111 and the sacrificial layer 120 may be formed into a preliminary sacrificial patterns 121 in the upper portion U of the stack structure SS. The preliminary insulation interlayer patterns 111 may include a preliminary $12^{th}$ insulation interlayer pattern 111l, a preliminary $12^{th}$ insulation interlayer pattern 111l a preliminary $12^{th}$ insulation interlayer pattern 111l, a preliminary $11^{th}$ insulation interlayer pattern 111k, a preliminary $10^{th}$ insulation interlayer pattern 111j and a preliminary $9^{th}$ insulation interlayer pattern 111i. The preliminary sacrificial patterns 121 may include a preliminary $11^{th}$ sacrificial pattern 121k, a preliminary $10^{th}$ sacrificial pattern 121j and a preliminary $9^{th}$ sacrificial pattern 121i.

Particularly, the $8^{th}$ sacrificial layer 120h may function as an etch stopper for the dry etching process for forming the upper trench UT, so the $8^{th}$ sacrificial layer 120h may be recessed and provided as the bottom of the upper trench UT. Thus, the $8^{th}$ sacrificial layer 120h may not be formed into the $8^{th}$ sacrificial pattern but be formed into the etch stop sacrificial layer 120h'.

While the present example embodiment discloses that the $8^{th}$ sacrificial layer 128h may be provided as the etch stop sacrificial pattern 128h', any other sacrificial layer 120 higher or lower than the $8^{th}$ sacrificial layer may also be used as the etch stop sacrificial layer for the etching process for forming the upper trench UT.

Therefore, the upper trench UT defined by the preliminary insulation interlayer patterns 111, the preliminary sacrificial pattern 121 and the etch stop sacrificial layer 128h' may be formed at the upper portion U of the stack structure SS in the block separation area BS.

Referring to FIGS. 6A and 6B, the preliminary $11^{th}$ sacrificial pattern 121k, the preliminary $10^{th}$ sacrificial pattern 121j, the preliminary $9^{th}$ sacrificial pattern 121i and the etch stop sacrificial layer 120h' may be partially removed from the stack structure SS in parallel with a surface of the substrate 100, thereby forming a plurality of horizontal recesses HR between the neighboring preliminary insulation interlayer patterns 111 and between the $8^{th}$ insulation interlayer 110h and the preliminary $9^{th}$ insulation interlayer pattern 111i. The horizontal recess HR may be adjacent with or may be joined to the upper trench UT and may extend in the second direction y and the third direction z. Particularly, the etch stop sacrificial layer 128h' may also be removed from the stack structure SS and the $8^{th}$ sacrificial layer 128h may also be formed into a preliminary $8^{th}$ sacrificial pattern 121h. The preliminary sacrificial pattern 121 may also include the preliminary $8^{th}$ sacrificial pattern 121h.

For example, a wet etching process may be performed on the preliminary sacrificial pattern 121 and the etch stop sacrificial layer 120h' by using an aqueous phosphate solution or an aqueous sulfuric solution as an etchant having a high etch selectivity with respect to the preliminary insulation interlayer patterns 111. In some embodiments, the wet etching process may be performed as an etch-back process from the boundary surface of the preliminary sacrificial pattern 121 with the upper trench UT.

For example, the horizontal recess HR may horizontally extend to the boundary area BA from the central portion of the block separation area BA in such way that the horizontal recess HR may cross to the cell block area C around the boundary area BA.

Figure 7B:
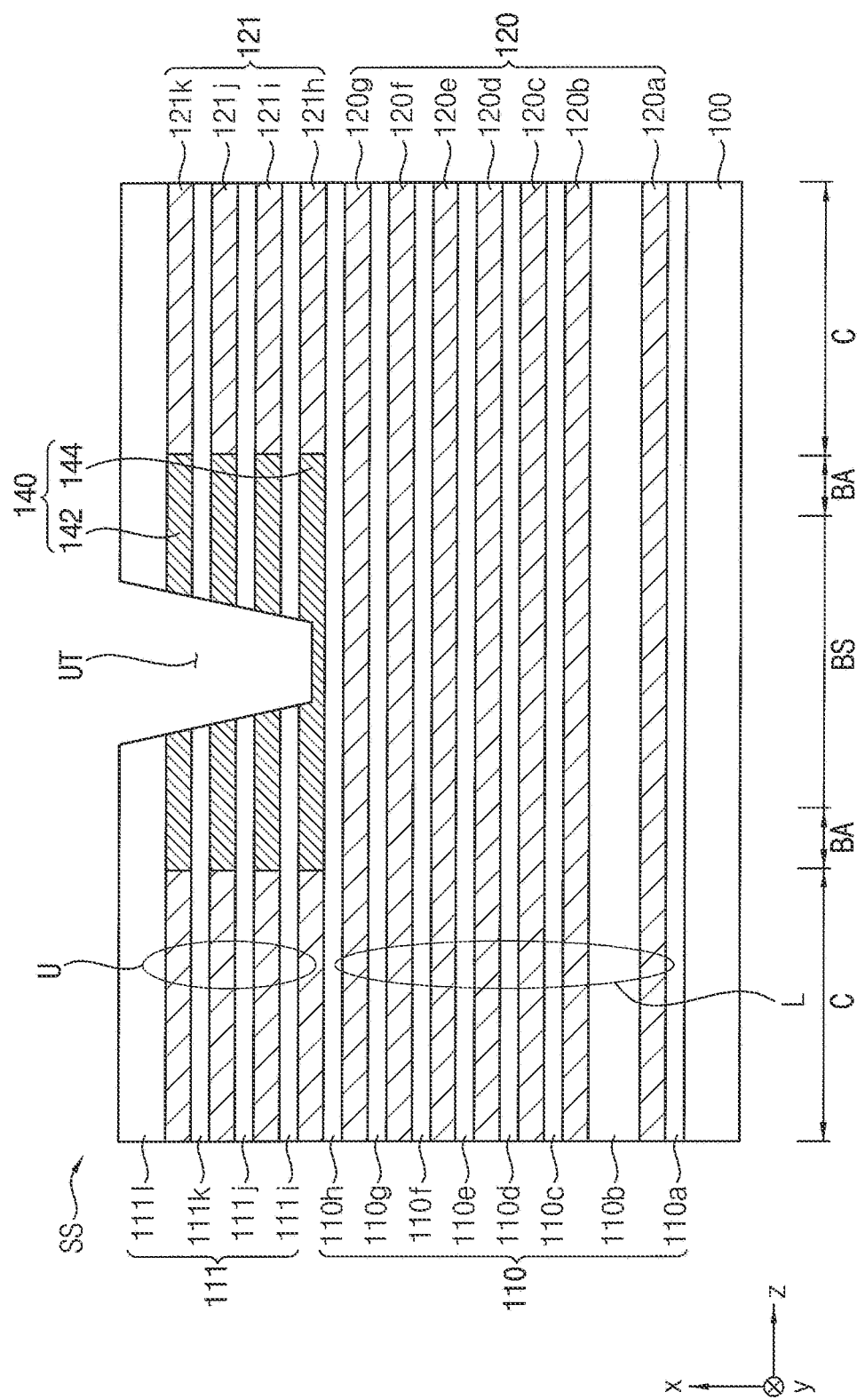

Referring to FIGS. 7A and 7B, a dummy channel stopper 140 may be formed in the horizontal recesses HR in such a configuration that the dummy channel stopper 140 may extend to the boundary area BA and be exposed to the upper trench UT. The preliminary insulation interlayer patterns 111 may comprise a stopper material having an etch selectivity with respect to the dummy channel stopper 140.

For example, the horizontal recesses HR may be at least partially filled with the stopper materials via the upper trench UT by a high gap-fill deposition process in such a way that the surfaces of the upper trench UT may be covered with or overlapped by the stopper materials. In some embodiments, the high gap-fill deposition process may include a high density plasma (HDP) deposition process and an atomic layer deposition (ALD) process.

For example, the stopper material for the dummy channel stopper 140 may include polysilicon that may be more etched than the oxide of the preliminary insulation interlayer patterns 111. However, any other stopper materials may be used for the dummy channel stopper 140 as long as the stopper materials may be sufficiently well etched as compared with the oxide of the preliminary insulation interlayer patterns 111.

Particularly, the stopper materials filling in the horizontal recess HR defined by the $8^{th}$ preliminary sacrificial pattern 121h may be formed into a single bottom pattern 144 of the upper trench UT and the stopper materials filling in the horizontal recess HR defined by the $9^{th}$ preliminary sacrificial pattern 121i, the $10^{th}$ preliminary sacrificial pattern 121j and the $11^{th}$ preliminary sacrificial pattern 121k may be formed into a plurality of side patterns 142 of the upper trench UT. The dummy channel stopper 140 may include the bottom pattern 144 and a plurality of side patterns 142.

Thus, the upper trench UT may be enclosed by the bottom pattern 144 and a plurality of the side patterns 142 that may be stacked in the first direction x alternately with the preliminary insulation interlayer patterns 111.

Accordingly, the dummy channel stopper 140 may extend to the boundary area BA from the block separation area BC at the upper portion U of the stack structure SS and may contact with the preliminary sacrificial pattern 121. The preliminary insulation interlayer pattern 111 may have an etch selectivity with respect to the dummy channel stopper 140.

Referring to FIGS. 8A and 8B, a filling body 150 may be formed in the upper trench UT enclosed by the dummy channel stopper 140.

For example, a filling layer (not shown) may be formed on the preliminary $12^{th}$ insulation interlayer pattern 111l until the upper trench UT may be sufficiently filled with the filling layer.

Then, the filling layer may be partially removed by a planarization process until an upper surface of the preliminary $12^{th}$ insulation interlayer pattern 111l may be exposed, thereby forming the filling body 150 in the upper trench UT. The planarization process may include a chemical mechanical polish (CMP) process and/or an etch-back process.

Figure 9A:
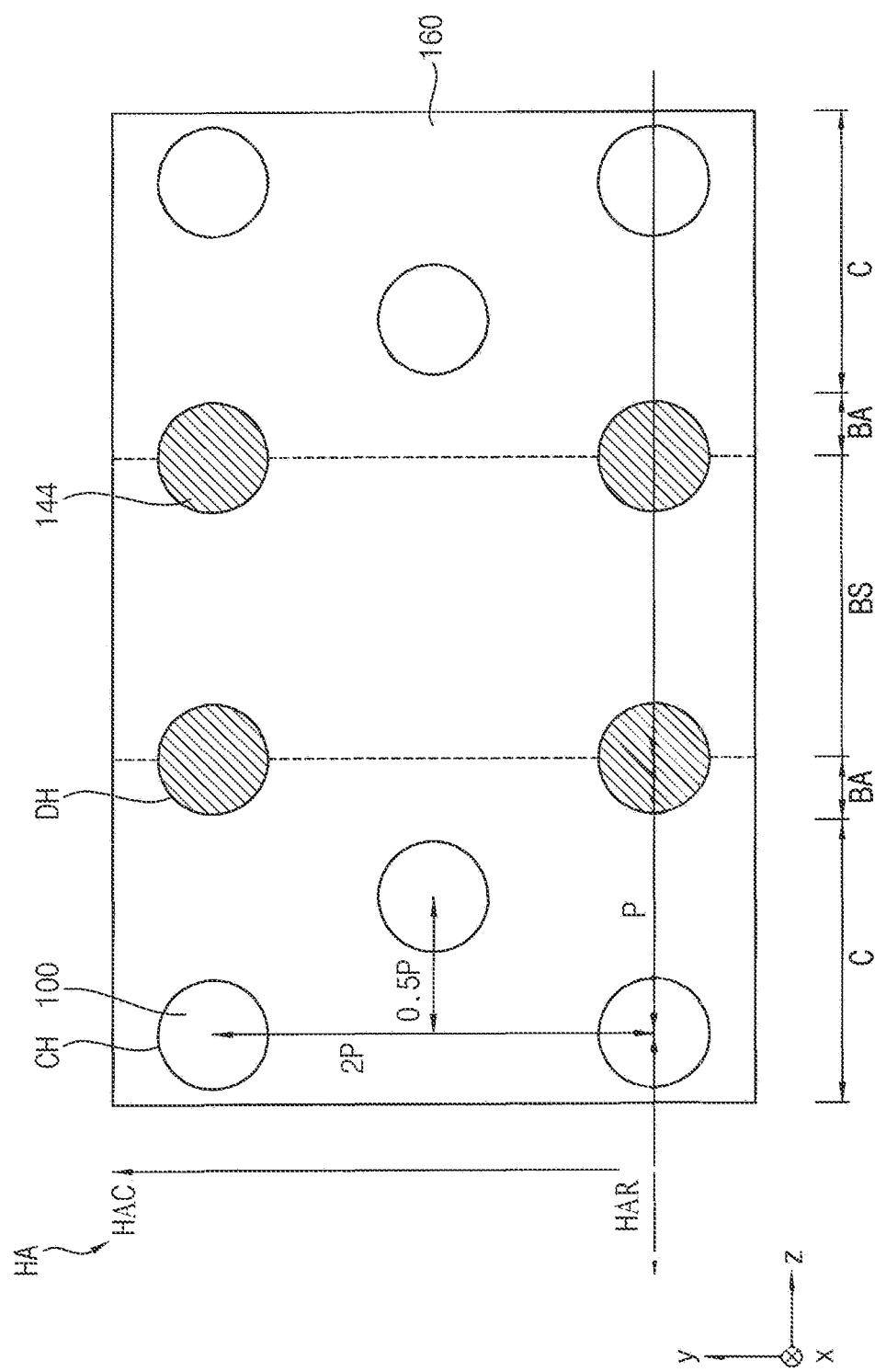
Figure 9B:
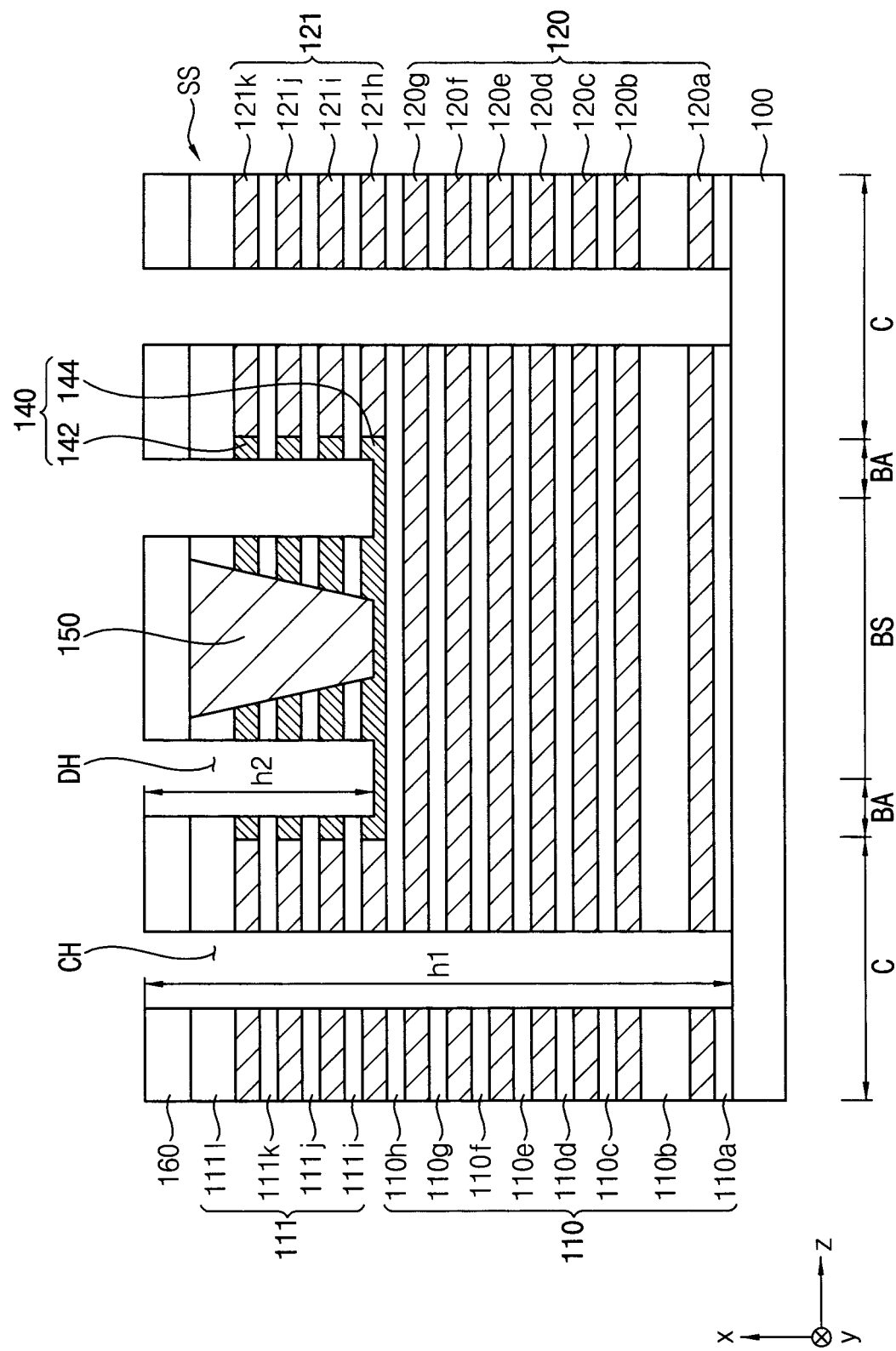

Referring to FIGS. 9A and 9B, a single hole etching process may be conducted to the stack structure SS having the dummy channel stopper 140 and the filling body 150, to thereby form a plurality of channel holes CH in the cell block area C and a plurality of dummy holes DH across the boundary area BA and the block separation area BS. The channel hole CH may extend to the substrate 100 through the whole stack structure SS, while the dummy hole DH may extend to the bottom pattern 144 through the upper portion U of the stack structure SS. The channel hole CH and the dummy hole DH may be formed in the stack structure SS in a CDH process by the same etching process.

A first upper insulation pattern 160 may be formed on the preliminary $12^{th}$ insulation interlayer pattern 111l and on the filling body 150 in such a configuration that the preliminary $12^{th}$ insulation interlayer pattern 111l may be partially exposed through the first upper insulation pattern 160 in the cell block area C and across the boundary area BA and the block separation area BS. The first upper insulation pattern 160 may include a layout of a single hole array HA of the channel hole CH and the dummy hole DH. Then, the hole etching process may be conducted to the stack structure SS by using the first upper insulation pattern 160 as an etching mask.

The hole etching process may be performed on the whole stack structure SS regardless of the cell block area C, the boundary area BA and the block separation area BS, so that the channel holes CH and the dummy holes DH may be formed under the single hole array. Thus, channel holes CH may be formed in the stack structure SS at the cell block area C and the dummy hole DH may be formed in the upper portion U of the stack structure SS across the boundary area BA and the block separation area BS.

The preliminary insulation interlayer patterns 111, the preliminary sacrificial patterns 121 at the upper portion U of the stack structure SS and the insulation interlayer patterns 110 and the sacrificial layers 120 at the lower portion L of the stack structure SS may be partially removed from the substrate 100 by the hole etching process, thereby forming the channel hole CH having the first height h1. Thus, the channel hole CH may be enclosed by the stack structure SS in the cell block area C and the substrate 100 may be exposed through the channel hole CH.

The preliminary insulation interlayer patterns 111 and the dummy channel stopper 140 may be partially removed from the upper portion U of the stack structure SS by the hole etching process in the boundary area BA and the block separation area BS, thereby forming the dummy hole DH having the second height h2. The dummy hole DH may be enclosed by the preliminary insulation interlayer patterns 112 alternately with the side patterns 142 and the bottom pattern 144 may be exposed through the dummy hole DH.

Particularly, when the channel hole CH may have the first height h1 in the cell block area C by the hole etching process, the dummy channel DH may have the second height h2 in the boundary area BA and the block separation area BS by the hole etching process due to the high etch resistance of the dummy channel stopper 140. That is, when the hole etching process may be conducted until the substrate 100 may be exposed in the cell block area C, the hole etching process may be conducted until the bottom pattern 144 may be exposed in the boundary area BA and the block separation area BS due to the high etch resistance of the dummy channel stopper 140. Therefore, an etching recess may be formed on the bottom pattern 144 by the hole etching process.

The second height h2 of the dummy hole DH may be varied according to the etch selectivity of the dummy channel stopper 140 with respect to the sacrificial layer 120 and an aspect ratio of the channel hole CH.

The dummy holes DH may be formed into the continuous dummy holes (CDH) that may be formed continuously with the channel holes CH under the same hole arrangement rule across the cell block area C, the boundary area BA and the block separation area BS.

The channel holes CH and the dummy holes DH may be arranged on the stack structure SS in a zigzag-arranged matrix in which a plurality of the hole array rows HAR having the hole pitch may be arranged in the second direction y and the hole array rows HAR may be alternately shifted as long as the half hole pitch in the third direction z. Accordingly, the neighboring channel holes CH may be spaced apart by the double hole pitch in the second direction y and thus the hole array column HAC may have the double hole pitch.

Figure 10A:
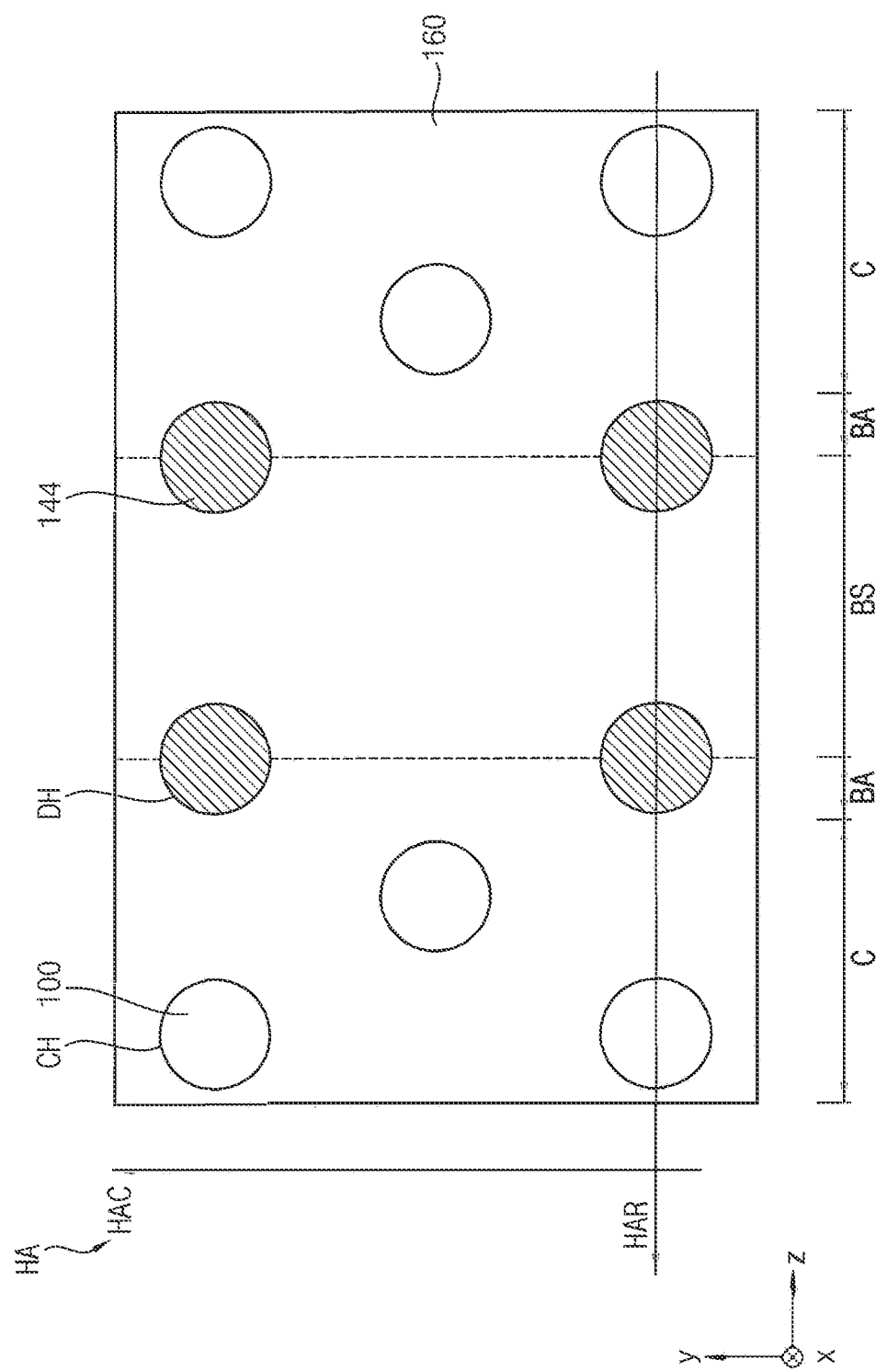
Figure 10B:
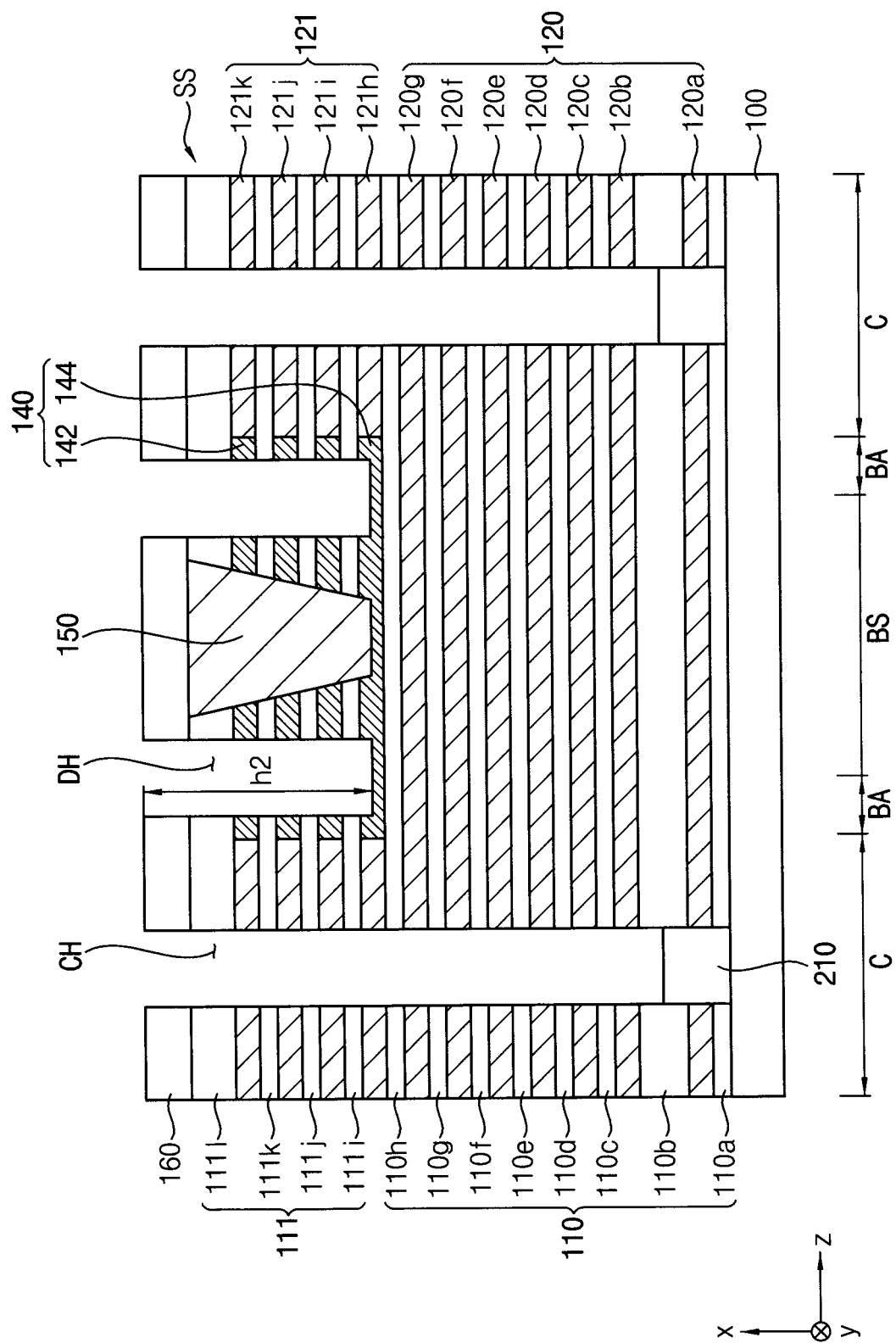

Referring to FIGS. 10A to 10B, the additional channel pattern 210 may be formed on the substrate 100 that may be exposed through the channel hole CH. The additional channel pattern 210 may expand a channel area between the channel 230 and the substrate 100.

For example, an amorphous silicon layer may be formed on the exposed substrate 100 in the channel hole CH and then a laser epitaxial growth (LEG) process or a solid phase epitaxial (SPE) process may be conducted to the amorphous silicon layer. Thus, a semiconductor pattern may be formed on the substrate 100 as the additional channel pattern 210 in the channel hole CH.

In contrast, a selective epitaxial growth (SEG) process may be performed on the substrate 100 by using an upper surface of the substrate 100 as a seed layer to thereby form the semiconductor pattern as the additional channel pattern 210. In such a case, a blocking layer (not shown) may be formed on the bottom pattern 144, so the growth of the semiconductor pattern from the bottom pattern 144 may be sufficiently prevented in the SEG process.

In some embodiments, the additional channel pattern 210 may be formed in such a way that a top surface of the additional channel pattern 210 may be positioned between the second insulation interlayer pattern 110b and the first sacrificial pattern 122a.

However, the additional channel pattern 210 may be arranged in the substrate 100 and the additional channel pattern 210 may be exposed through the channel hole CH according to the requirements of the vertical memory devices.

For example, a silicon-on-insulator (SOI) substrate may be provided as the substrate 100 and the channel hole CH may be formed in such a way that an upper semiconductor layer of the SOI substrate may be exposed through the channel hole CH. In such a case, the channel 230 may be extended into the substrate 100 and no additional channel pattern may be provided on the channel bottom CB.

Figure 11A:
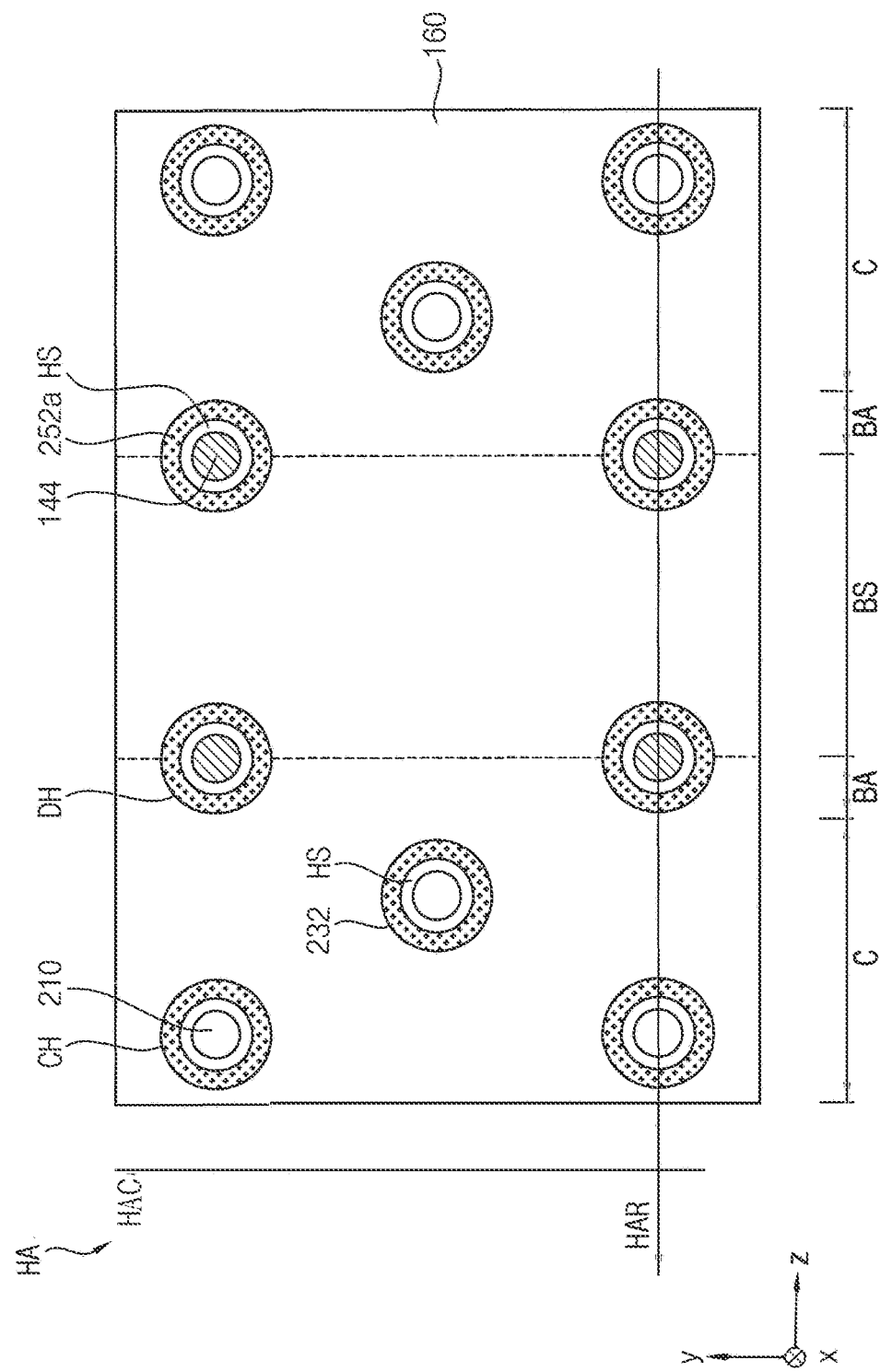
Figure 11B:
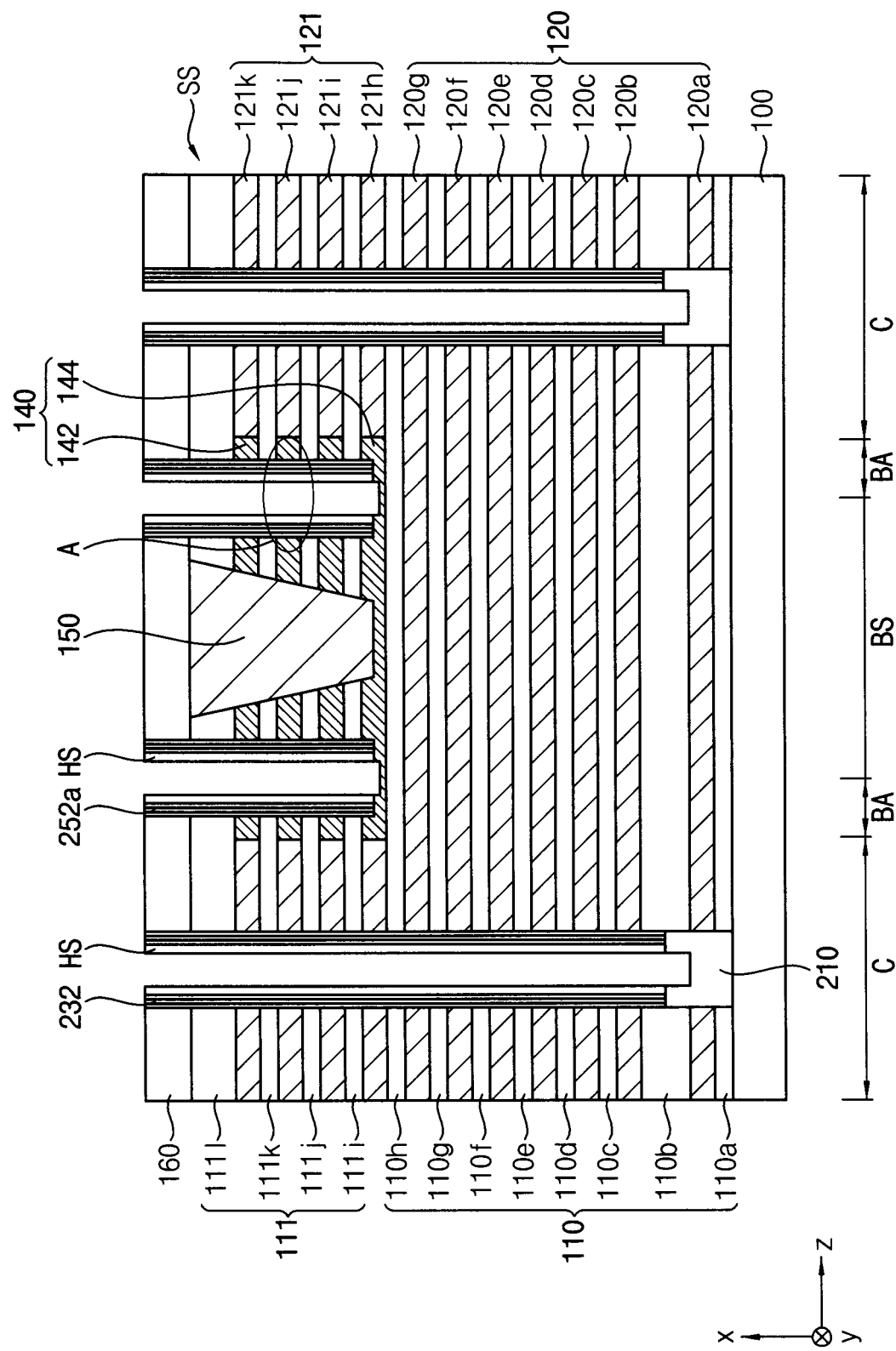
Figure 11C:
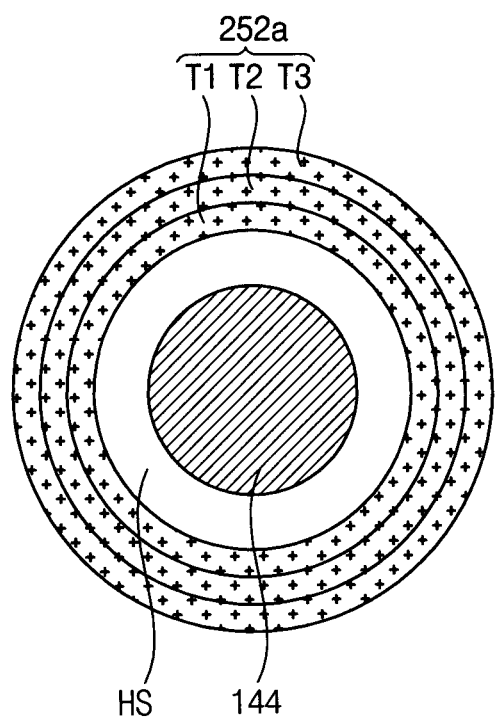

Referring to FIGS. 11A to 11C, the charge trap pattern 232 and a preliminary dummy trap pattern 252a may be formed on sidewalls and/or bottoms of the channel hole CH and the dummy hole DH, respectively.

For example, a trap layer (not shown) and a hole spacer layer (not shown) may be sequentially formed on the first upper insulation pattern 160 along a surface profile of the channel hole CH and the dummy hole DH. Thus, the trap layer and the hole spacer layer may be stacked on the sidewall and the bottom of the channel hole CH and the dummy hole DH, respectively. Then, the hole spacer layer may be partially removed from the stack structure SS by an anisotropic etching process in such a way that the hole spacer layer may remain only on the sidewalls of the channel hole CH and the dummy hole DH as a hole spacer HS.

Then, a consecutive etching process may be conducted to the trap layer by using the hole spacer HS as an etching mask, so that the trap layer may be removed from the first upper insulation pattern 160, the additional channel pattern 210 and the bottom pattern 144. Thus, the trap layer may remain on the sidewalls of the channel holes CH and the dummy holes DH, to thereby form the charge trap pattern 232 covered by the hole spacer HS in the channel hole CH and the preliminary dummy trap pattern 252a covered by the hole spacer HS in the dummy hole DH.

In the consecutive etching process forming the charge trap pattern 232 and the preliminary dummy trap pattern 252a, the additional channel pattern 210 and the bottom pattern 144 may be further etched off at the channel bottom CB and the dummy bottom DB, respectively. Thus, a plurality of channel bottom recesses CBR may be formed on the additional channel pattern 210 and a plurality of dummy bottom recesses DBR may be formed on the bottom pattern 144. Since the bottom pattern 144 may have the etch resistance greater than that of the additional channel pattern 210 comprising semiconductor materials, the size of the channel bottom recess CBR may formed to be larger than that of the dummy bottom recess DBR.

The charge trap pattern 232 may have substantially the same configurations and compositions as the preliminary dummy trap pattern 252a. Thus, both of the charge trap pattern 232 and the preliminary dummy trap pattern 252a may include a tunnel insulation pattern T1 comprising an oxide and in contact with the hole spacer HS, a charge trap pattern T2 comprising a nitride and in contact with the tunnel insulation pattern T1, and a first blocking pattern T3 comprising an oxide and in contact with the charge trap pattern T2.

Figure 12A:
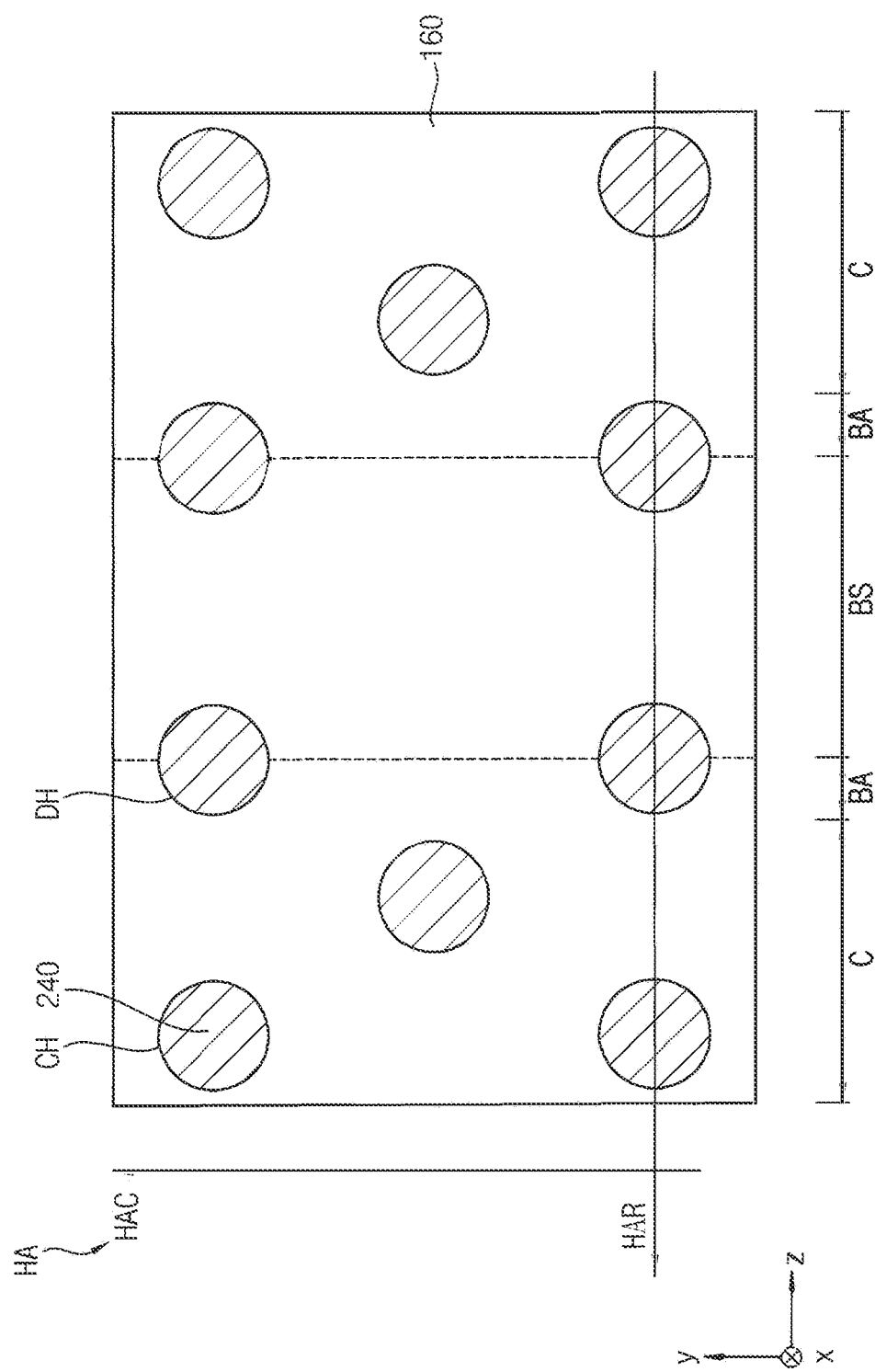
Figure 12B:
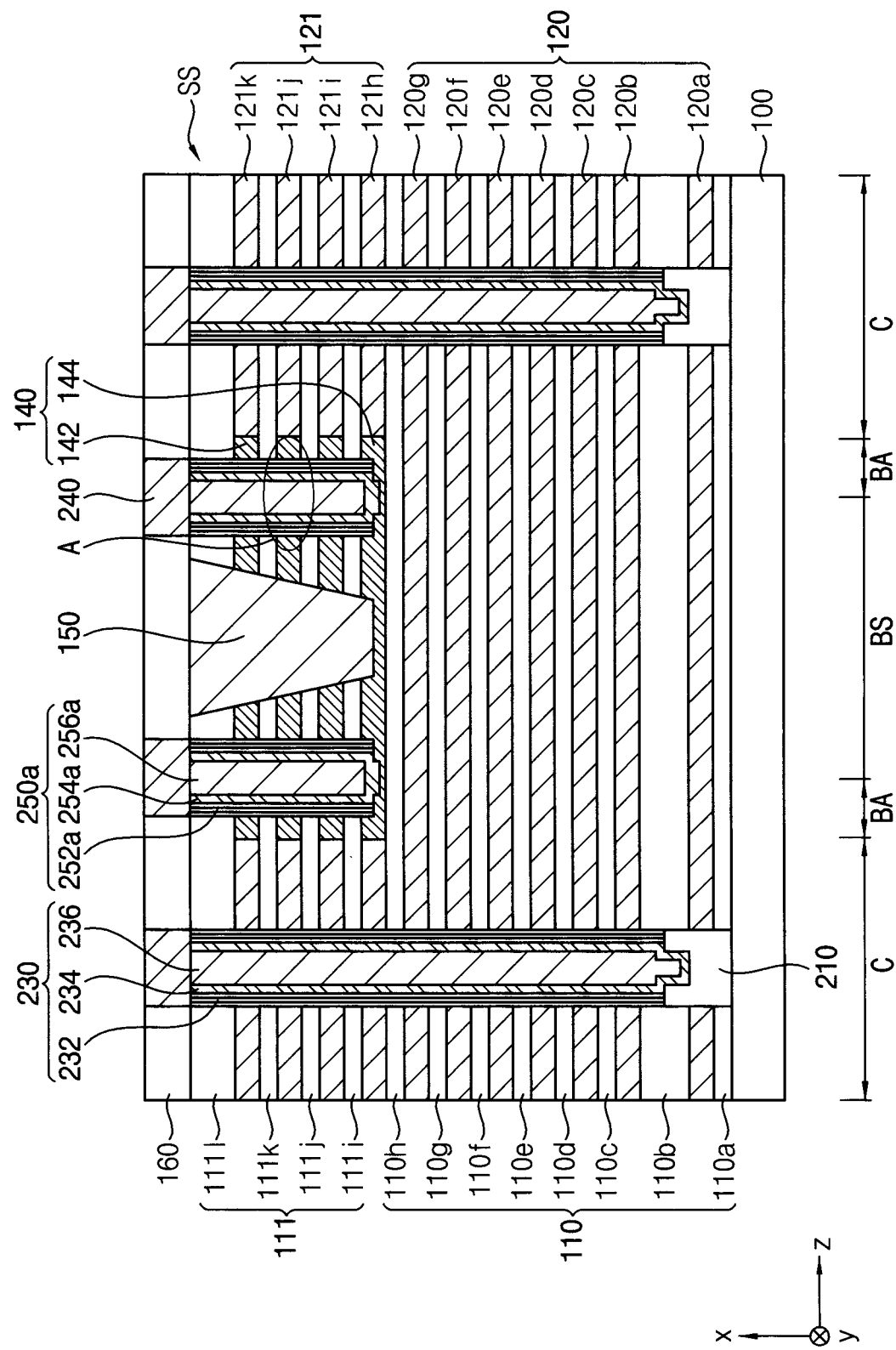
Figure 12C:
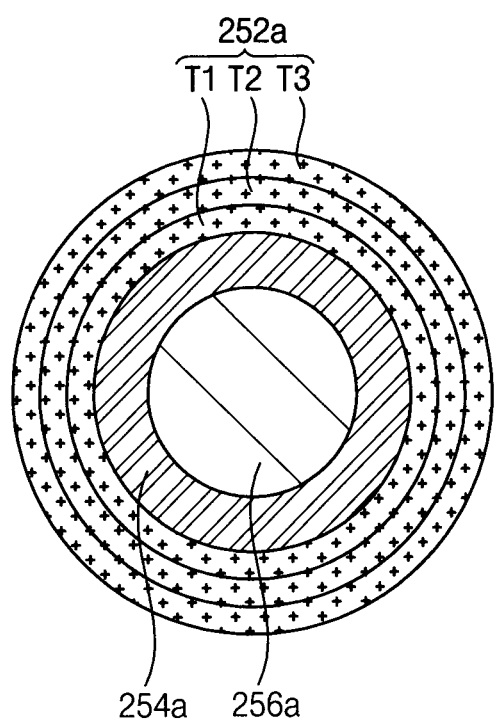

Referring to FIGS. 12A to 12C, the channel 234 and the first filling column 236 may be formed in the channel hole CH and a preliminary dummy channel 254a and a preliminary filling column 256a may be formed in the dummy hole DH simultaneously with the channel 234 and the first filling column 236.

The hole spacer HS may be removed from the charge trap pattern 232 and the preliminary dummy trap pattern 252a. Then, a channel layer (not shown) may be formed on the first upper insulation pattern 160 according to the surface profile of the channel hole CH and the dummy hole DH. Thereafter, a hole filling layer (not shown) may be formed on the channel layer may be formed to a sufficient thickness to at least partially fill the channel hole CH and the dummy hole DH defined by the channel layer.

Then, the hole filling layer and the channel layer may be sequentially removed by a planarization process until the upper surface of the first upper insulation pattern 160 may be exposed, so that the hole filling layer and the channel layer may be formed into the channel 234 making contact with the charge trap pattern 232 and the first filling column 236 making contact with the channel 234 and filling the channel hole CH and into the preliminary dummy channel 254a making contact with the preliminary dummy trap pattern 252a and the preliminary filling column 256a making contact with the preliminary dummy channel 254a and filling the dummy hole DH.

For example, the channel 234 and the preliminary dummy channel 254a may comprise polysilicon doped or non-doped impurities or amorphous silicon. The first filling column 236 and the preliminary filling column 256a may comprise an oxide such as silicon oxide.

Accordingly, the channel hole CH may be filled with the channel structure 230 having the charge trap pattern 232, the channel 234 and the first filling column 236 and the dummy hole DH may be filled with a preliminary dummy channel structure 250a having the preliminary dummy trap pattern 252a, the preliminary dummy channel 254a and/or the preliminary filling column 256a.

Thereafter, an additional etching process or an etch-back process may be further conducted to the channel structures 230 and the preliminary dummy channel structures 250a, so that upper portions of the channel structures 230 may be removed from the channel hole CH and upper portions of the dummy channel structures 250a may be removed from the dummy hole DH. That is, the channel structure 230 and the dummy channel structure 250a may be retreated from a top portion of the channel hole CH and the dummy hole DH, respectively by the additional etching process or the etch-back process.

Then, the capping pattern 240 may be formed on each of the channel structures 230 and the dummy channel structures 250a in such a way that the channel structures 230 and the dummy channel structures 250a may be separated from surroundings.

For example, the capping pattern 240 may comprise polysilicon doped or non-doped with impurities or single crystalline silicon and may function as a contact pad for the channel structure 230.

Figure 13C:
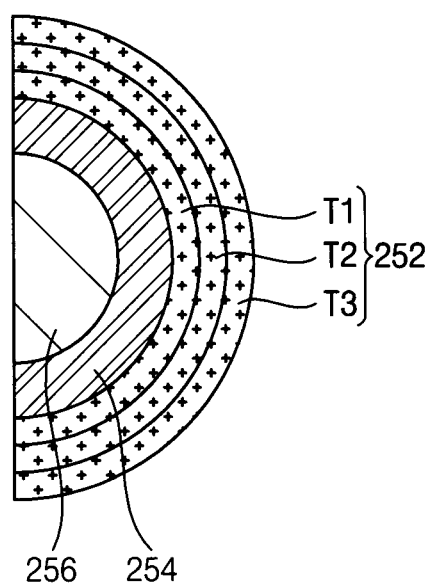

Referring to FIGS. 13A to 13B, the stack structure SS and the preliminary dummy channel structure 250a, the dummy channel stopper 144 and the filling body 150 may be removed from the substrate 100 in the block separation area BS, thereby forming a block separation trench ST shaped into a line extending in the second direction y and exposing the substrate 100.

For example, the capping pattern 240, the dummy channel stopper 140, the filling body 150 and the preliminary insulation interlayer patterns 111 may be removed from the substrate 100 at the upper portion U of the stack structure SS by a first trench etching process, there by forming a first separation trench ST1 that may extend in the second direction y at the upper portion of the separation trench ST. Then, the insulation interlayer patterns 110 and the sacrificial patterns 120 may be continuously removed from the substrate 100 at the lower portion of the stack structure SS by a second trench etching process, thereby forming a second separation trench ST2 that may extend in the second direction y at the lower portion of the separation trench ST.

For example, a plasma etching process may be performed under first etching conditions as the first trench etching process and then may be performed under a second etching process as the second trench etching process. The plasmas etching process may be utilized for removing both of the polysilicon and oxide.

The preliminary dummy channel structure 250a may be cut off in the first trench etching process, to thereby form the dummy channel structure 250 having the dummy trap pattern 252, the dummy channel 254 and the second filling column 256. Particularly, the dummy channel structure 250 may include a first cross sectional surface S1 that is exposed to the first separation trench ST1 and functions as a sidewall of the first separation trench ST1.

In addition, the preliminary insulation interlayer patterns 111 and the preliminary sacrificial patterns 121 may be formed into the insulation interlayer patterns 112 and the sacrificial patterns 122 at the upper portion of the stack structure SS. The dummy channel stopper 140 may also be partially removed by the first trench etching process at the upper portion U of the stack structure SS, to thereby form a residual stopper 140a including a residual bottom pattern 144a and a plurality of residual side patterns 142a.

The insulation interlayers 110 and the sacrificial layers 120 may also be formed into the insulation interlayer patterns 112 and sacrificial patterns 122 at the lower portion L of the stack structure SS. Accordingly, the insulation interlayers 110 and the sacrificial layers 120 may be formed into the insulation interlayer patterns 112 and sacrificial patterns 122 at the cell block area C and the boundary area BA in the whole stack structure SS.

Particularly, the insulation interlayer patterns 112 and sacrificial patterns 122 may have a second cross sectional surface S2 that may be exposed to the separation trench ST and may function as a sidewall of the separation trench ST. Since the preliminary dummy channel structure 250a and the dummy channel stopper 140 having a relatively high etch resistance may be positioned only at the upper portion U of the stack structure SS, the second trench etching process may be uniformly conducted to the insulation interlayers 110 and the sacrificial layers 120 with a relatively low aspect ratio at the lower portion L of the stack structure SS. Accordingly, the second cross sectional surface S2 may be sufficiently uniform in the first direction x without any residuals around the substrate 100.

Further, since the second trench etching process may be conducted continuously with the first trench etching process, the second cross sectional surface S2 may be continuous and substantially coplanar with the first cross sectional surface S1.

According to conventional processes for manufacturing CDH type vertical memory devices, the preliminary dummy channel structure 250a extends to the substrate 100 just like the channel structure 230. Thus, when the aspect ratio of the separation trench ST becomes large as the increase of the total height H of the stack structure SS, the preliminary dummy channel structure 250a may inevitably remain on the substrate 100 at the lower portion of the separation trench ST as the remain channels. Since the remain channels may include conductive materials of the preliminary dummy channels 254a, the neighboring electrode patterns or the gate patterns may be connected in a subsequent electrode forming process, which is widely known as a bridge defect.

However, according to the present method of manufacturing the vertical memory devices 500, since the preliminary dummy channel structure 250a may be positioned only at the upper portion of the stack structure SS, the second trench etching process may be uniformly conducted just to the insulation interlayers 110 and the sacrificial layers 120 even with the reduced aspect ratio. Thus, the residuals of the preliminary dummy channel structure 250a may not remain on the substrate at the lower portion of the separation trench ST and the bridge defect may be substantially prevented although the dummy hole DH may be formed continuously with the channel hole CH in the same hole etching process.

In addition, since the separation trench ST may be formed by sequential etching steps to the upper portion U and the lower portion L of the stack structure SS, the separation trench ST may be formed with sufficiently small aspect ratios and the sidewall of the separation trench ST may be substantially uniform in the first direction x. Thus, the first cross sectional surface S1 and the second cross sectional surface S2 may be substantially uniform and coplanar with each other in the first direction x, and thus the sidewall of the separation trench ST may have substantially a uniform vertical profile in the first directionx.

The stack structure SS may be formed into a stack pattern SP in the cell block area C and the boundary area BA due to the trench etching process. Thus, the stack pattern SP may include a plurality of the insulation interlayer patterns 112 and the sacrificial patterns 122 that may be alternately stacked in the first direction x.

Figure 14B:
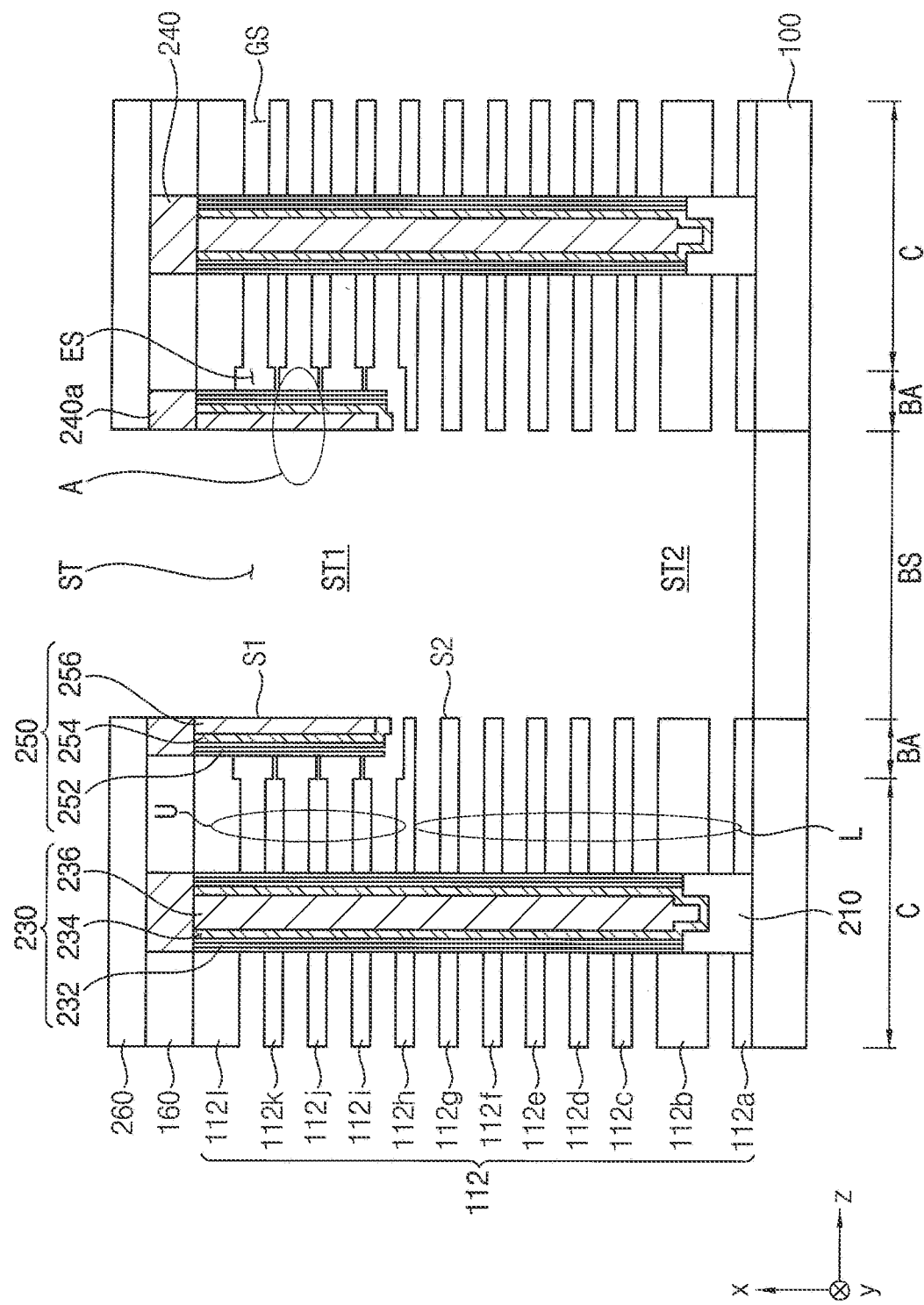
Figure 14C:
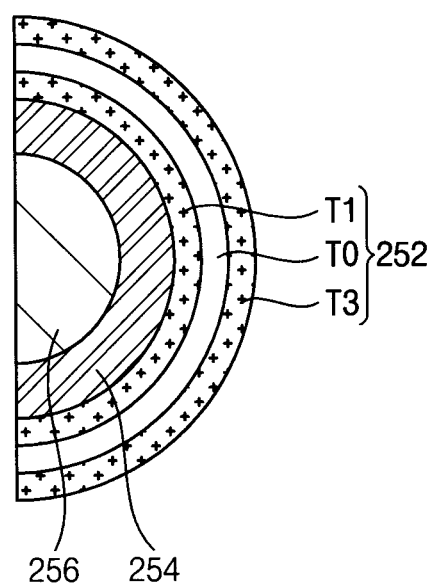

Referring to FIGS. 14A to 14C, the residual stopper 140a and the sacrificial patterns 122 may be removed from the stack pattern SP to thereby form a plurality of gap spaces GS defined by the neighboring insulation interlayer patterns 112 that are substantially parallel with the substrate 100. Thus, a plurality of the gap spaces GS may be arranged in the first direction x alternately with the insulation interlayer patterns 112.

For example, since the etch resistance of the residual stopper 140a and the sacrificial patterns 122 may be smaller than the insulation interlayer patterns 112 and may be exposed to the separation trench ST, the residual stopper 140a and the sacrificial patterns 122 may be removed from the stack pattern SP by an etch-back process using an aqueous phosphate solution or an aqueous sulfuric solution as an etchant.

Particularly, since the etch resistance of the residual stopper 140a may be greater than the sacrificial patterns 122, the insulation interlayer patterns 112 that contact with the residual stopper 140a may be removed more than the insulation interlayer patterns 112 that contact with the sacrificial patterns 122. Thus, the insulation interlayer patterns 112 of the upper portion U of the stack pattern SP in the boundary area BA may have a thickness smaller than the insulation interlayer patterns 112 of the upper portion U of the stack pattern SP in the cell block area C and the insulation interlayer patterns 112 of the lower portion U of the stack pattern SP in the cell block area C and the boundary area BA.

Therefore, while the gap spaces GS may be uniform across the cell block area C and the boundary area BA at the lower portion of the stack pattern SP, the gap spaces GS in the boundary area BA may be larger than the gap spaces GS in the cell block area C at the upper portion U of the stack pattern SP. That is, the gap spaces GS at the upper portion U of the stack pattern SP may be enlarged into enlarged spaces ES at the boundary area BA.

In addition, the charge storage pattern T2 of the dummy trap pattern 252 may also be removed together with the sacrificial patterns 122, and thus a trap void T0 may be formed in the dummy trap pattern 252. Since the charge trap pattern T2 may comprise a nitride, the charge trap pattern T2 may be removed together with the sacrificial patterns 122. Thus, when the charge trap pattern T2 may comprise different materials from the sacrificial patterns 122, no trap void may be formed in the dummy trap pattern 252.

Figure 15B:
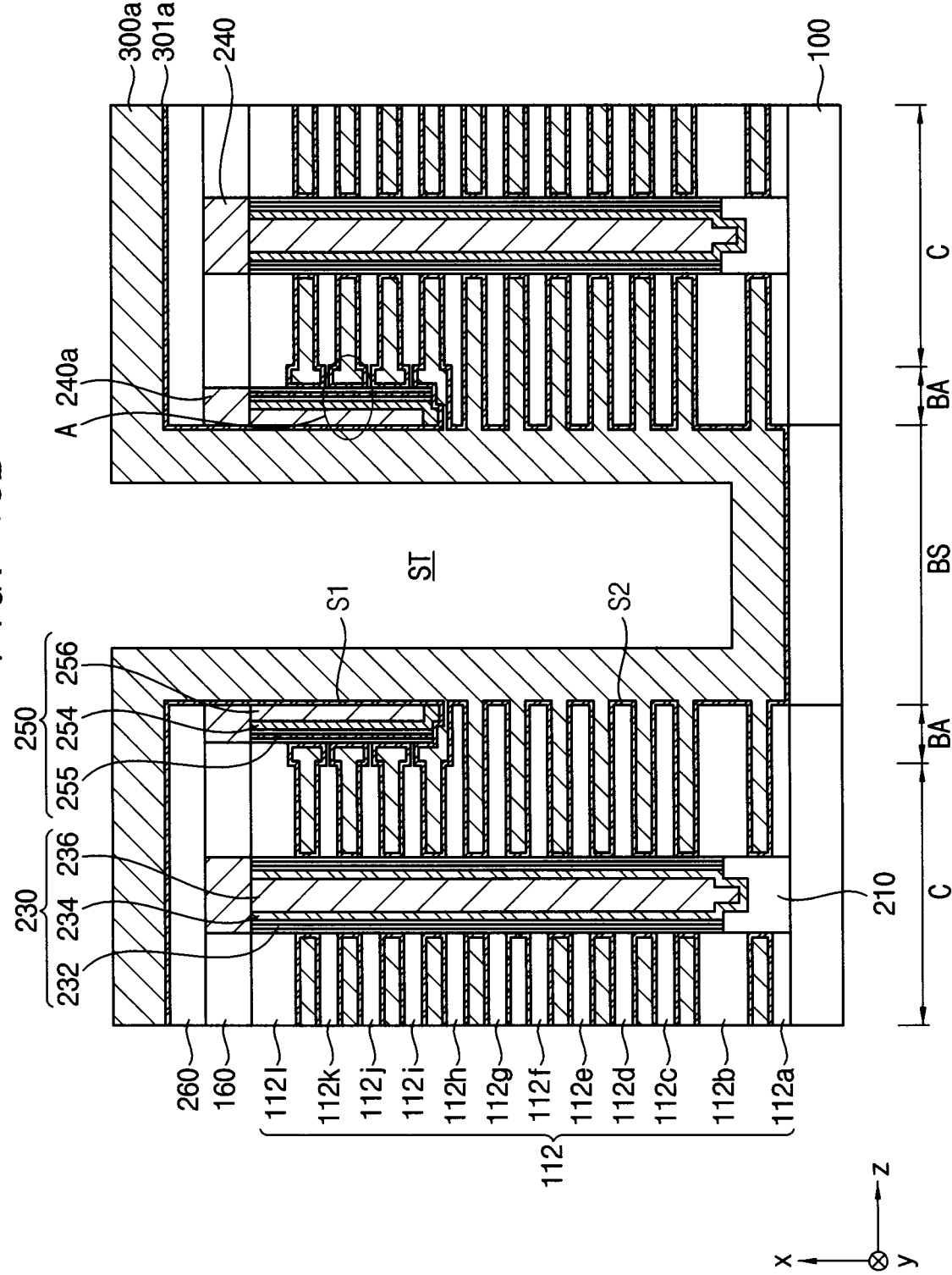
Figure 15C:
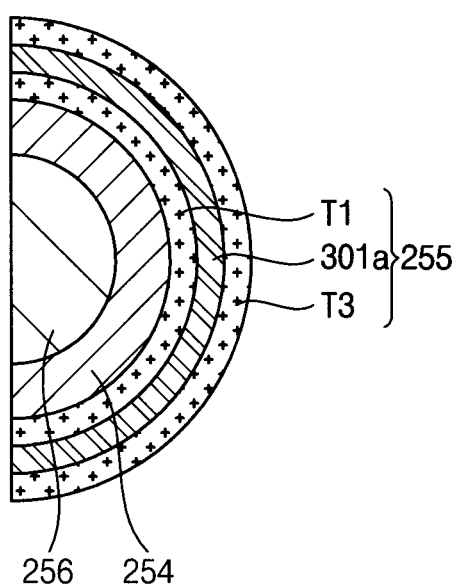

Referring to FIGS. 15A to 15C, a second blocking layer 301a may be formed on the second upper insulation pattern 260 along a surface profile of the block separation trench ST and the gap spaces GS. A conductive layer 300a may be formed on the second blocking layer 301a to a sufficient thickness to fill the separation trench ST and the gap spaces GS.

Since being exposed to the gap spaces GS, the side surfaces of the charge trap pattern 232 and the dummy trap pattern 252, the side surface of the additional channel pattern 210 and the surfaces of the insulation interlayer patterns 112 may be covered with the second blocking layer 301a. In addition, the exposed substrate 100 in the separation trench ST and the second upper insulation pattern 260 may be covered with the second blocking layer 301a. The conductive layer 300a may be introduced or filled into the gap spaces GS defined by the second blocking layer 301a.

Although not shown in the figures, the conductive layer 300a may further include a gate barrier layer on the second blocking layer 301a.

For example, the second blocking layer 301a may comprise a metal oxide, and the conductive layer 300a may comprise a low-resistive metal. Examples of the metal oxide may include aluminum oxide, hafnium oxide, lanthanum oxide, lanthanum aluminum oxide, lanthanum hafnium oxide, hafnium aluminum oxide, titanium oxide, tantalum oxide, zirconium oxide, etc. Examples of the low-resistive metal may include tungsten (W), titanium (Ti), tantalum (Ta), platinum (Pt), etc. These low-resistive metals may be used alone or in combinations thereof.

Particularly, since the block separation trench ST may be communicated with the trap void T0, the trap void T0 may also be filled with the second blocking layer 301a. Thus, the dummy trap pattern 252 may be modified into a blocking trap structure 255 including the tunnel insulation pattern T1, the second blocking pattern 301a and the first blocking pattern T3. Therefore, the dummy trap pattern 252 that may be formed into a triple pattern structure of oxide-nitride-oxide may be modified into the block trap structure 255 that may be formed into a triple pattern structure of oxides.

Since the first and the second cross sectional surfaces S1 and S2 may be substantially uniform in the first direction x, the second blocking layer 301a and the conductive layer 300a may be uniformly formed on the first and the second cross sectional surfaces S1 and S2 that may function as the sidewall of the block separation trench ST.

Figure 16B:
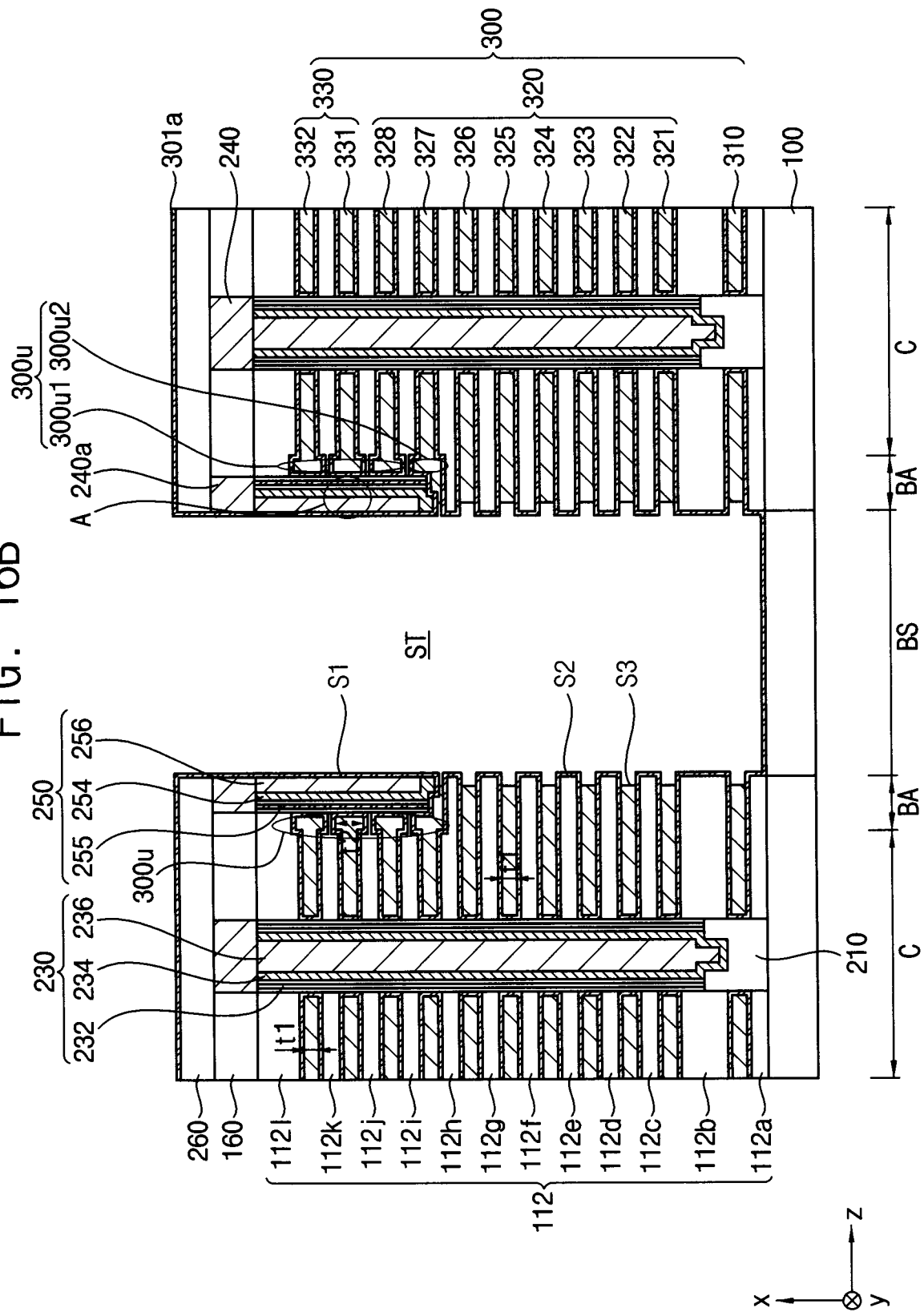
Figure 16C:
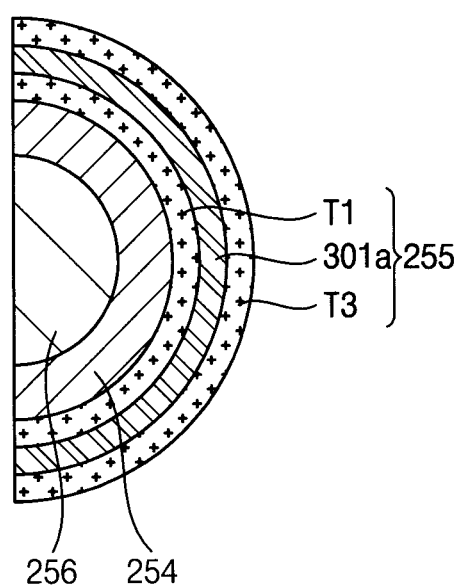

Referring to FIGS. 16A to 16C, the conductive layer 300a may be partially removed from the block separation trench ST and may remain only in the gap spaces GS, to thereby form a plurality of electrode patterns 300 in the gap spaces GS.

For example, the conductive layer 300a may be removed from the block separation trench ST by a wet etching process and may be separated by a unit of the gap spaces GS, so that the conductive layer 300a may just remain in the gap spaces GS between the neighboring insulation interlayer patterns 112. The conductive layer 300a separated in each of the gap spaces GS may be enclosed by the insulation interlayer patterns 112 and be electrically separated from each other, so that the conductive layer 300a in each gap spaces GS may be provided as the electrode patterns 300. Each of the electrode patterns 300 may function as an individual gate electrode of the vertical memory devices 500. In such a case, each of the electrode patterns 300 may be recessed from the second cross sectional surface S2 to thereby substantially prevent or reduce the bridge defect between the vertically neighboring electrode patterns 300.

For example, the electrode pattern 300 may be shaped into a plate in parallel with the substrate 100 and a plurality of the electrode patterns 300 be positioned alternately with a plurality of the insulation interlayer patterns 112. The electrode pattern 300 may include a third surface S3 facing the block separation trench ST and a side surface of the electrode pattern 300 opposite to the third surface S3 may make contact with the second blocking layer 301a. A plurality of the electrode patterns 300 in the stack pattern P may be separated from each other by the block separation trench ST in the third direction z and may function as a gate electrode group of the memory block B.

The electrode patterns 300 may include a first gate line 310, a second gate line 320 and a third gate line 330 that may be sequentially stacked in the first direction x. The first gate line 310 may be provided as a ground selection line GSL and the second gate line 320 may be provided as a word line WL of the vertical memory device 500. The third gate line 300 may be provided as a string selection line SSL of the vertical memory device 500.

In some embodiments, the second gate line 320 may include 1$^{st}$ to 8$^{th}$ word lines 321 to 328 and the third gate line 330 may include an upper string selection line 331 and a lower string selection line 332. The first gate line 310 may be provided as a ground selection line GSL.

Particularly, some of the electrode patterns 300 enclosing in a plan view the dummy channel structure 250 may have a relatively large thickness due to the enlarged space ES, so that the electrode pattern 300 may include an expanded portion 300u at the upper portion U of the stack pattern SP in the boundary area BA. Most of the electrode patterns 300 may have a first thickness t1 in the stack pattern SP and the expanded portion 300u may have a second thickness t2 greater than the first thickness t1 around the dummy channel structure 250 in the boundary area BA.

Thus, the channel structure 230 may penetrate through the electrode patterns 300 at the upper portion U and the lower portion L of the stack pattern SP and the dummy channel structure 250 may penetrate through the expanded portions 300u of the electrode patterns 300 at the upper portion U of the stack pattern SP.

For example, the expanded portions 300u of the electrode patterns 300 may include a plurality of side expanded portions 300u1 making contact with a side of the dummy channel structure 250 and that are apart from each other by the same gap distance in the first direction x, and a plurality of bottom expanded portions 300u2 making contact with bottom portions of the dummy channel structure 250. The bottom expanded portion 300u2 may include a recess corresponding to the recess of the residual bottom pattern 144a.

A unit cell transistor MC may be arranged at a point at which the electrode pattern 300 may be contact with the channel structure 230, so that a plurality of the cell transistors MC may be arranged along the channel structure 230 extending in the first direction x and each of the electrode patterns 300 may be provided as the first, second and third gate lines 310, 320 and 330 in the memory block B.

Figure 17C:
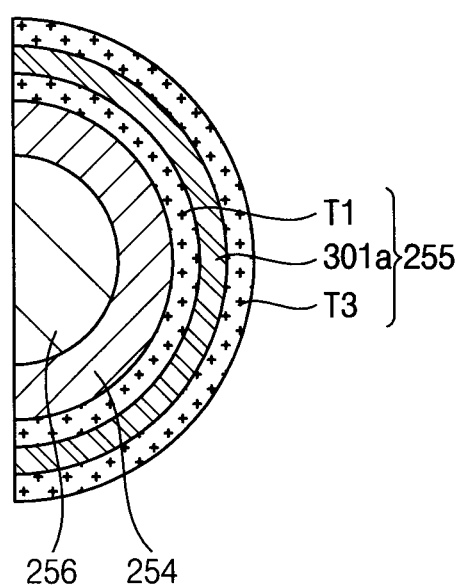

Referring to FIGS. 17A to 17C, the trench spacer TS may be formed at the sidewalls of the block separation trench ST and impurities may be implanted onto the substrate 100 by using the trench spacer TS as a doping mask. Thus, a doping layer 110 may be formed at surface portions of the substrate 100 in the block separation trench ST.

For example, a trench spacer layer (not shown) may be formed on the second blocking layer 301a in such a way that the sidewalls and the bottom of the block separation trench ST may be covered with the trench spacer layer. Then, the trench spacer layer may be partially removed from the second blocking layer 301a by an anisotropic etching process. Thus, the trench spacer layer may just remain on the sidewalls of the block separation trench ST and the second blocking layer 301a on the substrate 100 may be exposed in the block separation trench, thereby forming the trench spacer TS covering the sidewalls of the block separation trench ST.

The trench spacer TS may be shaped into a line extending in the second direction y and the electrode patterns 300 may be covered with or overlapped by the trench spacer TS. Thus, the electrode patterns 300 may be separated and insulated from surroundings, and the block separation trench ST may be modified into a reduced trench RT of which the width may be reduced by the trench spacer TS.

For example, the trench spacer TS may comprise at least one of an oxide, a nitride, an oxynitride and/or any combinations thereof.

Then, impurities may be implanted onto the second blocking layer 301a and the substrate 100 may be exposed through the reduced trench RT by using the trench spacer TS as an ion implantation mask. Then, the doping layer 110 may be formed at the surface portions of the substrate 100 and extending into the substrate 100. For example, the impurities may include n-type dopants such as phosphorus and arsenic.

Figure 18A:
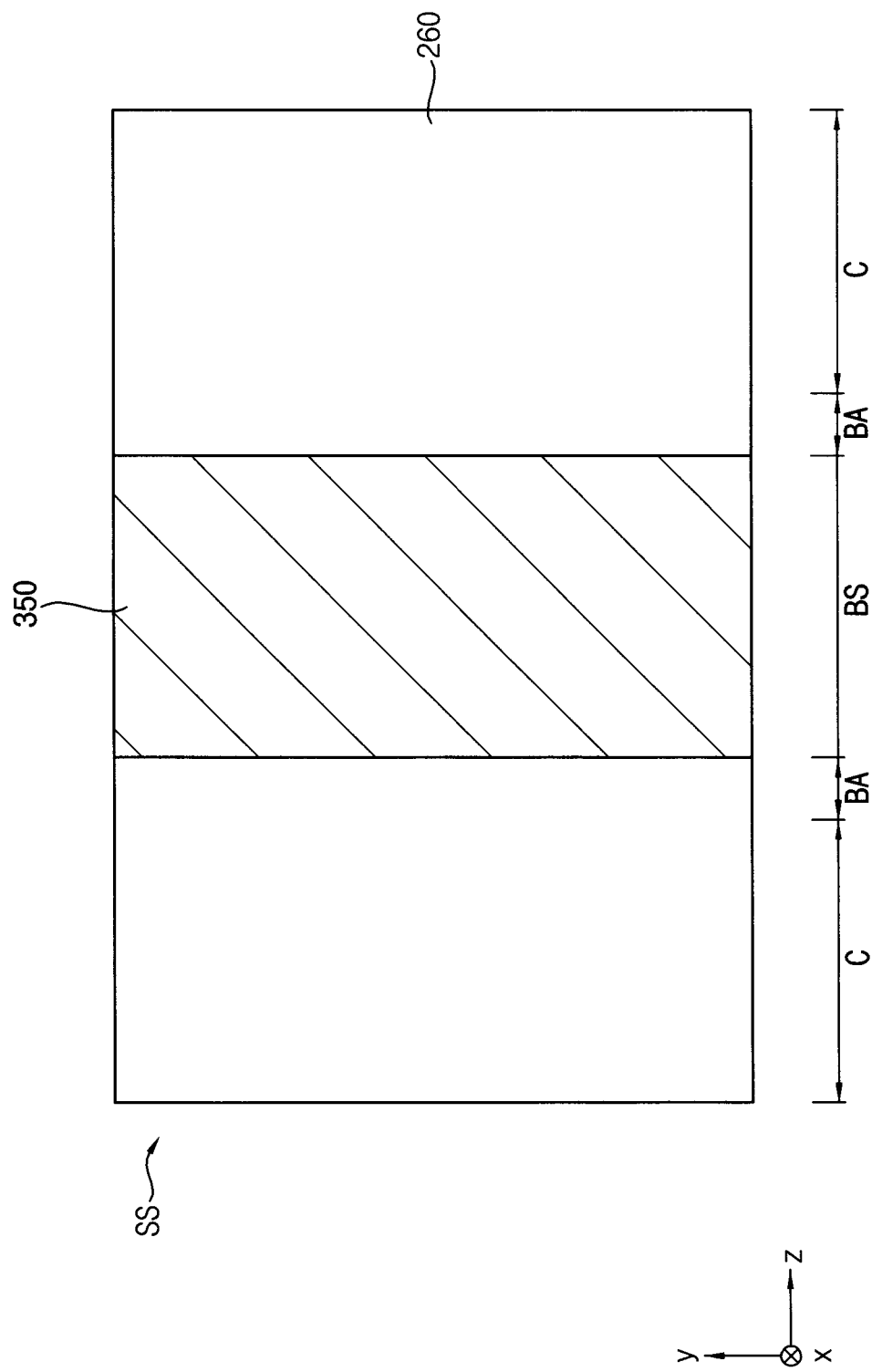
Figure 18C:
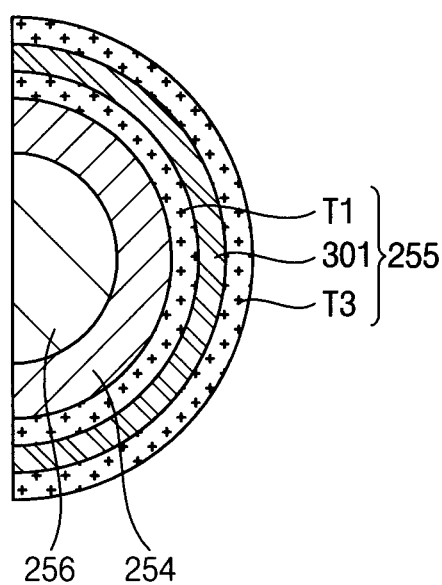

Referring to FIGS. 18A to 18C, the reduced trench RT may be filled with conductive materials to thereby form the block separation line 350 making contact with the doping layer 110 in the reduced trench RT. The block separation line 350 may function as a common source line of the vertical memory devices 500.

For example, a block separation layer (not shown) may be formed on the second blocking layer 301a to a sufficient thickness to fill up the reduced trench RT. The block separation layer may comprise conductive a material such as a low-resistive metal, a nitride of the low-resistive metal, an oxide of the low-resistive metal and/or a silicide of the low-resistive metal.

Then, the block separation layer may be planarized by a planarization process until an upper surface of the second insulation pattern 260 may be exposed, thereby forming the block separation line 350 filling in the reduced trench RT and extending in the second direction y.

Particularly, the second blocking layer 301a may also be removed from the second upper insulation pattern 260 in the planarization process, so that the second blocking layer 301a may be modified into a second blocking pattern 301 enclosing in a plan view the electrode patterns 300 in the gap spaces GS and making contact with the trench spacer TS.

Particularly, the blocking trap structure 255 including the second blocking layer 301a may also modified into the blocking trap pattern 257 including the second blocking pattern 301. Thus, the blocking trap pattern 257 may include the tunnel insulation pattern T1, the second blocking pattern 301 and the first blocking pattern T3. Accordingly, the dummy channel structure 250 may include the blocking trap pattern 257, the dummy channel 254 and the second filling column 256.

Referring to FIGS. 19A to 19B, a wiring structure 400 may be formed on a fourth insulation pattern 460.

For example, a third insulation layer (not shown) may be formed on the second insulation pattern 260 and the block separation line 350 and then may be patterned into the third insulation pattern 360 having an opening through which the capping pattern 240 may be exposed. Then, the contact plug 410 may be formed in the opening and may make contact with the capping pattern 240.

A fourth upper insulation layer (not shown) may be formed on the third insulation pattern 360 and the contact plug 410 and may be patterned into a fourth upper insulation pattern 460. The fourth upper insulation pattern 460 may include a line-shaped wiring trench extending in the third direction z and exposing the contact plug 410. A plurality of the wiring trenches may be arranged in the second direction y by the same gap distance.

Thereafter, conductive materials may be filled into the wiring trenches and a plurality of wirings 490 may be formed in the wiring trench. Thus, the wiring 490 may extend in the third direction z and a plurality of wirings may be spaced apart by the same gap distance in the third direction z. The wirings 490 may make contact with the capping pattern 240.

Accordingly, the wirings 490 separated from each other by the fourth upper insulation pattern 460 and the contact plugs 410 contact with the capping patterns 240 may be provided as the wiring structures 400. In some embodiments, the wirings 490 may include a bit line for detecting signals from a selected memory string in the vertical memory devices 500.

Thereafter, a plurality of metal structures (not shown) and a plurality of contact pads (not shown) making contact with the metal structures may be formed on the fourth upper insulation pattern 460. A passivation layer (not shown) may be formed for covering the metal structures and the contact pads, to thereby manufacture the vertical memory device 500.

According to the example embodiments of the present inventive concept, no residual channels may remain on the substrate at the lower portion of the block separation trench and thus the bridge defect may be substantially prevented although the dummy hole may be formed continuously with the channel hole in the same hole etching process.

The block separation trench ST may be formed by sequential etching steps of the first trench etching process to the upper portion U and the second etching process to the lower portion L of the stack structure SS. Thus, the separation trench ST may be formed under the sufficiently small aspect ratios and the sidewall of the separation trench ST may be sufficiently uniform in the first direction x, thereby obtaining a uniform vertical profile of the block separation trench ST in the first direction x in spite of high stack number of the electrode patterns 300.

In addition, the dummy channel structure 250 may be formed only at the upper portion U of the stack structure SS by the dummy gap distance from the substrate, and thus no residual channels may remain on the substrate 100 at the lower portion of the block separation trench ST. Accordingly, the bridge defect between neighboring gate lines at the lower portion of the block separation trench ST may be substantially prevented due to the uniform vertical profile of the block separation trench and the dummy channel structure 250 spaced apart from the substrate 100.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
   a substrate comprising a cell block area, a block separation area and a boundary area between the cell block area and the block separation area;
   a plurality of stack structures in the cell block area and the boundary area, wherein the plurality of stack structures are stacked in a first direction substantially perpendicular to the substrate such that insulation interlayer patterns are stacked on the substrate alternately with electrode patterns, and wherein the stack structures are spaced apart from each other by the block separation area in a third direction substantially perpendicular to the first direction;
   a plurality of channel structures that extend through respective ones of the stack structures to the substrate in the cell block area such that the plurality of channel structures penetrate through the electrode patterns and the insulation interlayer patterns in the first direction; and
   a plurality of dummy channel structures that extend through upper portions of respective other ones of the stack structures in the boundary area such that the plurality of dummy channel structures penetrate through the electrode patterns and the insulation interlayer patterns in the first direction and are in contact with a dummy bottom electrode pattern that comprises one of the electrode patterns spaced apart from the substrate.

2. The vertical memory device of claim 1,
   wherein a dummy channel structure of the plurality of dummy channel structures comprises a first surface at an upper portion of the stack structures that is adjacent the stack structures at the block separation area, and
   wherein the first surface is substantially perpendicular to the substrate.

3. The vertical memory device of claim 2,
   wherein an insulation interlayer pattern of the insulation interlayer patterns comprises a second surface at a lower portion of the stack structures,
   and wherein the first surface and the second surface are coplanar with respect to the third direction.

4. The vertical memory device of claim 3, further comprising:
   a second blocking pattern adjacent the dummy channel structures and the insulation interlayer patterns,
   wherein the first surface and the second surface are overlapped by the second blocking pattern along the third direction.

5. The vertical memory device of claim 4, wherein the dummy channel structure comprises:
   a blocking trap pattern on an inner surface of a dummy hole that extends through an upper portion of the stack structures in the first direction, wherein the blocking trap pattern is adjacent the electrode patterns and the insulation interlayer patterns;
   a dummy channel on a side surface of the blocking trap pattern and on the dummy bottom electrode pattern; and
   a second filling column in the dummy hole defined by the dummy channel, and
   wherein the channel structure comprises:
   a charge trap pattern on an inner surface of a channel hole that extends through the stack structure in the first direction, wherein the charge trap pattern is adjacent the electrode patterns and the insulation interlayer patterns;
   a channel that is cylinder shaped and extends in the first direction and is on a side surface of the charge trap pattern and on a bottom of the channel hole; and
   a first filling column in the channel hole defined by the channel.

6. The vertical memory device of claim 5,
   wherein the blocking trap pattern comprises a first triple pattern structure in which a tunnel insulation pattern, the second blocking pattern and a first blocking pattern are stacked in the third direction, and wherein at least one of the tunnel insulation pattern, the second blocking pattern, and the first blocking pattern comprises an oxide.

7. The vertical memory device of claim 6, wherein the charge trap pattern comprises a second triple pattern structure in which the tunnel insulation pattern, a charge storage pattern comprising a nitride, and the first blocking pattern are stacked in the third direction.

8. The vertical memory device of claim 1, wherein each of the electrode patterns in the upper portion of the stack structure comprises a respective expanded portion of a plurality of expanded portions in contact with a dummy channel structure of the plurality of dummy channel structures at the boundary area such that the respective expanded portion has a first thickness greater than a second thickness of a remaining portion of the electrode patterns in the first direction.

9. The vertical memory device of claim 8, wherein the plurality of the expanded portions comprise:
a respective plurality of side expanded portions in contact with a side of the dummy channel structure and spaced apart from each other in the first direction; and
a bottom expanded portion in contact with a bottom portion of the dummy channel structure.

10. The vertical memory device of claim 1, wherein the dummy channel structures are on the stack structure of the boundary area in a second direction substantially perpendicular to the first direction and the third direction and are spaced apart from one another.

11. The vertical memory device of claim 1,
wherein the dummy bottom electrode pattern is spaced apart from the substrate by a dummy gap distance d such that d=(k)*H,
wherein k is in a range 0.5~0.7,
wherein d is the dummy gap distance from the substrate, and
wherein H is a height of the stack structure on the substrate.

12. A vertical memory device, comprising:
a substrate comprising a cell block area, a block separation area and a boundary area between the cell block area and the block separation area;
a plurality of stack structures in the cell block area and the boundary area, wherein the plurality of stack structures are stacked in a first direction substantially perpendicular to the substrate such that insulation interlayer patterns are stacked on the substrate alternately with electrode patterns, and wherein the stack structures are spaced apart from each other by the block separation area in a third direction substantially perpendicular to the first direction;
a plurality of channel structures that extend through respective ones of the stack structures to the substrate in the cell block area such that the plurality of channel structures penetrate through the electrode patterns and the insulation interlayer patterns in the first direction;
a plurality of block separation structures on the substrate in the block separation area between neighboring ones of the plurality of stack structures to separate the stack structures by a memory block in the third direction substantially perpendicular to the first direction; and
a plurality of dummy channel structures that extend through upper portions of respective other ones of the stack structures in the boundary area such that each of the plurality of dummy channel structures penetrates through the electrode patterns and the insulation interlayer patterns and is connected to a dummy bottom electrode pattern that is one of the electrode patterns spaced apart from the substrate.

13. The vertical memory device of claim 12,
wherein the dummy channel structure comprises a first surface that is in contact with a block separation structure of the plurality of block separation structures at the upper portion of the stack structure, and
wherein an insulation interlayer pattern of the insulation interlayer patterns comprises a second surface that is in contact with the block separation structure at a lower portion of the stack structure such that the first surface and the second surface are coplanar with respect to the third direction.

14. The vertical memory device of claim 13, further comprising:
a second blocking pattern adjacent the dummy channel structures and the insulation interlayer patterns,
wherein the second blocking pattern is between a plurality of first surfaces comprising the first surface and the block separation structure, and
wherein the second blocking pattern is between a plurality of second surfaces comprising the second surface and the block separation structure.

15. The vertical memory device of claim 14,
wherein the channel structures comprise a charge trap pattern on an inner surface of a channel hole that extends through the stack structure in the first direction,
wherein the charge trap pattern is adjacent the electrode patterns to selectively trap electric charges, and
wherein the dummy channel structure comprises a blocking trap pattern on an inner surface of a dummy hole that extends through the upper portion of the stack structure in the first direction and is adjacent the electrode patterns in the boundary area.

16. The vertical memory device of claim 15,
wherein the charge trap pattern comprises a first triple pattern structure comprising a tunnel insulation pattern comprising a first oxide, a charge storage pattern comprising a nitride, and a first blocking pattern comprising a second oxide that are stacked in the third direction, and
wherein the blocking trap pattern comprises a second triple pattern structure comprising the tunnel insulation pattern, the second blocking pattern comprising an oxide, and the first blocking pattern,
wherein the tunnel insulation pattern, the second blocking pattern, and the first blocking pattern are stacked in the third direction.

17. The vertical memory device of claim 12, wherein each of the electrode patterns in the upper portion of the stack structure comprises a respective expanded portion of a plurality of expanded portions in contact with the dummy channel structure at the boundary area such that the respective expanded portion has a first thickness greater than a second thickness of a remaining portion of the electrode patterns.

18. The vertical memory device of claim 17, wherein the plurality of the expanded portions comprise:
a respective plurality of side expanded portions in contact with a side of the dummy channel structure and spaced apart from each other in the first direction; and
a bottom expanded portion in contact with the dummy bottom electrode pattern.

19. The vertical memory device of claim 12, wherein the block separation structure comprises:

trench spacers on sidewalls of the stack structures that extend in the first direction and are in the block separation area, wherein the substrate is between at least one of the trench spacers and the plurality of the electrode patterns, wherein the insulation interlayer patterns and the plurality of the dummy channel structures are adjacent at least one of the trench spacers;

a doping layer extending from a surface of the substrate into the substrate, wherein the doping layer is between a pair of the trench spacers in the block separation area; and a block separation line comprising conductive materials that is in a block separation trench defined by the pair of the trench spacers such that the block separation line is in contact with the doping layer and extends in the first direction.

20. A vertical memory device, comprising:

a substrate;

a plurality of stack structures stacked in a first direction substantially perpendicular to the substrate such that insulation interlayer patterns are stacked on the substrate alternately with electrode patterns, wherein the stack structures are spaced apart from each other by a block separation area;

a plurality of channel structures that extend through respective ones of the stack structures such that the plurality of channel structures penetrate the electrode patterns and the insulation interlayer patterns; and a plurality of dummy channel structures that extend through upper portions of respective other ones of the stack structures and penetrate through some of the electrode patterns and some of the insulation interlayer patterns, wherein an electrode pattern of the electrode patterns in the upper portion of the stack structure comprises an expanded portion in contact with a dummy channel structure of the plurality of dummy channel structures, and wherein the expanded portion has a first thickness that is greater than a second thickness of a remaining portion of the electrode pattern.

* * * * *